US012585581B2

(12) United States Patent
Lee et al.

(10) Patent No.: US 12,585,581 B2
(45) Date of Patent: Mar. 24, 2026

(54) MEMORY MODULE HAVING VOLATILE AND NON-VOLATILE MEMORY SUBSYSTEMS AND METHOD OF OPERATION

(71) Applicant: Netlist, Inc., Irvine, CA (US)

(72) Inventors: Hyun Lee, Ladera Ranch, CA (US);
Jayesh R. Bhakta, Cerritos, CA (US);
Chi She Chen, Walnut, CA (US);
Jeffery C. Solomon, Irvine, CA (US);
Mario Jesus Martinez, Laguna Niguel,
CA (US); Hao Le, Santa Ana, CA (US);
Soon J. Choi, Irvine, CA (US)

(73) Assignee: Netlist, Inc., Irvine, CA (US)

( * ) Notice: Subject to any disclaimer, the term of this
patent is extended or adjusted under 35
U.S.C. 154(b) by 0 days.

(21) Appl. No.: 18/325,081

(22) Filed: May 29, 2023

(65) Prior Publication Data

US 2023/0385192 A1 Nov. 30, 2023

Related U.S. Application Data

(63) Continuation of application No. 17/531,743, filed on
Nov. 20, 2021, now Pat. No. 11,663,121, which is a
(Continued)

(51) Int. Cl.
*G06F 12/02* (2006.01)
*G06F 3/06* (2006.01)
(Continued)

(52) U.S. Cl.
CPC .......... *G06F 12/0246* (2013.01); *G06F 3/061*
(2013.01); *G06F 3/068* (2013.01);
(Continued)

(58) Field of Classification Search
None
See application file for complete search history.

(56) References Cited

U.S. PATENT DOCUMENTS 7,539,926 B1 * 5/2009 Lesea .................. G06F 11/1004
714/776
7,554,830 B2 * 6/2009 Miura ...................... G11C 5/02
365/230.01
(Continued)

*Primary Examiner* — Yaima Rigol
(74) *Attorney, Agent, or Firm* — USCH Law, PC

(57) ABSTRACT

A memory module comprises dynamic random access
memory (DRAM), Flash memory, and a module controller.
The module controller is configured to receive data to be
transferred from the DRAM to the Flash memory, compute
first cyclic redundancy check (CRC) codes for the data, and
write the data into the Flash memory. The module controller
is further configured to read the data from the Flash memory,
compute second CRC codes for the data read from the Flash
memory, and transfer the data to the DRAM. The module
controller is further configured to compare the second CRC
codes with the first CRC codes to determine one or more
erroneous data bits in the data read from the Flash memory,
read a data segment of the data from the DRAM that include
the one or more erroneous data bits, correct the one or more
erroneous data bits in the data segment, and write the data
segment back into the DRAM.

20 Claims, 41 Drawing Sheets

Related U.S. Application Data continuation of application No. 16/268,454, filed on Feb. 5, 2019, now Pat. No. 11,182,284, which is a continuation of application No. 14/706,873, filed on May 7, 2015, now Pat. No. 10,198,350, which is a continuation-in-part of application No. 14/536,588, filed on Nov. 7, 2014, now Pat. No. 10,380,022.

(60) Provisional application No. 62/150,272, filed on Apr. 20, 2015, provisional application No. 62/067,411, filed on Oct. 22, 2014, provisional application No. 62/056,469, filed on Sep. 26, 2014, provisional application No. 62/041,024, filed on Aug. 22, 2014, provisional application No. 61/989,941, filed on May 7, 2014, provisional application No. 61/929,942, filed on Jan. 21, 2014, provisional application No. 61/901,439, filed on Nov. 7, 2013.

(51) Int. Cl.

| | |
|---|---|
| *G06F 12/06* | (2006.01) |
| *G06F 12/08* | (2016.01) |
| *G06F 12/0871* | (2016.01) |
| *G06F 12/0897* | (2016.01) |
| *G06F 13/10* | (2006.01) |
| *G06F 13/28* | (2006.01) |
| *G11C 7/10* | (2006.01) |

(52) U.S. Cl.
CPC ........ *G06F 3/0685* (2013.01); *G06F 12/0638* (2013.01); *G06F 12/08* (2013.01); *G06F 12/0871* (2013.01); *G06F 13/10* (2013.01); *G06F 13/28* (2013.01); *G11C 7/1072* (2013.01); *G06F 3/0656* (2013.01); *G06F 3/0688* (2013.01); *G06F 12/0897* (2013.01); *G06F 2206/1014* (2013.01); *G06F 2212/205* (2013.01); *G06F 2212/214* (2013.01); *G06F 2212/313* (2013.01); *G06F 2212/7201* (2013.01); *G06F 2212/7208* (2013.01)

(56) References Cited

U.S. PATENT DOCUMENTS

| | | | | |
|---|---|---|---|---|
| 2007/0234182 A1* | 10/2007 | Wickeraad | .............. | G11C 5/04 714/763 |
| 2009/0089646 A1* | 4/2009 | Hirose | ................ | G11C 7/1012 714/766 |
| 2009/0172499 A1* | 7/2009 | Olbrich | ................ | G06F 3/0604 714/773 |
| 2010/0318879 A1* | 12/2010 | Yu | ....................... | G06F 11/1004 711/105 |

* cited by examiner

150

152 Applications

154 Operating System

160

156 Kernel

HV Driver

158 BIOS

180 Hardware

182 Lookup Tables

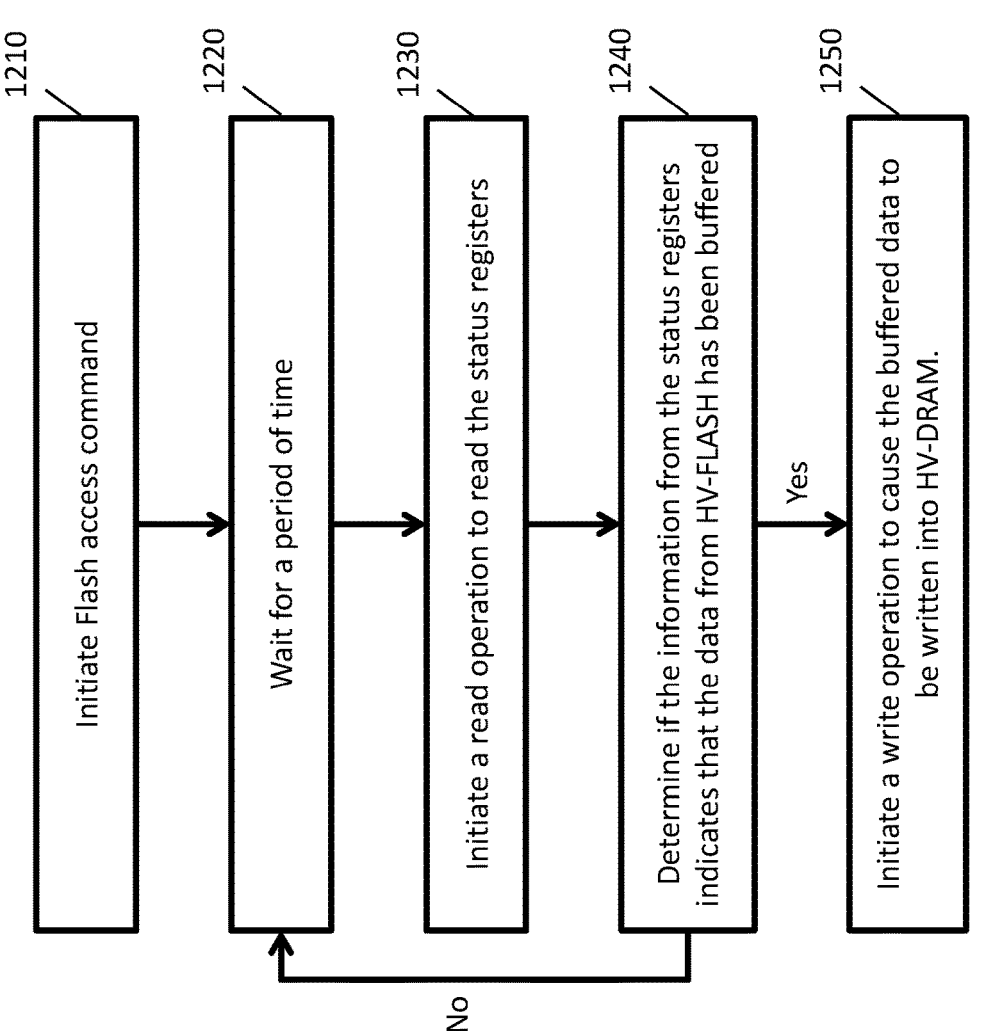
FIG. 12

Address Spaces Provided by the HVDIMMs

| Disk ID | DIMM ID | DRAM Address Range | | Flash Address Range | |
|---------|---------|------|-----|-----|-----|
| | | Min | Max | Min | Max |
| K1 | HVDIMM 1 | abc | def | αβχ | δεφ |
| K2 | HVDIMM 2 | ghi | jkl | γηι | φκλ |
| K3 | HVDIMM 3 | mno | pqr | μνο | πθρ |
| . . . . . . | . . . . . . | . . . . . . | . . . . . . | . . . . . . | . . . . . . |
| K24 | HVDIMM 24 | stu | vwx | στυ | ϖωξ |

FIG. 16

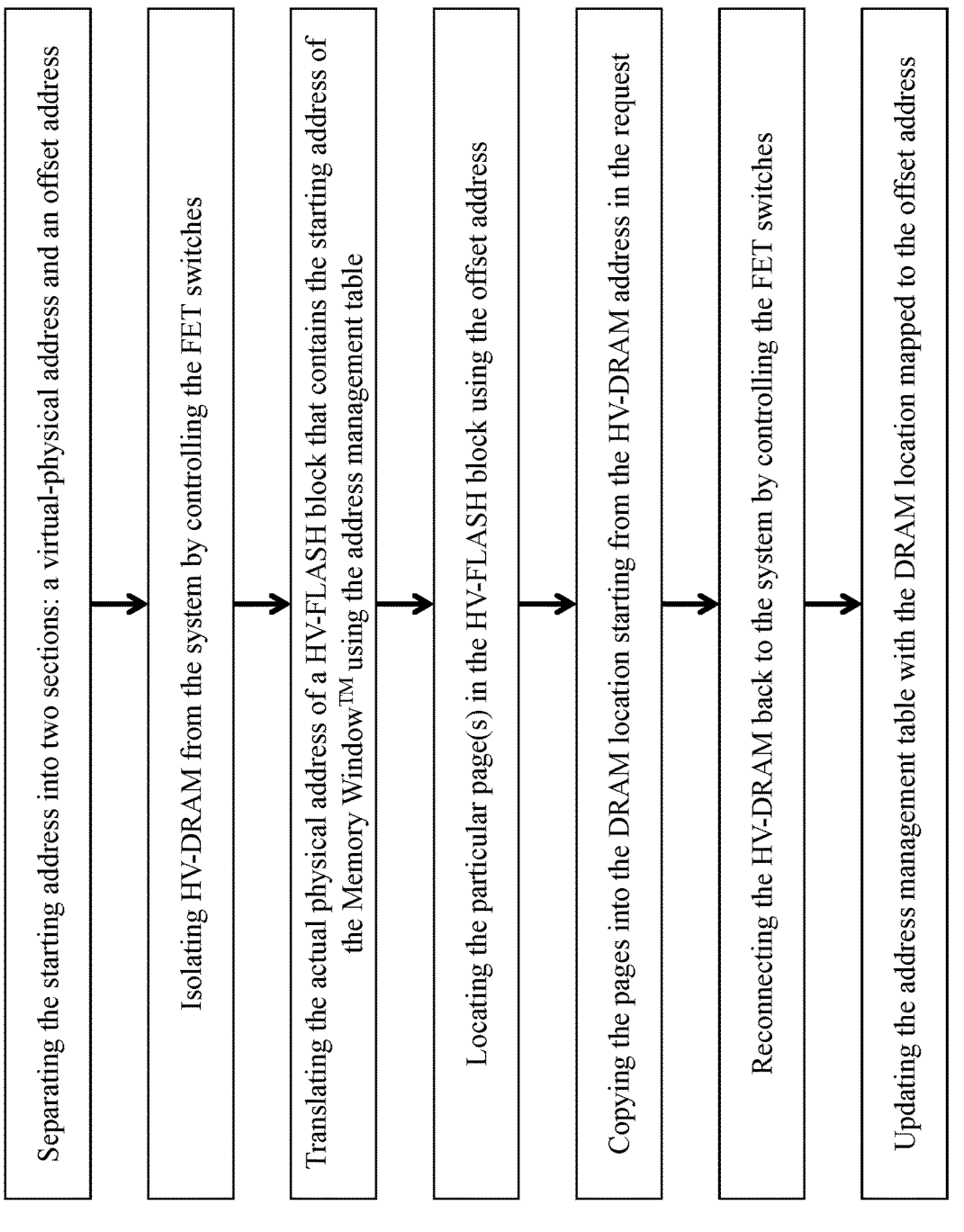

Separating the starting address into two sections: a virtual-physical address and an offset address Isolating HV-DRAM from the system by controlling the FET switches Translating the actual physical address of a HV-FLASH block that contains the starting address of the Memory Window™ using the address management table Locating the particular page(s) in the HV-FLASH block using the offset address Copying the pages into the DRAM location starting from the HV-DRAM address in the request Reconnecting the HV-DRAM back to the system by controlling the FET switches Updating the address management table with the DRAM location mapped to the offset address

FIG. 21A

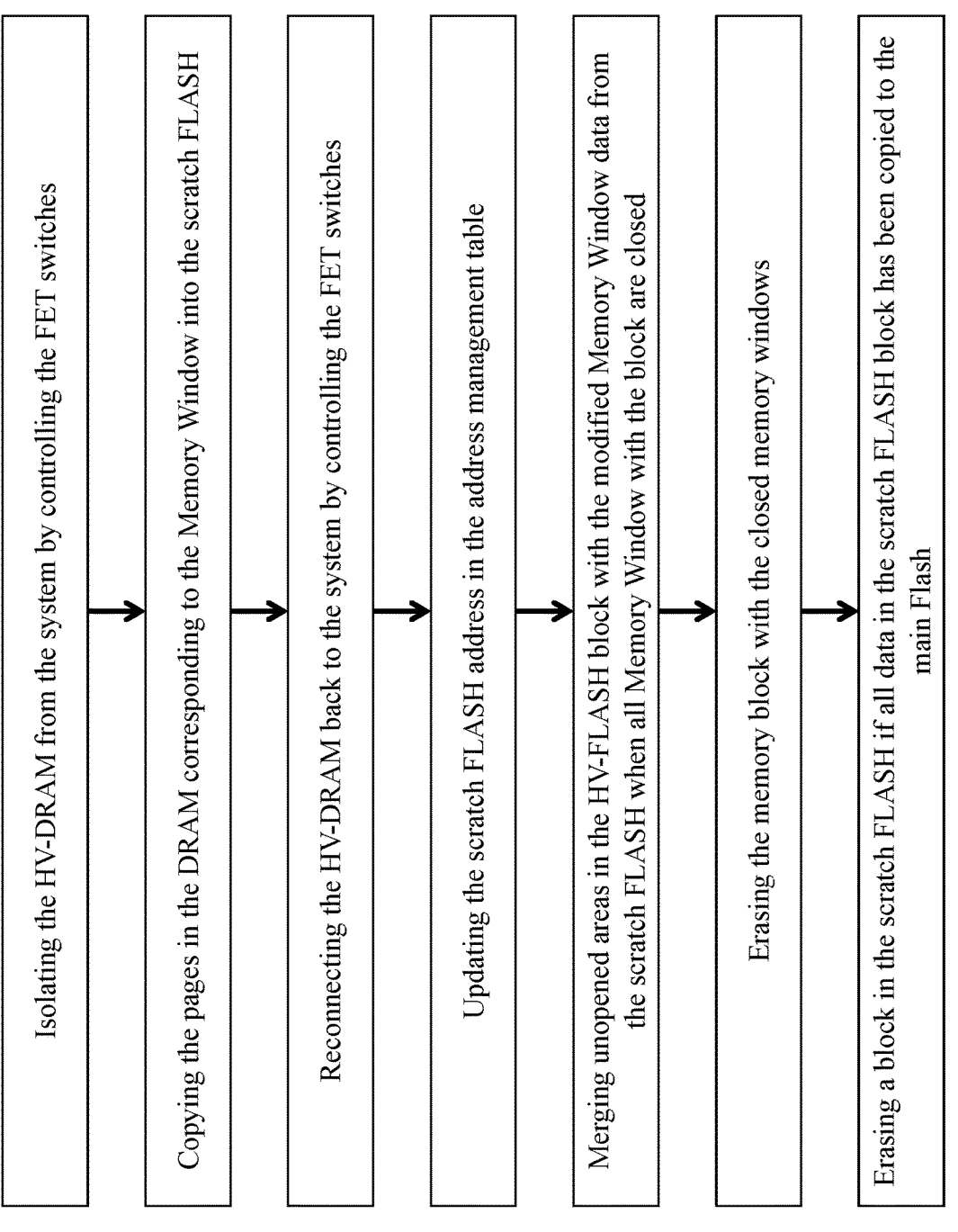

Isolating the HV-DRAM from the system by controlling the FET switches

Copying the pages in the DRAM corresponding to the Memory Window into the scratch FLASH Reconnecting the HV-DRAM back to the system by controlling the FET switches Updating the scratch FLASH address in the address management table Merging unopened areas in the HV-FLASH block with the modified Memory Window data from the scratch FLASH when all Memory Window with the block are closed Erasing the memory block with the closed memory windows Erasing a block in the scratch FLASH if all data in the scratch FLASH block has been copied to the main Flash

FIG. 21B

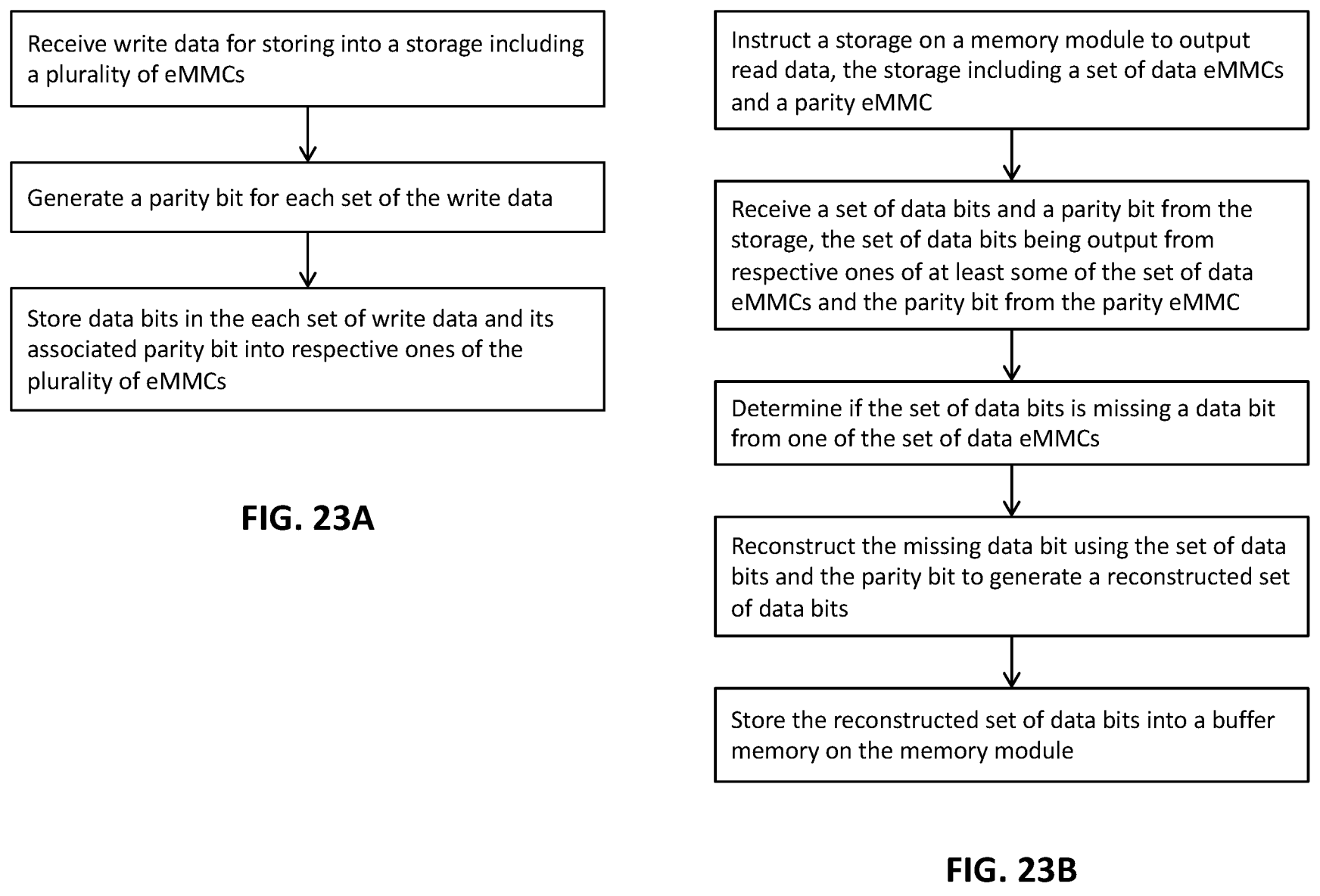

Instruct a storage on a memory module to output read data, the storage including a set of data eMMCs and a parity eMMC Receive a set of data bits and a parity bit from the storage, the set of data bits being output from respective ones of at least some of the set of data eMMCs and the parity bit from the parity eMMC Determine if the set of data bits is missing a data bit from one of the set of data eMMCs Reconstruct the missing data bit using the set of data bits and the parity bit to generate a reconstructed set of data bits Store the reconstructed set of data bits into a buffer memory on the memory module

FIG. 23B

Receive write data for storing into a storage including a plurality of eMMCs

Generate a parity bit for each set of the write data

Store data bits in the each set of write data and its associated parity bit into respective ones of the plurality of eMMCs

FIG. 23A

CRC bits location
with error
(3 locations in Z axis)

CRC bits location
with error
(3 locations in Z axis)

MEMORY MODULE HAVING VOLATILE AND NON-VOLATILE MEMORY SUBSYSTEMS AND METHOD OF OPERATION

CROSS REFERENCE TO RELATED APPLICATIONS

The present application is a continuation of U.S. patent application Ser. No. 17/531,743, filed Nov. 20, 2021, now U.S. Pat. No. 11,663,121, which is a continuation of U.S. patent application Ser. No. 16/268,454, filed Feb. 5, 2019, now U.S. patent Ser. No. 11/182,284, which is a continuation of U.S. patent application Ser. No. 14/706,873, filed May 7, 2015, now U.S. Pat. No. 10,198,350, which claims the benefit priority to U.S. Provisional Patent Application No. 62/150,272, filed Apr. 20, 2015, entitled "Hybrid Memory Module for Computer System," and is a continuation-in-part of U.S. patent application Ser. No. 14/536,588, filed Nov. 7, 2014, now U.S. Pat. No. 10,380,022, which claims the benefit of U.S. Provisional Patent Application No. 62/067,411, filed Oct. 22, 2014, entitled "Hybrid Mobile Memory for Random Access," and U.S. Provisional Patent Application No. 62/056,469, filed Sep. 26, 2014, entitled "Memory Channel Storage," and U.S. Provisional Patent Application No. 62/041,024, filed Aug. 22, 2014, entitled "Apparatus and Methods for Transferring Storage Content," and U.S. Provisional Patent Application No. 61/989,941, filed May 7, 2014, entitled "High Density Hybrid Memory Systems," U.S. Provisional Patent Application No. 61/929, 942, filed Jan. 21, 2014, entitled "Memory Channel Storage," and U.S. Provisional Patent Application No. 61/901, 439, filed Nov. 7, 2013, entitled "Dynamic Random Access to Non-Volatile Memory." Each of the above applications is incorporated herein by reference in its entirety.

The present application is related to U.S. Provisional Patent Application No. 61/512,871, filed Jul. 28, 2011, entitled "High Density DIMMs," and U.S. patent application Ser. No. 13/559,476, filed Jul. 26, 2012, now U.S. Pat. No. 8,874,831, entitled "Flash DRAM Hybrid Memory Module," each of which is incorporated herein by reference in its entirety.

FIELD

The disclosure herein is related generally to memory modules, and more particularly to memory modules having both volatile and non-volatile subsystems, and system and method of operating the same.

BACKGROUND

Computer systems such as network servers, personal computers, PDAs, mobile phones, video games, scientific instruments, industrial robotics, medical electronics, and so on, rely heavily on the capacity and throughput of their system or main memories and the speed of accessing them for optimal performance. Currently, dynamic random-access memory (DRAM) is commonly used as system memory. DRAM is a type of random-access memory that stores each bit of data in a separate capacitor in an integrated circuit. The capacitor can be either charged or discharged so that these two states are taken to represent the two values of a bit, conventionally called 0 and 1. Since capacitors leak charge, the information eventually fades unless the capacitor charge is refreshed periodically. Because of this refresh requirement, it is a dynamic memory as opposed to SRAM and other static memory.

The structural simplicity of DRAM allows DRAM chips to reach very high densities, because billions of transistor and capacitor pairs can fit on a single memory chip. On the other hand, DRAM is volatile memory—it loses its data quickly when power is removed. Compared to Flash memory, which is a type of electronic non-volatile computer storage medium that can be electrically erased and reprogrammed, DRAM is also much more expensive. For example, high density DRAM can cost as much as 20 times more than high-performance Flash devices. Furthermore, Flash chips can have much higher density than DRAM chips, allowing a same-sized memory module to pack much more to reach a much larger memory capacity.

There are two main types of Flash memory, the NAND type and the NOR type, which are named after the NAND and NOR logic gates. The NOR type allows a single machine word (byte) to be written or read independently. NAND type Flash memory may be written and read in blocks (or pages), which are generally much smaller than the entire device. NAND Flash also has reduced erase and write times, and requires less chip area per cell, thus allowing greater storage density and lower cost per bit than NOR Flash. Moreover, NAND Flash also has up to ten times the endurance of NOR Flash. Thus, NAND Flash has been more widely used than NOR Flash.

Besides its advantages, Flash memory also has certain limitations, which pose many challenges to make it useful as main memory. One limitation of Flash memory, especially NAND Flash, is that it can only be erased a "block" at a time. Erasing a block generally sets all bits in the block to 1. Starting with a freshly erased block, any location within that block can be programmed a byte or a word at a time in a random access fashion. However, once a bit has been set to 0, only by erasing the entire block can it be changed back to 1. In other words, Flash memory does not offer arbitrary random-access rewrite or erase operations.

Another limitation is that Flash memory has a finite number of program-erase cycles (typically written as P/E cycles). Most commercially available Flash products are guaranteed to withstand around a certain number of cycles (e.g., 100,000 P/E cycles) before the wear begins to deteriorate the integrity of the storage. Some chip firmware or file system drivers perform the so-called wear leveling technique by counting the writes and dynamically remapping blocks to spread write operations between sectors. For portable consumer devices, these wear-out management techniques typically extend the life of the Flash memory beyond the life of the device itself, and some data loss may be acceptable in these applications. For high reliability data storage, however, it is not advisable to use Flash memory that would have to go through a large number of programming cycles.

BRIEF DESCRIPTION OF THE DRAWINGS

FIG. 12 is a flowchart illustrating a status report process according to certain embodiments.

FIG. 16 is diagram illustrating a memory association table according to certain embodiments.

FIGS. 21A and 21B are flowcharts illustrating respectively processes carried out by the module controller to open and close a memory window in the hybrid memory module according to certain embodiments.

FIGS. 23A and 23B are flowcharts illustrating respectively RAID 3 processes for writing data into and reading data from the non-volatile memory subsystem in the hybrid memory module according to certain embodiments.

DESCRIPTION OF THE EMBODIMENTS

Figure 1A:
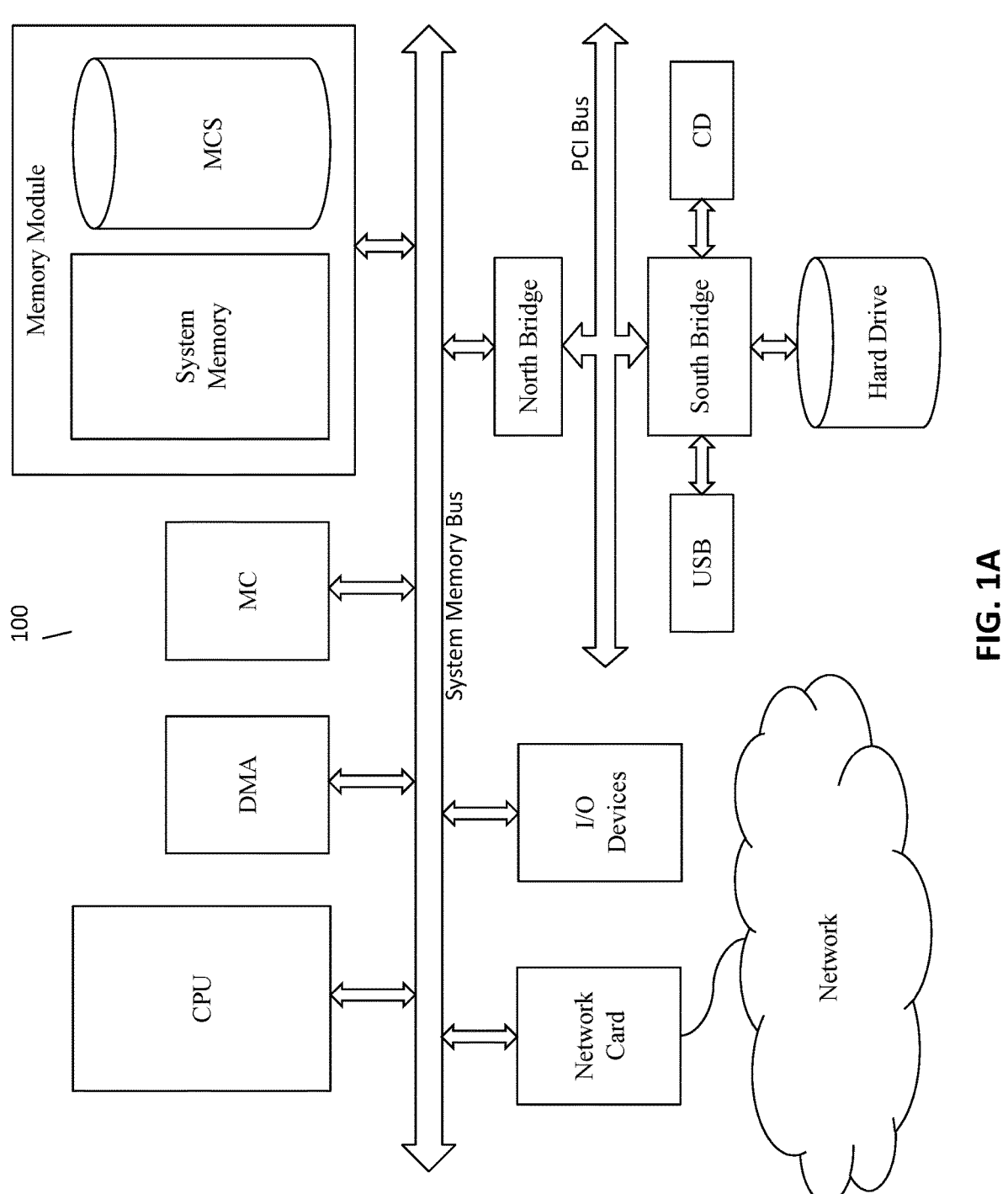
FIG. 1A is a block diagram of a computer or server system according to certain embodiments.

As shown in FIG. 1A, a computer or server system (computer system) 100 according to certain embodiments includes a central processing unit (CPU) or processor, a memory controller (MC), a system memory bus, one or more memory modules coupled to the memory controller via the system memory bus. The one or more memory modules include one or more Hypervault (HV) memory modules that provide a system memory and may further provide memory channel storage (MCS). In certain embodiments, the MC may be integrated into the CPU. In further embodiments, the computer system may also include a direct data management controller (DMA) also coupled to the system bus. The CPU with or without the MC and/or the DMA, or the computer system 100 in part or in while, is sometimes referred to hereafter as the "System" or "system."

In certain embodiments, the computer system 100 may further include a network card and one or more I/O devices such as keyboard, monitor, touchscreen, microphone, speaker, etc. The network card may or may not be integrated into the CPU and provides network interface functions (wired or wireless) between the computer system 100 and local and/or wide area networks. The computer system 100 may further include a PCI bus, which is coupled to a north bridge, which is coupled to the memory controller via the memory bus or incorporated into the memory controller. One or more storage devices, such as a hard drive, a CD/DVD drive, and a USB drive, via a south bridge are coupled to the PCI bus.

Figure 1B:
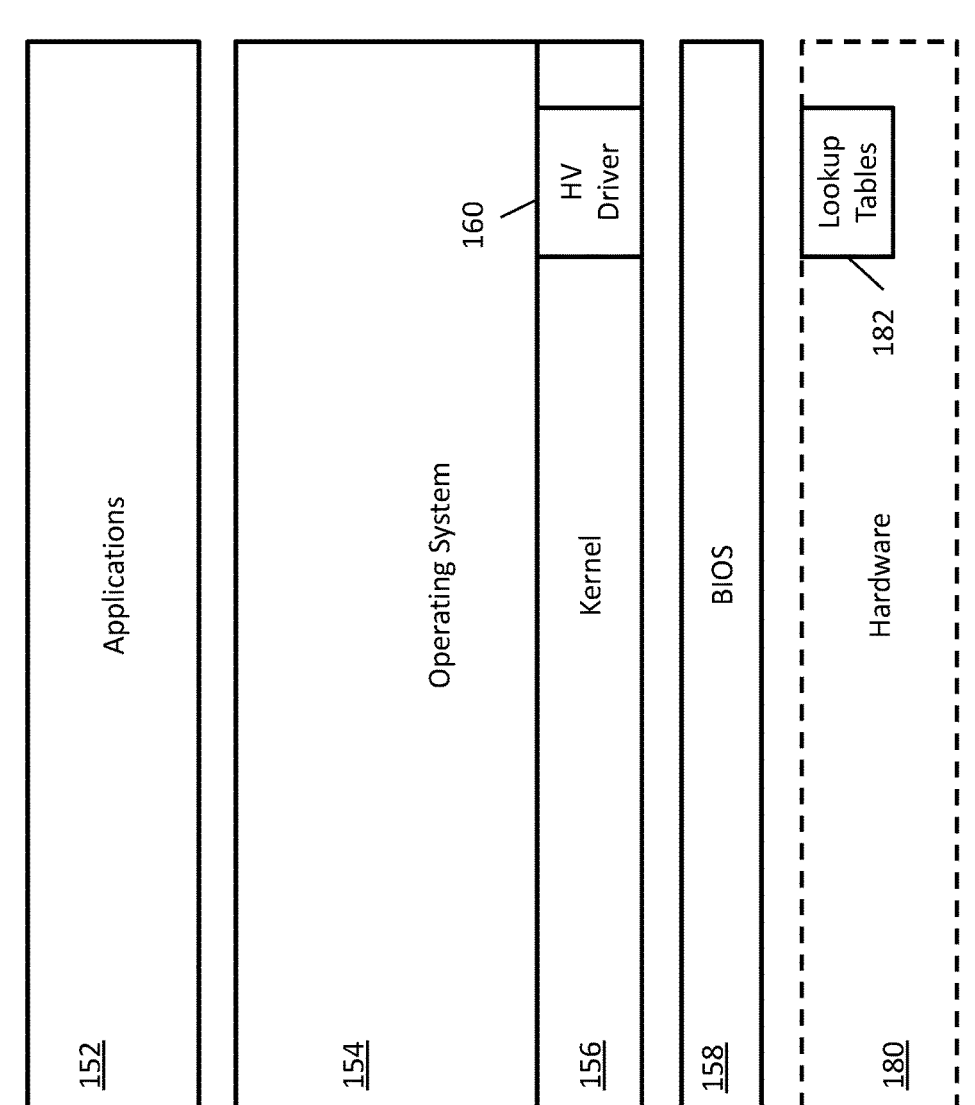
FIG. 1B is a block diagram of a software stack of the computer or server system according to certain embodiments.

In addition to the hardware components shown in FIG. 1A, the computer system 100 also includes software/firmware components. In certain embodiments, the software/firmware components can be roughly represented as a stack of software/firmware layers 150 over a hardware layer 180. As shown in FIG. 1B, the stack of software/firmware layers 150 includes an applications layer 152 sitting on an operating system layer 154. The applications 152 are software programs that perform specific tasks. The operating system 154 manages the hardware and software resources of the computer system 100 and acts as an intermediary between the application programs 152 and the hardware components of the computer system 100.

The operating system 154 includes a kernel 156, which are computer programs that manages input/output requests from other software programs (or processes), and which translates the requests into data processing instructions for the CPU and/or other hardware components of the computer system 100. The kernel can include an interrupt handler that handles all requests or completed I/O operations that compete for the kernel's services, a scheduler that determines which programs share the kernel's processing time in what order, and a supervisor that actually gives use of the computer to each process when it is scheduled. The kernel may also include a manager of the operating system's address spaces in memory or storage. The kernel's services are requested by other parts of the operating system or by applications through a specified set of program interfaces sometimes referred to as system calls.

Between the kernel and the hardware layer is the basic input/output system (BIOS) layer 158, which in certain embodiments is firmware stored in some sort of permanent memory (e.g., programmable read-only memory (PROM), or electrically programmable read-only memory (EPROM)), or Flash memory, and includes program codes for initializing and testing the system hardware components, and to load the operating system from a mass memory device when the computer system 100 is boot up. The BIOS may additionally provide an abstraction layer for the hardware components so as to provide a consistent way for application programs and operating systems to interact with the hardware components such as the system memory and input/output devices.

In certain embodiments, the software stack further includes an HV driver 160 in, for example, the kernel. The HV driver 160 is a software program for controlling system access to the HV memory module so that the HV memory module can operate like a standard Dual In-Line Memory Module (DIMM), such as Double Data Rate (DDR) 3 registered DIMM (RDIMM), or DDR3 Load Reduction DIMM (LRDIMM), DDR4 RDIMM, or DDR4 LRDIMM, without requiring any changes to the BIOS. The HV driver 160 has access to a memory space 182 in the CPU and certain memory locations used to store lookup tables or other configuration information, which the HV driver 160 can consult with and/or update as needed. In certain embodiments, the driver intercepts certain system calls to access the HV memory module and directs the memory controller to send control, address and data signals in response to the system calls and in compliance with the memory interface standard the system is using (e.g., the Joint Electron Device Engineering Council (JEDEC) DDR3 or DDR4 RDIMM or LRDIMM Standard), as discussed in further detail below.

Figure 2A:
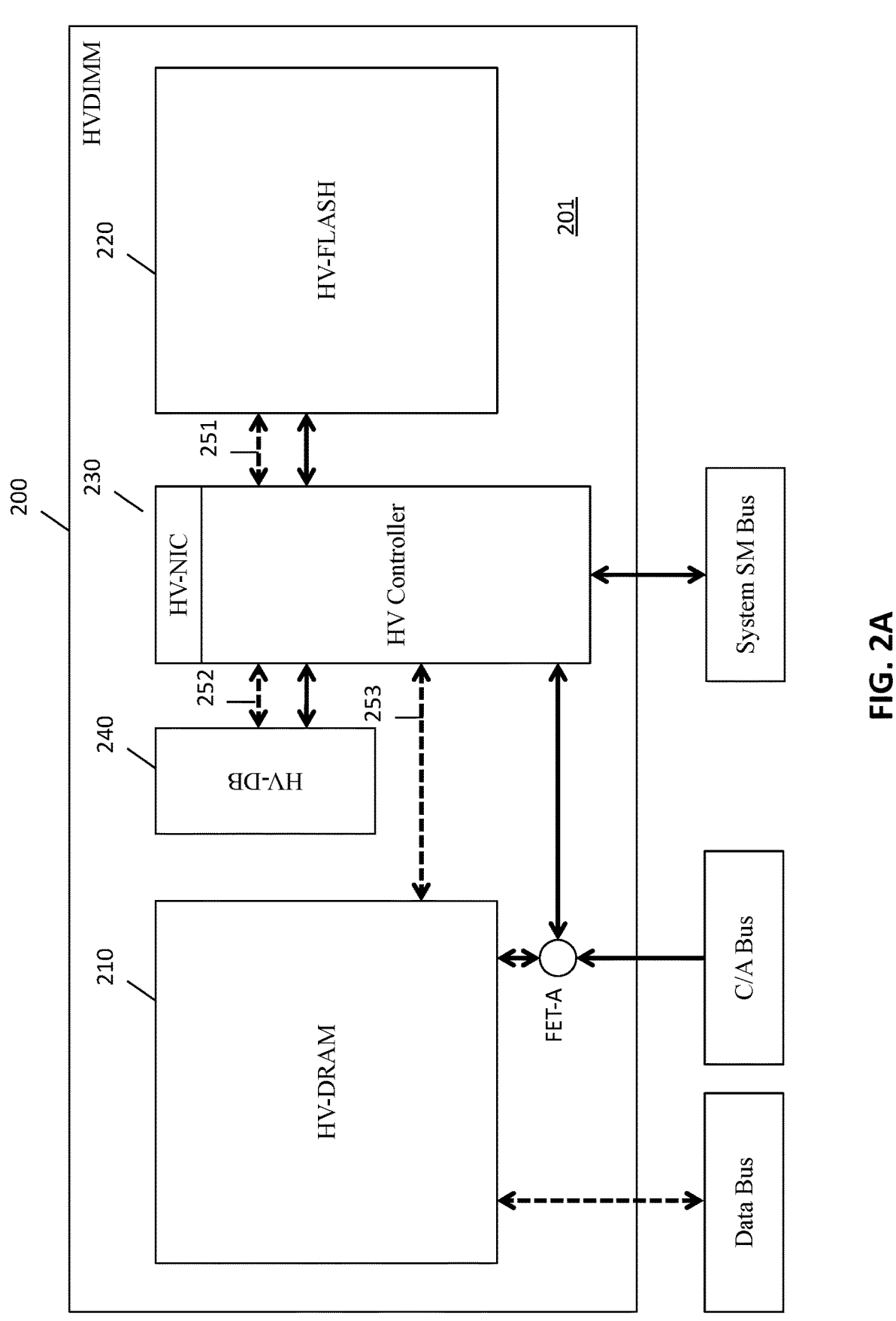
FIG. 2A is a block diagram of a hybrid memory module having a volatile memory subsystem, a non-volatile memory subsystem and a module controller according to certain embodiments.

FIG. 2A is a block diagram of a Hypervault dual-in-line memory module (HVDIMM) 200, which can be used to provide the system memory and/or the storage of the computer/server system according to certain embodiments. As shown in FIG. 2A, the HVDIMM 200 includes a volatile memory subsystem (HV-DRAM) 210, a non-volatile memory subsystem (HV-Flash 220) 220, and a module control subsystem (HV Controller) 230, mounted on a module board 201, which may include one or more printed circuit boards. The HVDIMM 200 may also include a data buffer (HV-DB), and may also include a network interface controller (HV-NIC). In certain embodiment, the HV-DB 240 includes DRAM memory, such as terabyte DRAM memory (TBM). The HV-DRAM 210 and the HV Controller 230 are coupled to each other, to the system, and to the HV-Flash 220 via data signal lines (as represented by the dashed double-arrow lines) and control/address (C/A) signals lines (as represented by the solid double or single-arrow lines). As shown in FIG. 2A, data signal lines 251, 252, and 253, together with the HV Controller 230 and the HV-DB 240, form a dedicated data path between the HV-DRAM 210 and the HV-Flash 220, allowing data to be transferred between the volatile and non-volatile subsystems without going through the memory channel or the CPU. In certain embodiment, the dedicated data path is a high-bandwidth data path.

As is also shown in FIG. 2A, the HVDIMM 200 further includes switches, FET-A (e.g., Field-effect transistor or FET switches). In certain embodiments, there are two sets of switches in the HVDIMM 200, data switches and command/address switches. These switches do not need to be fast switches but they should support relatively short input to output delay time. In certain embodiments, the signal propagation time for both sets of switches should be a small fraction of a data period (e.g., 200-300 ps), so that the delay time can be hidden from the system.

As shown in FIG. 2A, data from the system is directly connected to HV-DRAM 210 data input/output (I/O) (not shown) while the system command/address signals are connected to the HV-DRAM 210 via the FET switches, such that the HV-DRAM 210 either can receive command/address from the system during, for example, normal operations when the system accesses the memory spaces in the HVDIMM 200, or from the HV Controller 230 during, for example, backup/restore operations when the HVDIMM 200 backs up the content in the HV-DRAM after a power failure or restore the content back into the DRAM after power is resumed. The FET switches can be controlled by the HV Controller 230.

In certain embodiments, the HV-Flash 220 includes MLC NAND Flash, which are partitioned to support fast access as well as enhance the error correction capability for virtual duplication. In certain embodiments, the HV-Flash 220 includes, for example, 256 GB/512 GB of main Flash and 32 GB of scratch Flash. The main Flash can serve as a large storage with direct data bus on the HVDIMM 200 to the DRAM. The scatch Flash facilitates a mechanism to prolong the life time of the Flash memory cells in the HV-Flash 220, as described below.

Figure 2B:
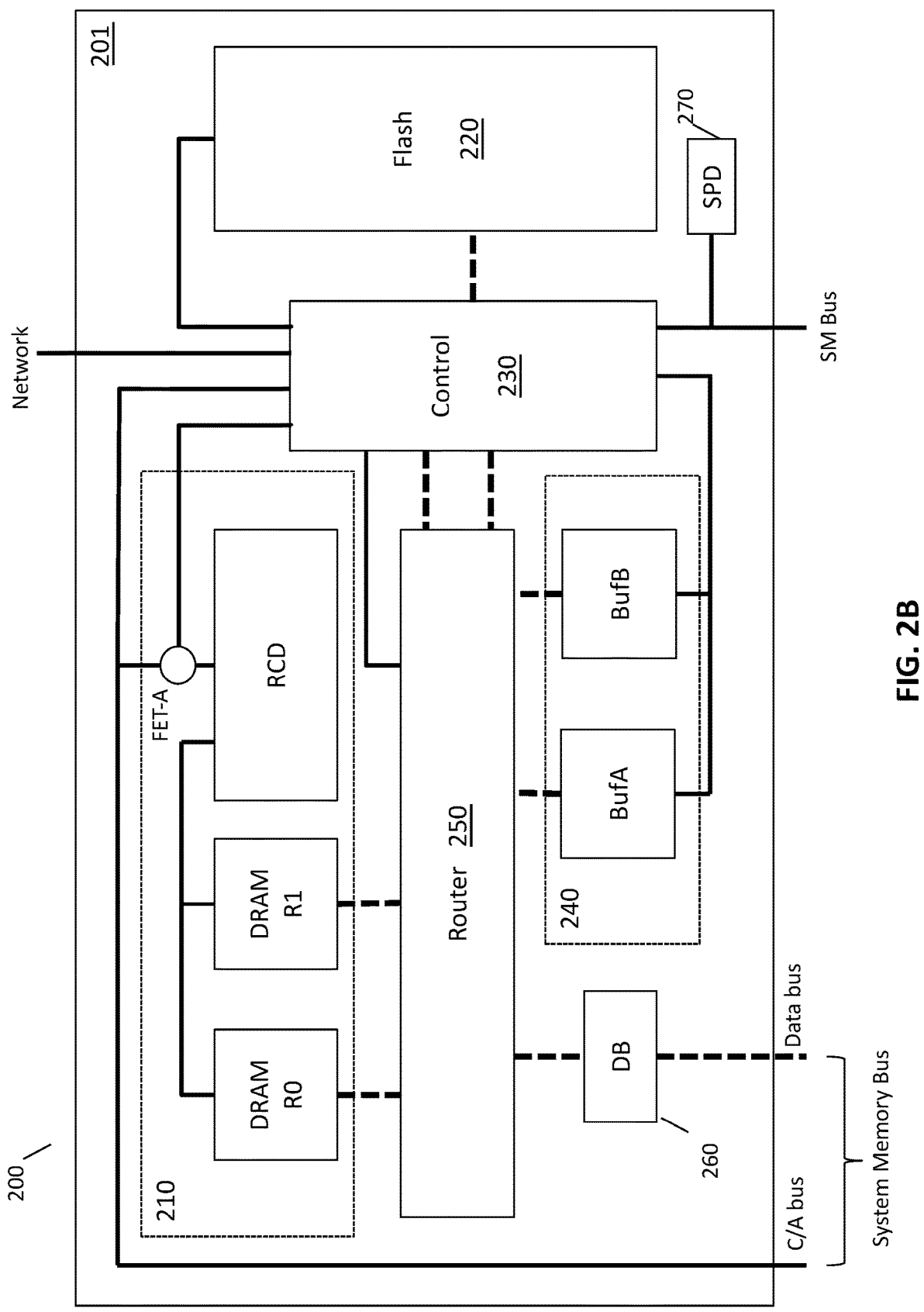
FIG. 2B is a block diagram of a memory module having both DRAM and Flash memory according to certain embodiments.

FIG. 2B is a block diagram of a Hypervault dual-in-line memory module (HVDIMM) 200, which can be used to provide the system memory and/or the MCS of the computer/server system 100 according to certain embodiments. As shown in FIG. 2B, the HVDIMM 200 includes a volatile memory subsystem (HV-DRAM) 210, a non-volatile memory subsystem (HV-Flash) 220, and a module control subsystem (HV Control) 230, mounted on a module board 301, which may include one or more printed circuit boards. The HVDIMM 200 may also include buffer memory 240 and may also include a network interface controller (HV-NIC). The HVDIMM 200 may also include a data routing or router circuit 250 including, for example, switching circuits (e.g., Field-effect transistor or FET switches) and/or multiplexors, that selectively routes data signals between the HV-DRAM 210 and the system memory bus, the HV-DRAM 210 and HV Control 230, the HV-DRAM 210 and the buffer memory 240, the buffer memory 240 and the HV Control 230, and/or the buffer memory 240 and the system memory bus, under the control of the HV Control 230. The HVDIMM may further includes data buffer circuitry 360 that buffers read/write data between the system and the HVDIMM 200. The HVDIMM 200 further includes data signal lines (as represented by the dashed lines) and control/address (C/A) signals lines (as represented by the solid lines).

As shown in FIG. 2B, the HVDIMM 200 is coupled to the system memory bus and may be further coupled to a system management (SM) bus using, for example, the I²C protocol or a variant thereof. The system memory bus includes control/address (C/A) signal lines and data/strobe (DQ/DQS) signal lines. The C/A signal lines are coupled to the register control device (RCD) in the HV-DRAM 210 during normal operations, and are further coupled to the HV Control 230. Thus, both the RCD and the HV Control 230 may respond to C/A signals from the system. In certain embodiments, the HV-DRAM 210 further includes a switching circuit (e.g., an FET switch, FET-A), which can be controlled by the HV Control 230 to couple the RCD to either the C/A bus and the HV Control 230 such that the HV-DRAM 210 either responds to C/A signals from the system during, for example, normal operations when the system accesses the DRAM address spaces in the HVDIMM 200, or to C/A signals from the HV Control 230 during, for example, backup/restore operations when the HVDIMM 200 backs up the content in the HV-DRAM 210 after a power failure or restore the content back into the DRAM after power is resumed.

In certain embodiments, the HV Control 230 is configured to monitor the C/A signals from the memory controller and to recognize and act upon C/A signals formulated in response to system calls to access the HV-Flash 220 and/or the buffer memory 240.

In certain embodiments, the buffer memory 240 includes DRAM, such as terabyte DRAM memory (TBM), or SRAM. The buffer memory 240 is used to temporarily store data so as to make data transfers in the buffer memory 240 faster and more efficient. Since normally data may be transferred in and out of Flash memory at a slower speed than data is transferred to and from the system, the buffer memory 240 is used to buffer data to/from the Flash memory so the system does not have to slow down and wait for data to be written to or read from the HV-Flash 220. When the system writes data to the HV-Flash 220, the data is buffered into the buffer memory 240 at DRAM data I/O speed, which is much faster than Flash data I/O speed. The buffered data can be written into the Flash memory on, for example, First-in First-out (FIFO) basis. The same is true for the read direction. Thus, while reading from the HV-Flash 220, the CPU can engage in other processes with the main memory until the buffer memory 240 has buffered a predetermined amount of data for transferring to the main memory or the system at the DRAM speed. On the other hand, when data is transferred from the main memory to the storage, the data is read from the HV-DRAM 210 according to a set of control/address (C/A) signals from the system or the HV Control 230, and written into the buffer memory 240 according to another set of C/A signals from the HV Control 230. While the DRAM can be engaged with the system on other tasks, the HV Control 230 can transfer the data from the buffer memory 240 to the HV-Flash 220 by reading the data from the buffer memory 240 and writing the data to the storage. In further embodiments, the buffer memory 240 may include two sets of buffer memory, BufA and BufB.

In certain embodiments, the HV-DRAM 210 may include multiple ranks (e.g., DRAM R1 and DRAM R2) of double data rate (e.g., DDR3 or DDR4) DRAM devices and a register control device (RCD). In certain embodiments, the HV-Flash 220 includes MLC NAND Flash, which are partitioned to support fast access as well as enhance the error correction capability for virtual duplication. In certain embodiments, the HV-FLASH 220 includes a number of (e.g., 9) standard embedded multi-media card (eMMC) packages each having an embedded multi-media interface, as described below with reference to FIGS. 22 and 23A-23B.

In certain embodiments, the HVDIMM 200 further includes a serial presence detect (SPD) device 370 accessible by the system via the SM bus. The SPD device 370 includes non-volatile memory such as electrically erasable and programmable read only memory (EEPROM) for storing therein key parameters of the HVDIMM 200, such as basic memory type, module data widths, timing parameters, memory density (e.g., size of each bank), manufacturer ID, serial number, etc. These key parameters are generally written by the manufacturers. During system boot up, the BIOS reads the SPD information to configure the memory controller.

The components in the HVDIMM 200, e.g., the HV Control 230, the main memory subsystem (or volatile memory subsystem), the buffer memory 240, the HV-Flash 220 (or non-volatile memory subsystem), can be mounted on a same printed circuit board or disposed in close proximity to each other to allow fast and smooth data transfer therebetween.

Figure 3:
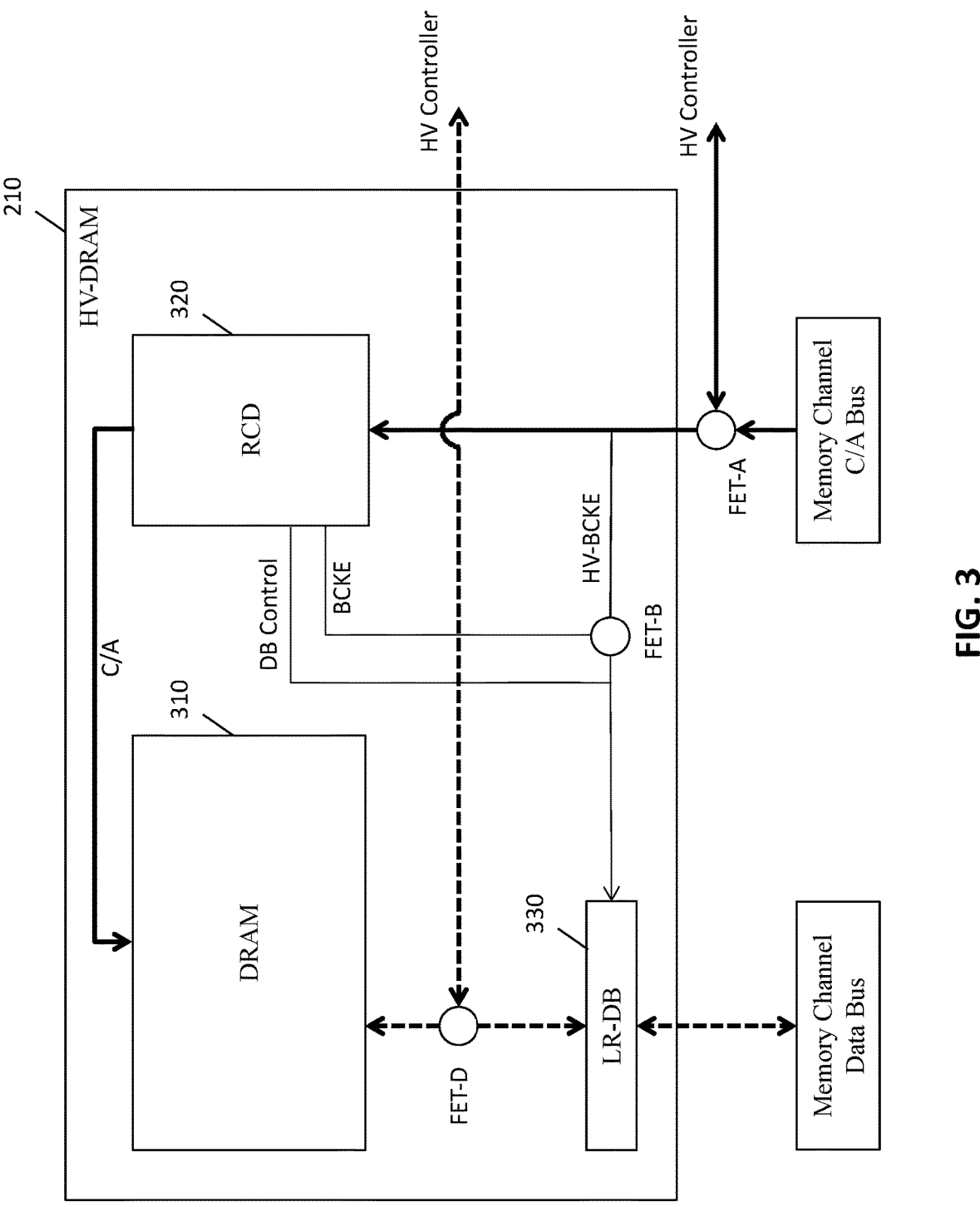
FIG. 3 is a block diagram of the volatile memory subsystem in the hybrid memory module according to certain embodiments.

FIG. 3 is a block diagram of the HV-DRAM 210 subsystem according to certain embodiments. As shown in FIG. 3, the HV-DRAM 210 subsystem includes DERAM devices 310, a registered control device (RCD) or control register 320 to interface with the MC or the HV Controller 230, and load-reduction data buffers (LRDB) 330. In certain embodiment, the RCD 320 can be a standard register, which is a register in compliance with an industry standard, such as the Joint Electron Device Engineering Council Double Data Rate 4 Load Reduction Dual In-Line Memory Module (JEDEC DDR4 LRDIMM) standard, so that the HV-DRAM 210 can be compatible with a standard system memory interface. In certain embodiments, the data transmission circuits described in commonly owned U.S. Pat. No. 8,516,185, which is incorporated herein in its entirety, can be used as the LRDB 330. Although FIG. 3 shows the LRDB 330 as one unit, in practice, the LRDB 330 can include multiple units distributed across the module board 201 and coupled to respective groups of memory devices, as described in U.S. Pat. No. 8,516,185.

In certain embodiments, the HV-DRAM 210 provides main memory functions for the HVDIMM 200 when the HVDIMM 200 is used to provide system memory. In certain embodiments, the HV-DRAM 210 acts as buffer memory for the HV-Flash 220 when the HVDIMM 200 is used to provide storage. In certain embodiments, cache-line-wide reads from the DRAM is mapped to the Flash. There are, however, differences between a standard DRAM module (e.g. JEDEC DDR4 LRDIMM) and the HV-DRAM 210. In certain embodiments, the HV-DRAM 210 may include data switches (FET-D), in addition to the command/address switches (FET-A). The data switch FET-D is coupled between DRAM data buffers (LR-DB) and the DRAM, while the command/address switch FET-A is coupled between the memory channel C/A bus and the RCD 320. The FET switches, FET-A and FET-D, can be controlled by the HV Controller 230 to transition the HVDIMM 200 between different operation modes. In certain embodiments, either or both of these switches, FET-A and FET-D, are not required, and the different modes of operation can be accomplished by tristating the relevant I/Os in the DRAM, the HV Controller 230, and/or the LRDB 330.

Figure 4A:
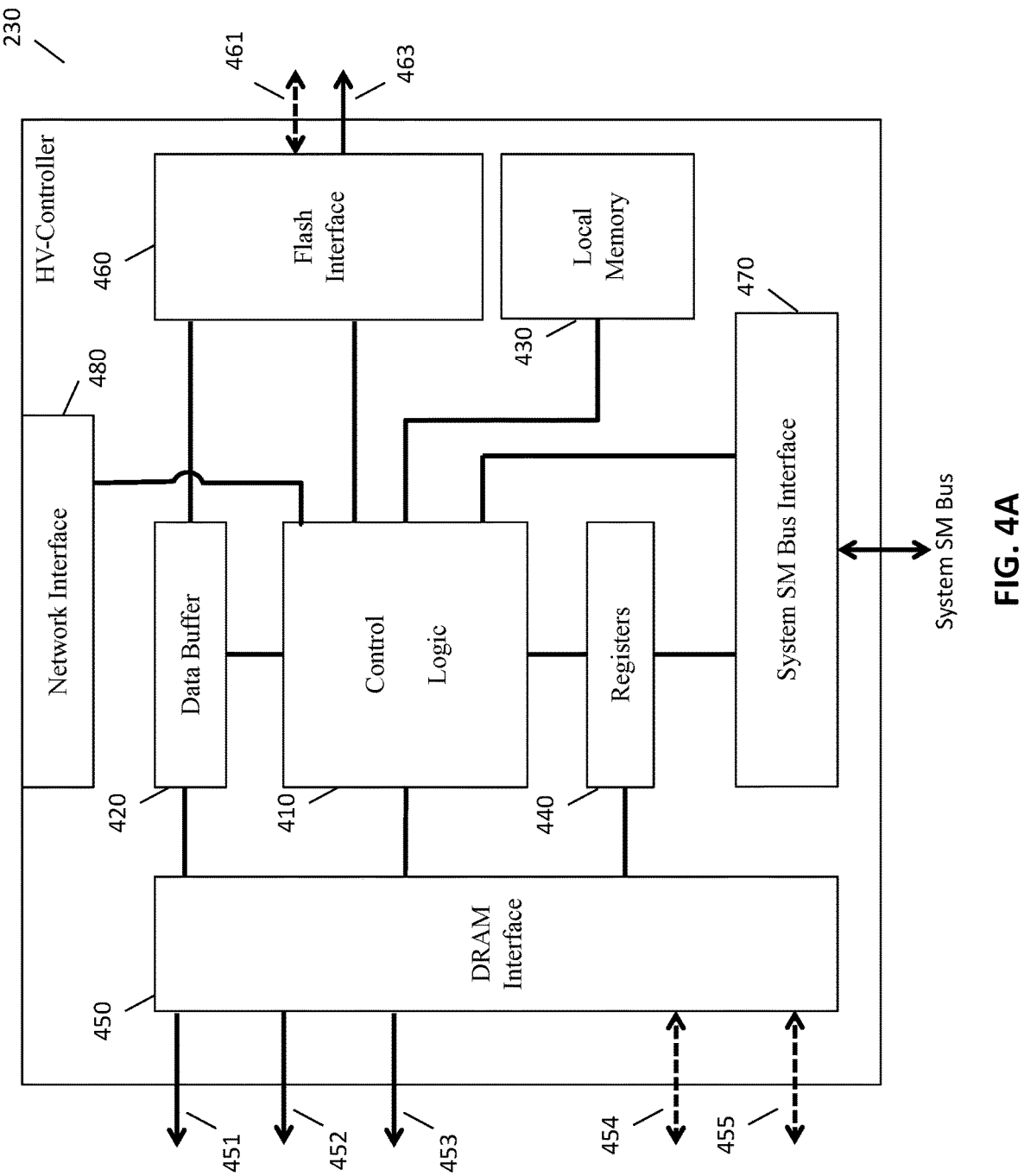
FIG. 4A is a block diagram of a module controller in the memory module according to certain embodiments.

FIG. 4A is a block diagram of the HV Control 230 according to certain embodiments. The HV Control 230 can be implemented using one or more application-specific integrated circuits (ASIC) and/or programmable field gate array (FPGA) devices. As shown in FIG. 4A, the HV Control 230 includes control logic 410, a data buffer 420, local memory 430 and registers 440. The HV Control 230 further includes a DRAM interface 450, a Flash interface 460, a system management Bus interface 470, and a network interface 480. In certain embodiments, the HV Control 230 controls data transfers between the HV-DRAM 210 and HV-Flash 220. It keeps an address management table in the local memory on-chip memory space, operates the router 250 and the switching circuit FET-A, and generates proper commands and address signals to the HV-DRAM 210, HV-Flash 220 and the buffer memory 240 to control the data transfers therebetween.

In certain embodiments, the Flash interface is coupled to the HV-FLASH 220 via data signal lines 461 and control/address signals lines 463, the DRAM interface 450 provides multiple sets of C/A signal lines to control different DRAMs on the memory module 200 at the same time. For example, the C/A signal lines 451 is used to transmit C/A signals to the HV-DRAM 210 during backup/restore operations, and, when both BufA and BufB are provided in the buffer memory 240, C/A signal lines 452 is used to transmit C/A signals to BufA in the buffer memory 240, and the C/A signal lines 453 is used to transmit C/A signals to BufB in the buffer memory 240, so that BufA and BufB can be involved in different data transfer activities concurrently. The DRAM interface 450 also provides multiple sets of DQ/DQS signal lines (e.g., 454 and 455) that are coupled to the router 250 so that the HV Control 230 can handle multiple data transfers concurrently. For example, while data is being transferred between BufB and the HV-FLASH 220, the HV Control 230 can perform error correction on data buffered in BufA.

In certain embodiments, the HVDIMM 200 can be operated to back up data in the DRAM in response to power failure events. The HV Control 230 provides correct timings for HV-DRAM 210 to be operated in an DLL-off mode when data in the DRAM is being transferred to the Flash. The HV Control 230 also provides proper operational procedure for the back-up and restore processes. The switching circuit, FET-A, can be configured to isolate the RCD 220 and to allow the RCD 220 to receive C/A signals from the HV Control 230 during the back-up and restore processes. The HV Control 230 also controls the router 250 to route data from the HV-DRAM 210 to the HV Control 230 during backup operations and to route data from the HV Control 230 to the HV-DRAM 210 during restore operations.

In certain embodiments, the system can access the HVDIMM 200 via the SM bus. For example, the system can use the SM bus to configure the HV Control 230 by setting certain registers in the HV Control 230. The HV Control 230 can also use the SM bus to notify the system when certain operation is completed or when an error is encountered, either using a preconfigured interrupt signal, or by updating a predefined status register in the system bus interface of the HV Control 230, or in the DMA.

In certain embodiments, the HV Control 230 also manages network interfaces between the HVDIMM 200 and any local or wide-area networks in conjunction with HV-NIC so as to facilitate direct data transfers between the HVDIMM 200 and other storage devices in the local or wide-area networks. In certain embodiments, the HV Control 230 includes a network interface and/or is coupled to a network interface card (HV-NIC), which can take the data from the HV-DRAM 210 and/or HV-Flash 220, and constructs network packets with proper source and destination addresses. In general, the source address is pre-configured by the system. In certain embodiments, the HV-NIC or network interface and some or all of the other components of the HV Control 230 can be embedded into a same ASIC or FPGA.

Figure 4B:
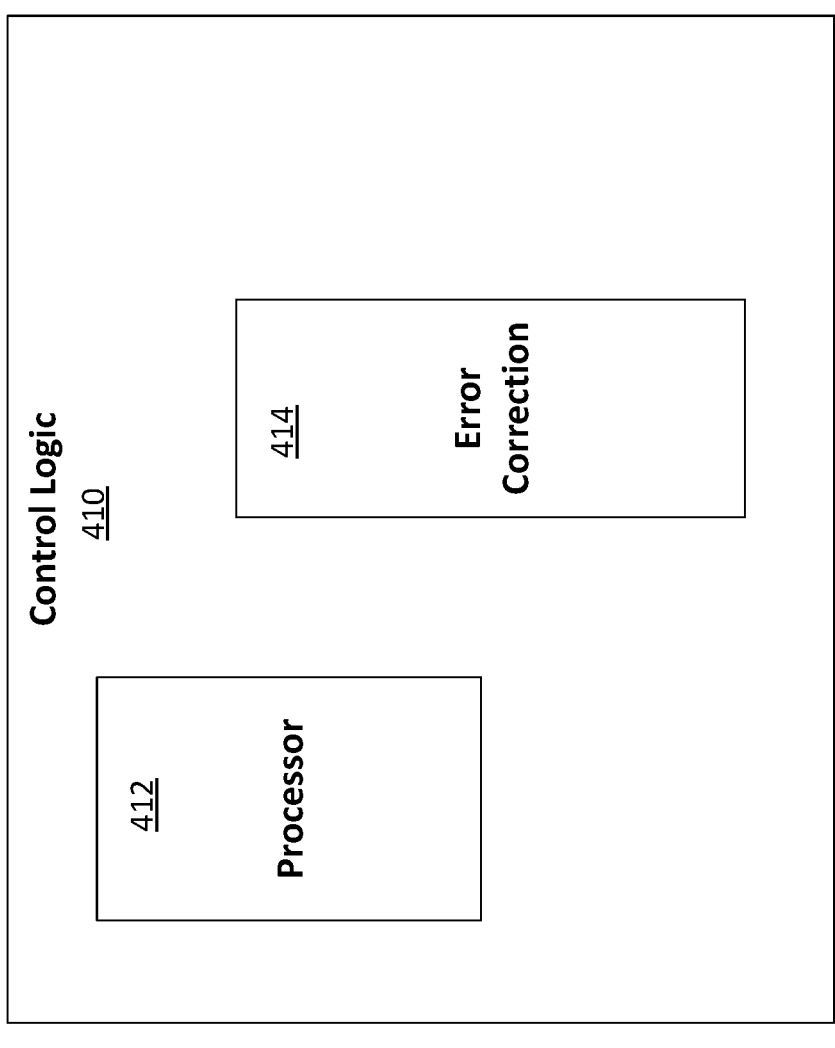
FIG. 4B is a block diagram of a control logic circuit in the module controller according to certain embodiments.
Figure 5:
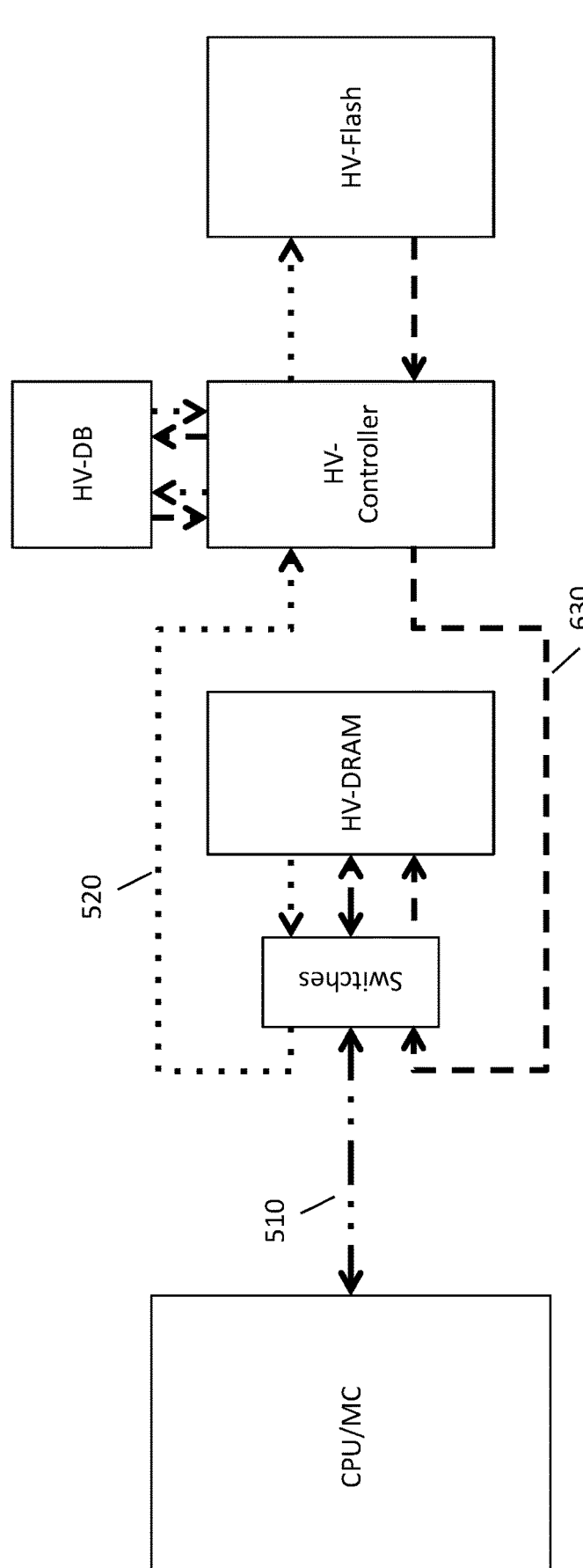
FIG. 5 is a block diagram of a software stack of the computer or server system according to certain embodiments.

In certain embodiments, as shown in FIG. 4B, the control logic 410 includes logic circuits and/or one or more processing units or processors 412 that monitors the C/A signals from the system, generates the C/A signals for the HV-DRAM 210 and/or the buffer memory 240 coupled to the DRAM interface 450 and/or the C/A signals for the HV-Flash 220 coupled to the Flash interface 460, and controls the router 250 and the switching circuit FET-A, in response to the C/A signals from the system. In certain embodiments, the logic circuits and/or processors can be configured to pre-process data being transferred from the Flash to the DRAM, so as to save DRAM memory space and reduce data traffic in the memory channel by off-loading some of the computing work traditionally done by the CPU, as described in U.S. Provisional Patent Application No. 62/041,024, filed Aug. 22, 2014, entitled "Apparatus and Methods for Transferring Storage Content," which is incorporated herein by reference. In certain embodiments, the HV Control 230 also includes an error correction circuit 414 executing error detection/correction routines to insure the integrity of data transferred from the HV-Flash, as described in U.S. patent application Ser. No. 14/536,588, filed Nov. 7, 2014, entitled "Hybrid Memory Module and System and Method of Operating the Same," which is incorporated herein by reference.

Figure 6:
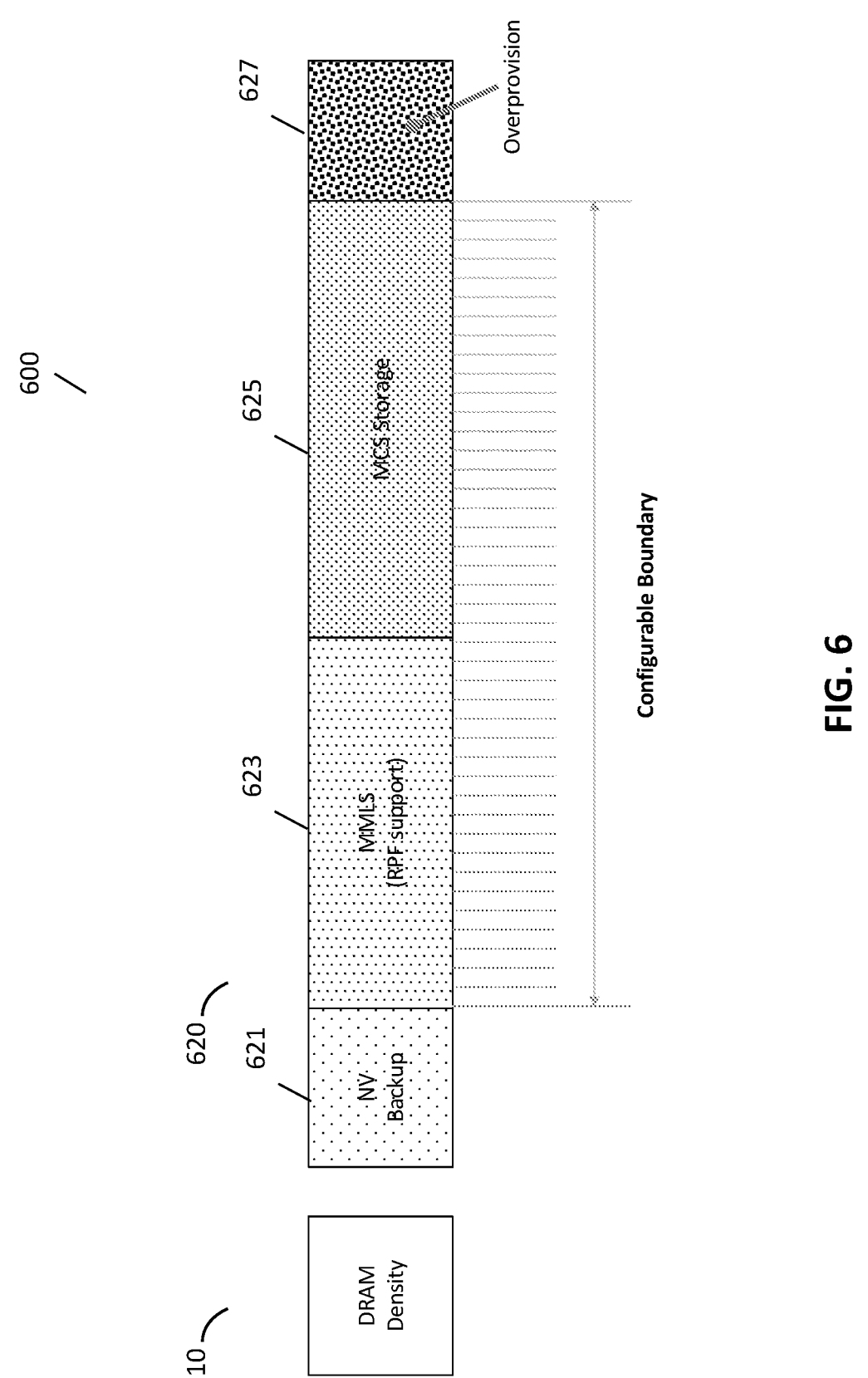
FIG. 6 is block diagram illustrating a physical memory address space of the memory module according to certain embodiments.

FIG. 6 illustrates a memory space 600 provided by the HVDIMM 200 according to certain embodiments. As shown in FIG. 6, the memory space 600 includes a HV-DRAM space 610 and a HV-FLASH space 620. The HV-Flash space 620 is partitioned into a plurality of areas, including a non-volatile (NV) backup area 621, a main memory local storage (MMLS) area 623, an MCS Storage area 625, etc. each of which can be used to support a different function of the HV memory. For example, the NV backup area can be used to store a copy of the content in the HV-DRAM during power outage; and the MMLS area can be used as a swap space, and/or to function as part or all of the main memory. In certain embodiments, working data for random access by the system is stored in DRAM data format in the MMLS area. The MCS area can be used as traditional Flash storage. In certain embodiments, the memory space in the Flash memory also includes an overprovision area, which provides extra storage capacity. In certain embodiments, the overprovision area is hidden from the system and is used to improve performance by distributing writes and erases across a larger population.

The HV-DRAM space 610 includes the physical memory space for random access by the system. This space can be shared by multiple processes or applications running on the system 100. In order to manage the memory space 610 efficiently, the system 100 may provide an abstraction of its main memory known as virtual memory or virtual address space, which maps memory addresses used by a program (i.e., virtual addresses, into physical addresses in the HV-DRAM 210. To implement virtual memory, the system 100 may include a memory management unit (MMU) that keeps track of the pages and their address translations. When a running program tries to access data in a memory page that is mapped into the virtual address space of the system, but not loaded in the physical memory provided by the HV-DRAM 210, a page fault occurs, and the system may raise an interrupt, which prompts the HV driver 160 to handle the page fault by causing the memory module 200 to move the requested data from the HV-FLASH 220 to the HV-DRAM 210, so as to allow the program to continue operation as if the page fault had not occurred.

In certain embodiments, for operations involving the HV-Flash 220 or buffer memory 240, such as a swap-in or swap-out operation, the HV driver 160 sends a Flash access request to the memory controller when it needs to transfer data between DRAM (main memory) and Flash (storage) and provides the DRAM and the Flash addresses with this request. Afterwards, the HV driver 160 and the HV Control 230 work together to move data in or out of the HV-DRAM 210 without causing conflict with normal system accesses to the main memory. In certain embodiments, the memory controller may interleave the storage accesses with normal system memory accesses.

Figure 7A:
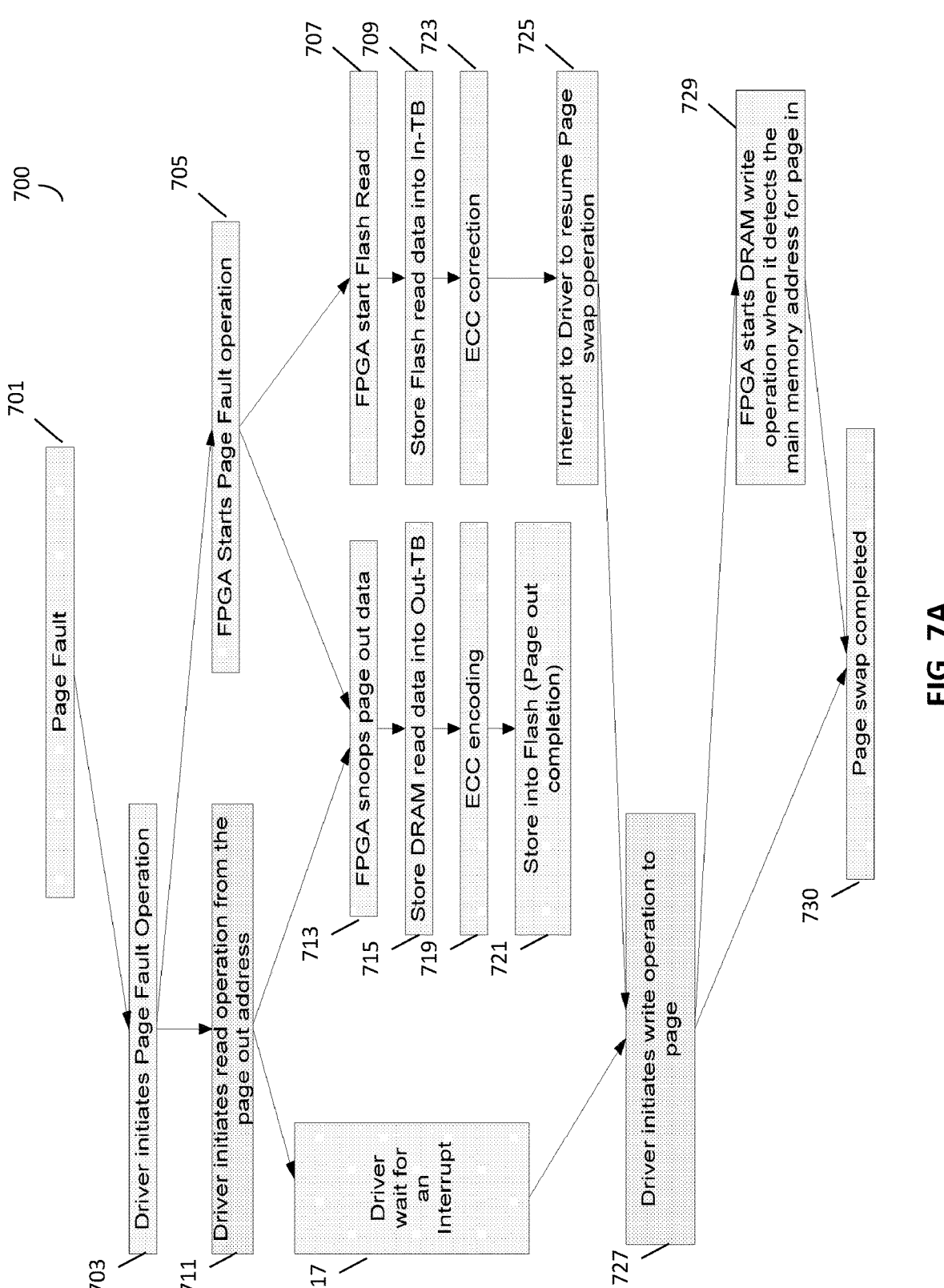
FIG. 7A is a flowchart of data transfers in response to a page fault in the computer or server system according to certain embodiments.
Figure 7B:
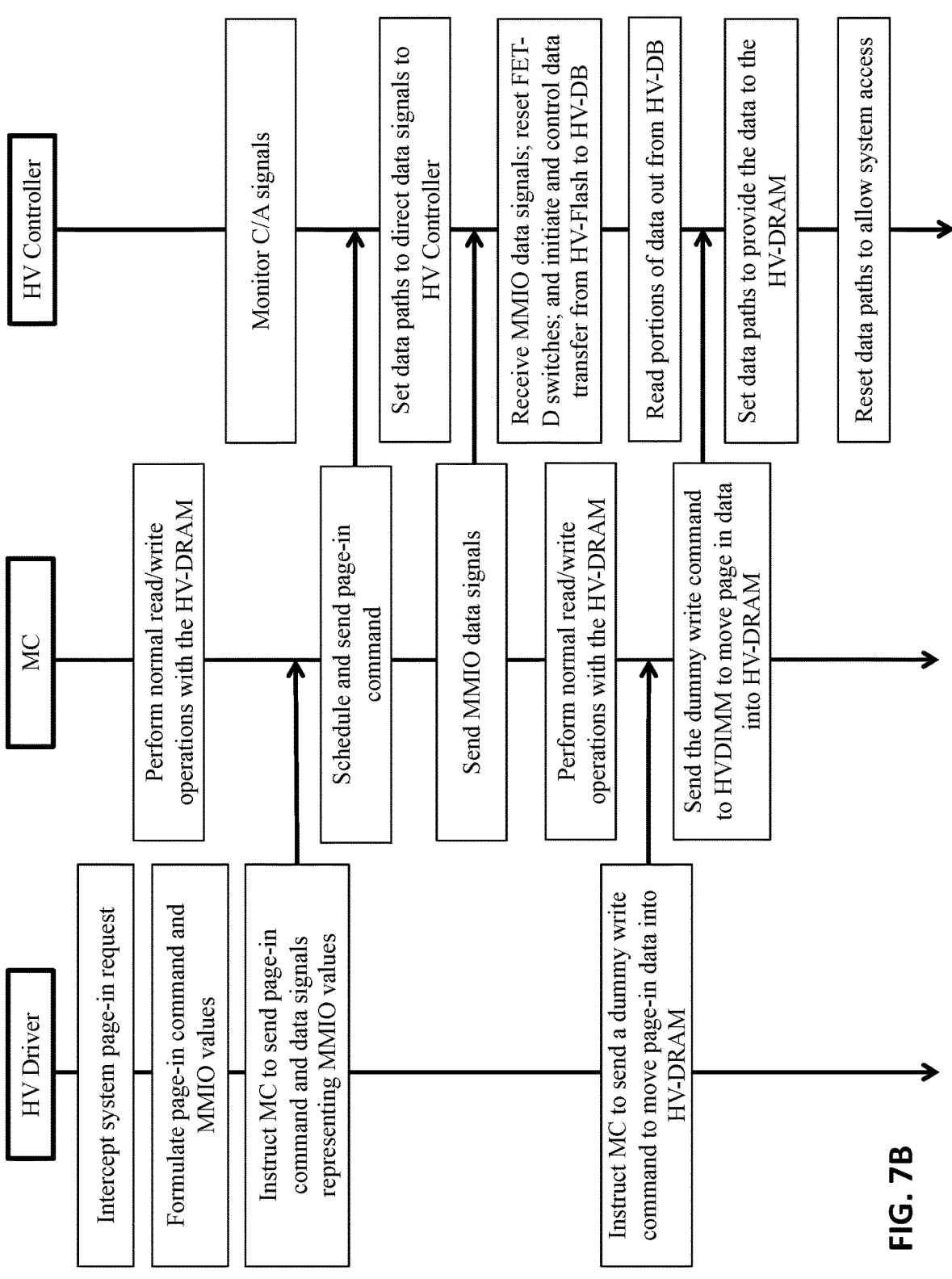
FIGS. 7B and 7C are flowcharts illustrating respectively page-in and page-out processes in the computer/server system according to certain embodiments.
Figure 7C:
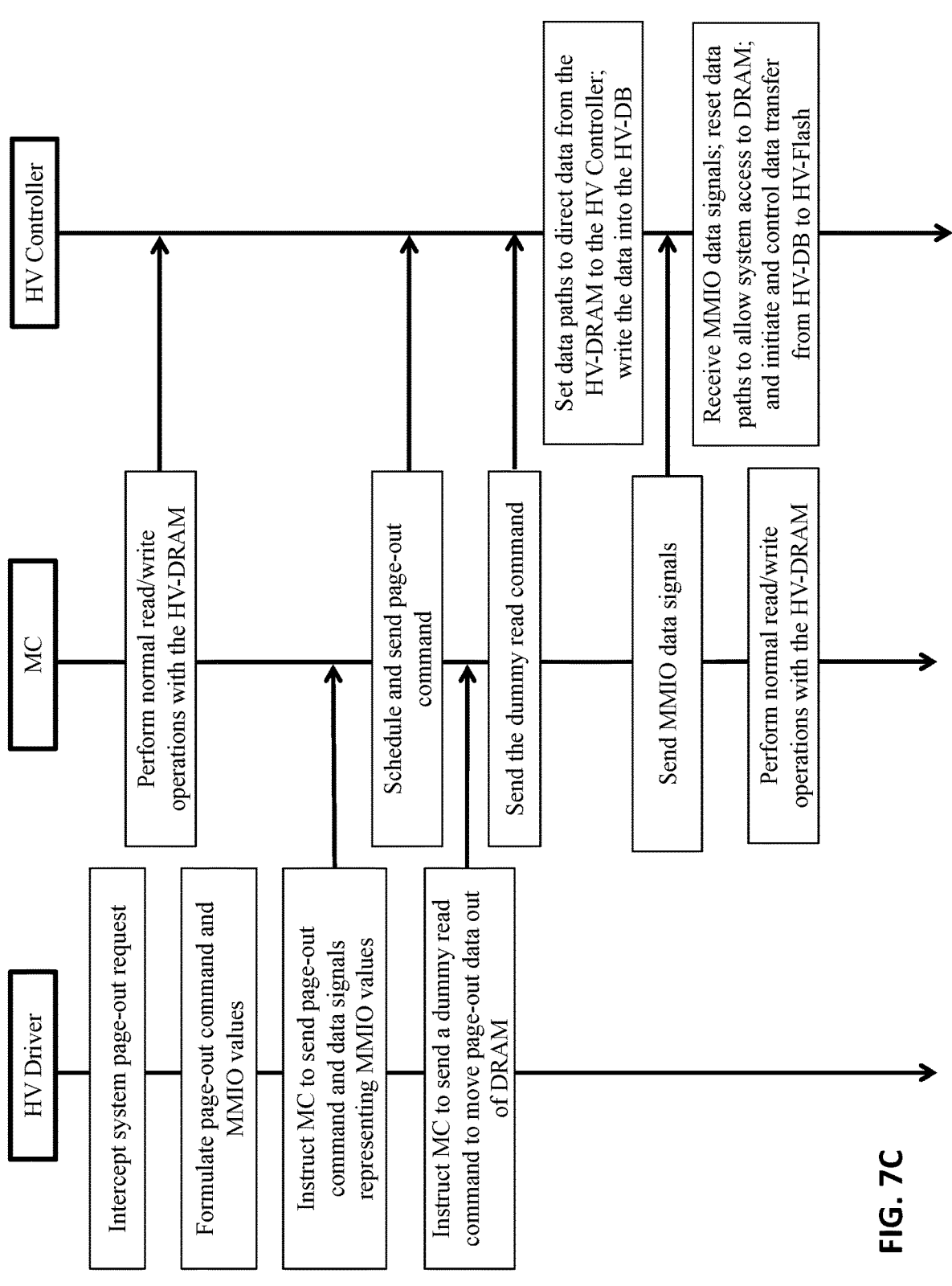
Figure 8:
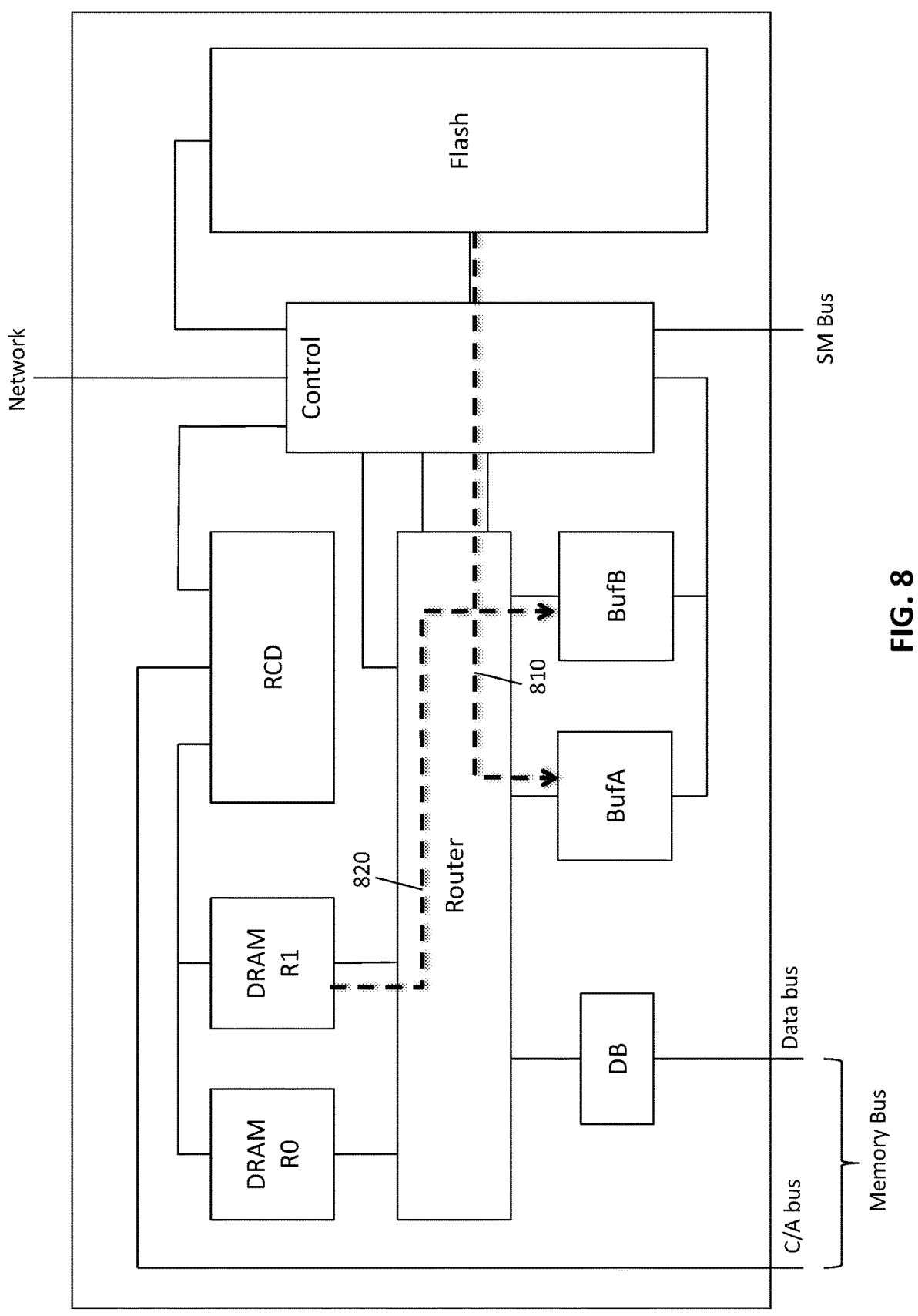
FIGS. 8-10 are diagrams illustrating various data transfers on the memory module according to certain embodiments.

For example, FIGS. 7A-10 illustrate processes carried out by the HV driver 160 and the HV Control 230 according to certain embodiments. As shown in FIG. 7A, in a process 700 carried out in response to a page fault 701, the HV driver 160 initiates a page-fault operation (703) by causing the memory controller to send a first set of C/A signals via the C/A bus to the HVDIMM 200 and a first set of data signals associated with the first set of C/A signals via the data bus to the HVDIMM 200. In certain embodiment, the first set of C/A signals includes a write command that is not directed at the HV-DRAM 210. For example, the C/A signals may include one or more chip select signals, none of which is asserted to select any of the ranks in the HV-DRAM 210. The first set of data signals include further information for the page fault operation such as one or more address locations in the HV-FLASH where the requested data is to be retrieved. The HV Control 230 recognizes the first set of C/A signals and starts (705) the page fault operation on the DIMM by directing the router 250 to route the first data signal to the HV Control 230 instead of the HV-DRAM 210. The HV Control 230 then starts Flash reads (707) by generating Flash C/A signals based on the first set of C/A signals and based on the first data signal received from the memory controller, causing the HV-Flash to output page-in data that is to be loaded in DRAM. The HV Control 230 can cause the page-in data to be stored (709) in BufA by directing the router 250 to form a data path 810, as shown in FIG. 8, and sends a set of C/A signals to BufA ahead of the page-in data according to the timing requirements of the memory devices in BufA.

Concurrently, the HV driver 160 continues to handle the page fault operation. The HV driver 160 may swap some data out of the HV-DRAM 210 to make space for the memory page that is to be loaded in DRAM. In certain embodiments, the HV driver 160 does this by causing the memory controller to send (711) a second set of C/A signals including a read command and a read address, which causes the HV-DRAM to output page-out data. The second set of C/A signals are received by both the RCD and the HV Control 230. The HV Control 230 recognizes the second set of C/A signals as being part of the page fault operation because the read address is related to the address in the first set of C/A signals. In response, the HV Control 230 snoops (713) the page-out data by directing the router 250 to form a data path 820 (as shown in FIG. 8) to route the page-out data into BufB. The HV Control 230 also causes (715) the page-out data to be written into BufB by sending a set of C/A signals to BufB ahead of the page-out data according to the timing requirements of the memory devices in BufB. The data may also be routed directly to the HV Control 230 and written to BufB afterwards.

Figure 9:
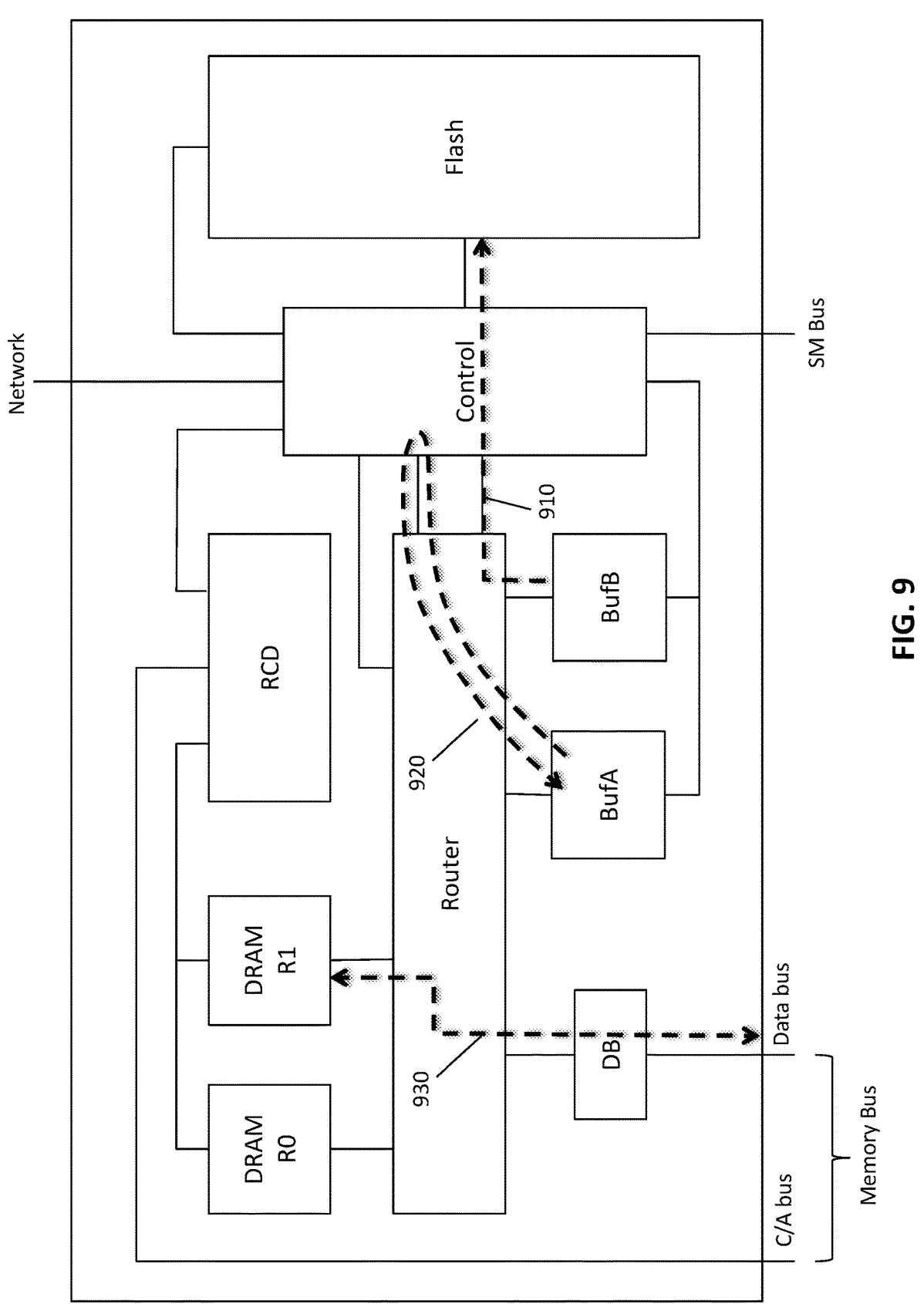

The HV driver 160 now waits (717) as the HVDIMM 200 continues the data transfers discussed above. In certain embodiments, the HV Control 230 may add (719) error correction codes (ECC) to the page-out data, as discussed in U.S. patent application Ser. No. 14/536,588, filed Nov. 7, 2014, entitled "Hybrid Memory Module and System and Method of Operating the Same," which is incorporated herein by reference. In certain embodiments, ECC coding is done as the page-out data is being transferred to the HV-FLASH 220 via a data path 910 through the HV Control 230, as shown in FIG. 9. The HV Control 230 also sends Flash C/A signals to cause the ECC encoded page-out data to be stored (721) in the HV-Flash. In certain embodiments, the HV Control 230 manages HV-Flash 220 addresses and keeps track of physical Flash addresses in relation to virtual/physical addresses known to the system. This can be done by creating and updating an address-mapping table, which maps the system (virtual/physical) addresses to the Flash physical addresses. HV Control 230 uses the address-mapping table to correctly place page-out data into proper locations in HV-FLASH 220.

The HV Control 230 may perform (723) error correction on the page-in data read out from the HV-Flash (723), as discussed in U.S. patent application Ser. No. 14/536,588, filed Nov. 7, 2014, entitled "Hybrid Memory Module and System and Method of Operating the Same," which is incorporated herein by reference. In certain embodiments, the HV Control 230 does so by forming a data path 920 in the router 250, as shown in FIG. 9, which allows the HV Control 230 to read the page-in data stored in BufA, perform error detection and correction on the page-in data, and store the corrected page-in data back into BufA. Depending on the size of the page-in data, the HV Control 230 may separate the page-in data into portions and performs error correction on the page-in data one portion at a time by reading out each portion of the page-in data, performing error detection and correction on the each portion, and writing the corrected portion back into BufA before reading out the next portion of the page-in data for error correction.

Figure 10:
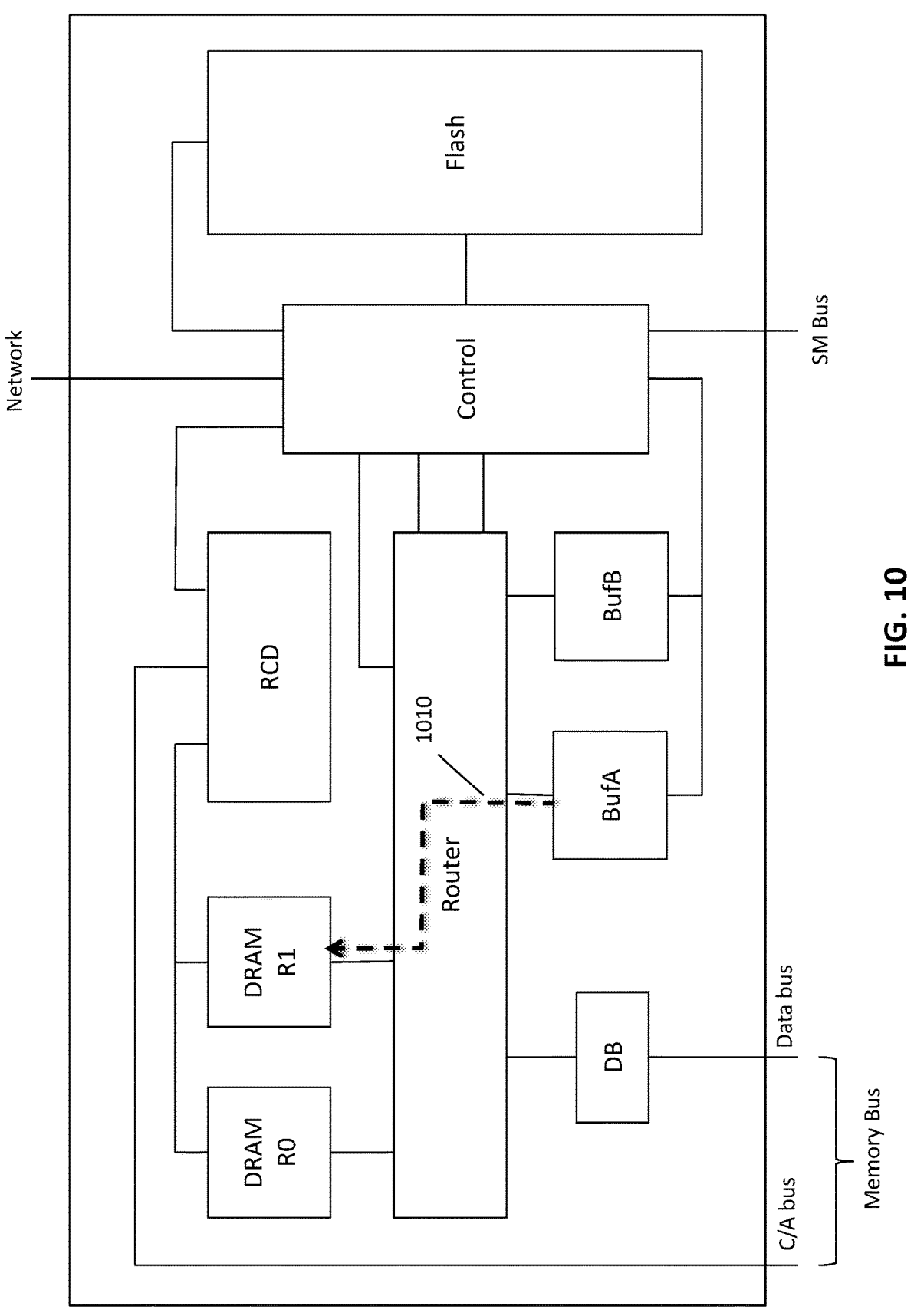

While the HVDIMM 200 is preparing for the page-in data, as described above, the HV Control 230 directs the router 250 to form a data path 930, as shown in FIG. 9, which allows the HVDIMM 230 to perform normal main memory operations in response to commands from the system. When the HV Control 230 completes the data transfers and error corrections discussed above, the HV Control 230 may send (725) an interrupt to the HV driver 160 via, for example, the SM bus. In response, the HV driver initiates (727) a dummy write operation by causing the memory controller to send a third set of C/A signals including a write command and a write address to the HVDIMM 200. In certain embodiments, the dummy write command is like a normal write command except that it is followed with dummy data or no data from the memory controller. The third set of C/A signals are received by both the RCD and the HV Control 230. The HV Control 230 recognizes (729) the third set of C/A signals as being part of the page fault operation because the read address is related to the address in the first or second set of C/A signals. In response, the HV Control 230 sends a read command to BufA, which causes BufA to output the page-in data. The HV Control 230 also directs the router 250 to form a data path 1010, as shown in FIG. 10, to route the page-in data to the HV-DRAM 210, which receives the page-in data in response to the C/A signals from the RCD that are derived from the third set of C/A signals. The dummy data from the memory controller is thus ignored or discarded.

In certain embodiments, normal system access to the main memory is conducted between the system and the HV-DRAM 210, without much involvement from the HV driver 160 or the HV Control 230. In certain embodiments, the memory interfaces in the computer system 100 are designed to be slave interfaces without per command handshake provision. So, the system does not have knowledge about whether any on-DIMM (intra-module) activities are occupying the DRAM input/output (I/O) pins in the HV-DRAM 210. For example, if the DRAM I/Os are being occupied for transferring data between main memory and storage, and the system (memory controller) initiates a data read or write command with the expectation that the DRAMs would be ready to execute the system command, the DRAMs would fail to execute the system read/write operation and the system would experience a 'memory failure', which may lead to a system failure.

In certain embodiments, for operations involving the HV-Flash 220 or HV-DB 240, such as a swap-in or swap-out operation, the HV driver 160 and the HV Controller 230 work together to move data in or out of the main memory without causing conflict with normal system access to the main memory. In certain embodiments, the HV-driver sends a memory access request to the memory controller when it needs to transfer data between DRAM (main memory) and Flash (storage) and provides the DRAM and the Flash addresses with this request. The memory controller may interleave the HV-driver requests with normal system memory access requests.

In certain embodiments, after receiving a page-in command to transfer data from the HV-Flash 220 to the HV-DRAM 210, the HV-controller monitors the memory read/write commands from the memory controller. If the memory address for a write command matches the target DRAM address in the page-in command, the HV-controller replace the write data from the system with the data from the Flash. On the other hand, after receiving a page-out command to transfer data from the HV-DRAM 210 to the HV-Flash 220, the HV-controller monitors the memory read/write command from the memory controller. If the memory address for a read command matches the source DRAM address in the page-out command, the HV-controller snoops the DRAM read data, and transfer the DRAM read data to the Flash.

For example, as shown in FIG. 7B, when a page-in request is issued, the HV Driver would intercept the page-in request and formulate a page-in command and memory-mapped I/O (MMIO) signal values according to the page-in request, which may include a source address range in the storage and a destination address in the main memory. The HV driver 160 instructs the memory controller to issue the page-in command to the HVDIMM 200. The page-in command uses the same set of C/A signals as a standard write command but with one or more designated C/A signals (e.g., chip select signal(s)) asserted or de-asserted to indicate that this is not a normal write command for the DRAM devices 310 to respond to. The memory controller would schedule and send the page-in command as if it is a standard write command. The RCD 320 in the HV-DRAM 210 is configured to recognize this page-in command and would not forward the C/A signals to the DRAM devices 310. The HV Controller 230 on the other hand has been monitoring the C/A signals and would act upon the page-in command by controlling the data transfer between HV-DRAM 210 and the HV-Flash 220 or HV-DB 240.

In certain embodiments, the HV Controller 230 in response to the page-in command may set the FET switches, FET-D, to direct the data signals associated with the page-in command to the HV Controller 230. These data signals represent the MMIO values formulated by the HV driver 160 and include further information/instructions related to the swap-in request, such as what addresses to take data from in the HV-Flash 220 and what addresses in the HV-DRAM 210 to place the data. In certain embodiments, after receiving the MMIO signals, the HV Controller 230 may check whether the requested page-in data has already been loaded into the HV-DB 240, and if not, the HV Controller 230 would initiate and control data transfer from the HV-Flash 220 to the HV-DB 240 by reading the page-in data from the HV-Flash 220 and writing the page-in data to the HV-DB 240 using the data buffer 420 in the HV Controller 230 as temporary storage for the page-in data between the read and write operations. In certain embodiments, after all page-in data are transferred to the HV-DB 240, the HV Controller 230 may reload some of the page-in data into the data buffer 420 in the HV Controller 230, reset the FET-D switches to allow the HV-DRAM 210 to perform normal memory operations with the memory controller, and wait for the command from the memory controller to write the data into the HV-DRAM 210.

In certain embodiments, the HV driver 160 is configured to wait for a certain amount of time to allow the page-in data to be transferred from the HV-Flash 220 to the HV-DB 240. The HV driver 160 may determine the amount of time based on how much data is being paged-in. Afterwards, the HV driver 160 would instruct the memory controller to schedule and send a dummy write command to the HVDIMM 200. In certain embodiments, the dummy write command is like a normal write command except that it is followed with dummy data or no data from the memory controller. The HV Controller 230 would recognize the dummy write command since it is directed at the same addresses the page-in data should be placed. In response, the HV Controller 230 would set the FET-D switches and would provide the page-in data to the DRAM devices 310. The dummy data from the memory controller is thus ignored or discarded. In certain embodiments, the HV Controller 230 output the page-in data to the DRAM devices 310 a certain time period after receiving the dummy write command so that the data appears at the DRAM I/Os in accordance with the CAS latency parameters of the DRAM devices 310. After page-in data associated with the dummy write command has been written into DRAM, the HV Controller 230 would reset the FET-D switches to allow the DRAM to perform normal system memory operations.

Figure 11:
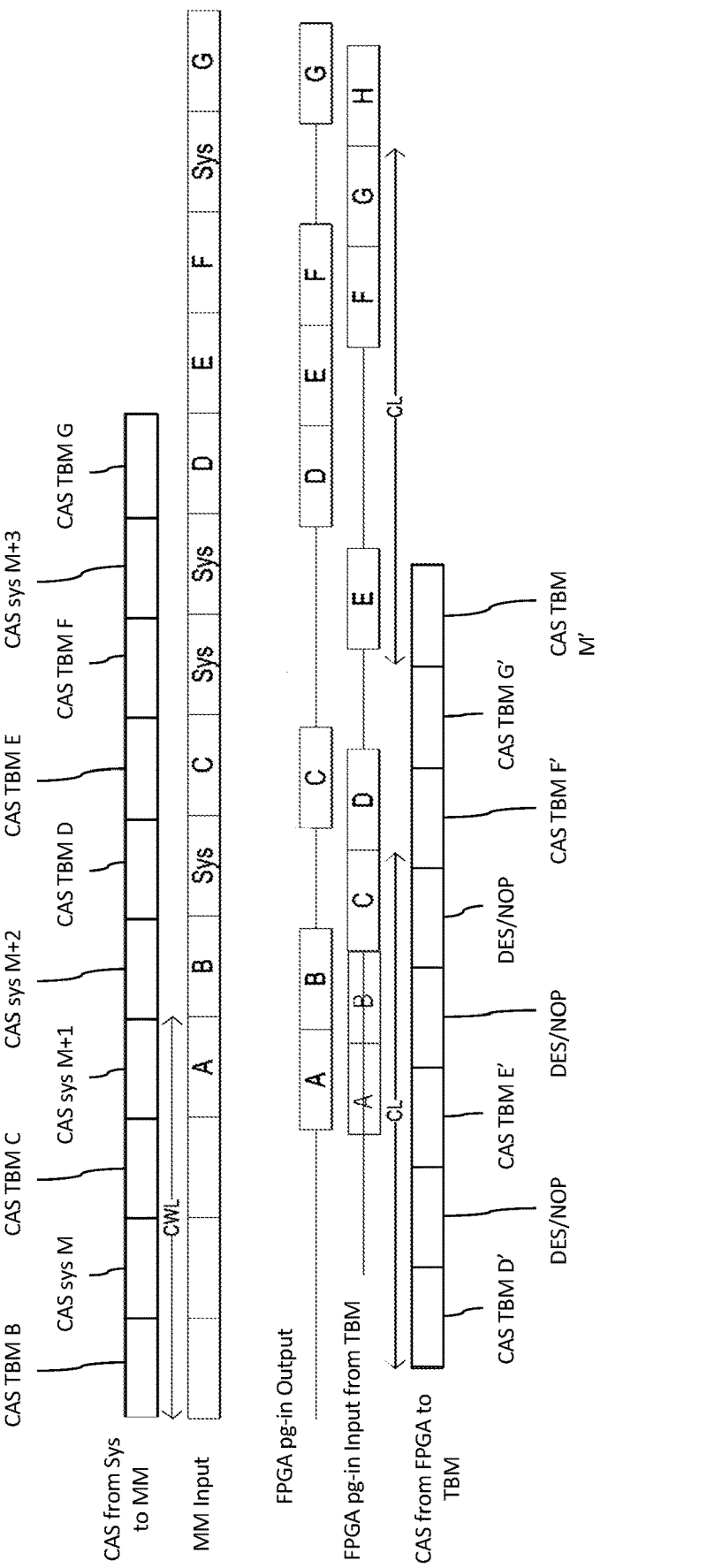
FIG. 11 is a timing diagram illustrating interleaving of page-in data flow with normal memory accesses to avoid data access conflicts according to certain embodiments

In certain embodiments, the HV Control 230 reads the page-in data from BufB and then provides the page-in data from the HV Control 230 to the HV-DRAM 210 in response to the dummy write command from the system. The HV control is configured to monitor the memory commands from the memory controller and schedule on-DIMM (intra-module) data transfers accordingly to avoid data access conflicts. In certain embodiments, the HV Control 230 would work around system memory accesses when placing the page-in data at the DRAM I/Os, so as to avoid system failure caused by such data access conflicts. For example, as illustrated in FIG. 11, as data A through G are being paged in from the buffer memory 240 (TBM) to the main memory (MM), the system may also be issuing memory access commands to write data M, M+1, M+2, M+3 into the main memory (MM). The memory controller may schedule the memory commands from the system and the dummy write commands from the HV driver 160 as follows:

CAS TBM A (not shown)—which is a dummy write command from the HV driver 160 to transfer data A from TBM to main memory (MM);

CAS TBM B—which is a dummy write command from the HV driver 160 to transfer data B from TBM to main memory (MM);

CAS sys M—which is a normal write command to write data M from system into MM; CAS TBM C—which is a dummy write command from the HV driver 160 to transfer data C from TBM to main memory (MM);

CAS sys M+1—which is a normal write command to write data M+1 from system into MM;

CAS sys M+2—which is a normal write command to write data M+2 from system into MM;

CAS TBM D—which is a dummy write command from the HV driver 160 to transfer data D from TBM to main memory (MM);

CAS TBM E—which is a dummy write command from the HV driver 160 to transfer data E from TBM to main memory (MM);

CAS TBM G—which is a dummy write command from the HV driver 160 to transfer data G from TBM to main memory (MM);

CAS sys M+3—which is a normal write command to write data M+3 from system into MM; and CAS TBM H (not shown)—which is a dummy write command from the HV driver 160 to transfer data H from TBM to main memory (MM).

Before the system issues the CAS TBM B command, the HV Control 230 (referred to in the figure as "FPGA") may have issued CAS TBM A', CAS TBM B', and CAS TBM C' commands to BufA to output data A, data B, and data C to the HV Control 230. The HV Control may preload data A and data B from the TBM (as shown by the data blocks A and B in the "FPGA pg-in input from TBM") and place it in the data buffer 420 in the HV Control. Afterwards, data C is output from the TBM in response to CAS TBM C' from the HV Control.

The HV Control continues to issue CAS TBM D' to the TBM when the HV Control observed the CAS sys M command from the system. In response, the HV Control issues a DES/NOP command to the TBM to pause the data transfer between the TBM and the MM. Thus, FPGA page-in (Pg-in) output is paused, as shown by the gap between data B and data C in the FPGA Pg-in output, and system data M (Sys) is received at the MM input. Afterwards, the HV Control continues to issue CAS TBM E' to the TBM when it observed CAS sys M+1 and later CAS sys M+2 from the system. In response, the HV Control issues two consecutive DES/NOP commands to pause the TBM from outputting data to the HV Control. As a result, no data is output between data E and data F from the TBM, and no data between data C and data D is driven from the HV Control to the MM, leaving a gap in the HV Control output to the MM to allow the MM to take system data M+1 and M+2 (Sys).

The page-out operations can be performed similarly but in opposite direction and in a different order, as exemplified in FIG. 7C. Thus, the page-out/page-in process can be orders of magnitude faster than using PCIe SSD or conventional memory channel storage because the page-in and page-out data can be transferred between the main memory and the storage on the HVDIMM 200, without going through the memory channel or the CPU. In addition, system performance is further improved because the data transfer between HV-Flash 220 and HV-DRAM 210 also frees up the main memory channel and the CPU. In certain embodiments, data in the HV-Flash 220 is stored in DRAM format, so there is no need to convert the data format as data is being moved between the HV-Flash 220 and HV-DRAM 210, which is conventionally performed by the CPU.

In certain embodiments, the HV Control 230 is further configured to perform shadowed data transfer operations between the HV-DRAM 210 and the HV-Flash 220. For example, when a system command targets a DRAM address that has been preprogrammed as an address that requires data to be transferred from the HV-Flash 220, the HV Control 230 would perform such a transfer to enable proper system access to this preprogrammed address.

In certain embodiment, the HVDIMM on the memory bus is a slave device in that it does not initiate communications with the system except through the asynchronous (e.g., I²C) interface. Thus, the system can send commands via the memory bus, but the HVDIMM 200 responds via the SM bus when sending the interrupt to the HV driver 160 to indicate completion of on-DIMM data transfers. The HV driver 160 generally takes microseconds to handle these signals. Thus, the performance of the system 100 suffers due to the relatively long handling time of asynchronous interface signals. Thus, notifying the system via asynchronous interface can cause hundreds of microseconds or more read latency.

To avoid the read latency associated with the asynchronous interface, a polling protocol can be implemented, which allows the system to periodically monitor readiness status of data transfers in the HVDIMM. Polling for the readiness status, however, may require a number of tries, and each polling activity needs to be scheduled by the system memory controller, resulting in reduction of valuable main memory bandwidth for regular memory access activities.

In certain embodiment, the registers 440 in the HV Control 230 includes status registers to store data transfer status information, and the system (e.g., the HV driver 160) carries out a "prediction and correction" method 1200 for each storage read operation, as illustrated in FIG. 12. In certain embodiments, the HV driver 160 keeps a memory space for the status registers (i.e., the status register space), which is a virtual DRAM address space that exists in a system address space of the system 100, although there is no physical DRAM associated with it. The HV-driver initiates write or read commands to the status register space for writing into or reading from the status registers.

In certain embodiment, the prediction and correction method 1200 comprises: initiating a Flash access request (1210). This can be done by, for example, initiating a page fault operation using, for example, process 703 discussed above with reference to FIG. 7A, or any other operation involving transferring data out of (or into) the HV-FLASH 220. The HV driver 230 then predicts a period of time it may take for the HVDIMM to perform the data transfers based on historical data and based on the size of the data being transferred from HV-FLASH 220. The HV driver waits for the period of time to pass (1220) before initiating a memory read operation addressed to the status registers space to read the information in the status registers (1230), and determines if the information from the status registers indicates that the data from HV-FLASH 220 has been buffered in the buffer memory 240 (1240). If the information from the status register indicates that the data has been buffered, the HV driver 160 initiates a write operation to cause the buffered data to be written into HV-DRAM (1250). Otherwise, the HV driver 160 waits an additional period of time before reading the status registers again and repeats the above process. The additional amount of time can be determined based on information from the status registers.

In certain embodiments, in response to receiving the Flash access request, the HV Control 230 receives and deciphers the data associated with the Flash access request, which includes information regarding the location of the storage data to be read from the HV-Flash 220. The HV Control 230 then issues a Flash read command to transfer the storage data from the Flash to the buffer memory 240, monitors the data transfer, and updates the information in the status registers accordingly.

In certain embodiments, the registers 440 in the HV Control 230 further comprises Flash access queue registers, or the status registers can be used as Flash access queue registers. The HV Control 230 queues Flash access requests from the system using the Flash access queue registers, and computes an "estimated wait time" for each Flash access request queued in the Flash access queue registers. The estimated wait time is updated periodically based on historical data transfer rates and the number of previously queued Flash access requests. When the data transfer from the Flash to the buffer memory 240 is completed, a ready bit is set in the status registers, and the corresponding "estimated wait time" is updated to be zero.

For example, if the storage data requested by a Flash access request is 1 MB in size, the HV controller starts a timer as it starts the data transfer. It measures how long it takes to move each of multiple 10 KB chunks of the 1 MB storage data, and calculates the average time (e.g., 1 microsecond or µsec) to move a 10 KB chunk of storage data. Based on how many 10 kB chunks are left for each data transfer, the controller calculates the remaining time for the data transfer, and updates the status registers storing the estimated wait time to reflect the remaining time as the storage data is being moved to the buffer memory 240.

For example, if there are 4 queued commands, a first command having its storage data currently being transferred, a second command for moving 1 MB of storage data, a third command for moving 2 MB of storage data, and fourth command for moving 1 MB of storage data. Assuming that the current data transfer has about 10 µsec left to complete, the estimate wait time for these commands would be:

First Command (in Queue 0)—10 µsec,
Second Command (in Queue 1)—110 µsec,
Third Command (in Queue 2)—210 µsec, and
Fourth Command (in Queue 3)—410 µsec.

Figure 13:
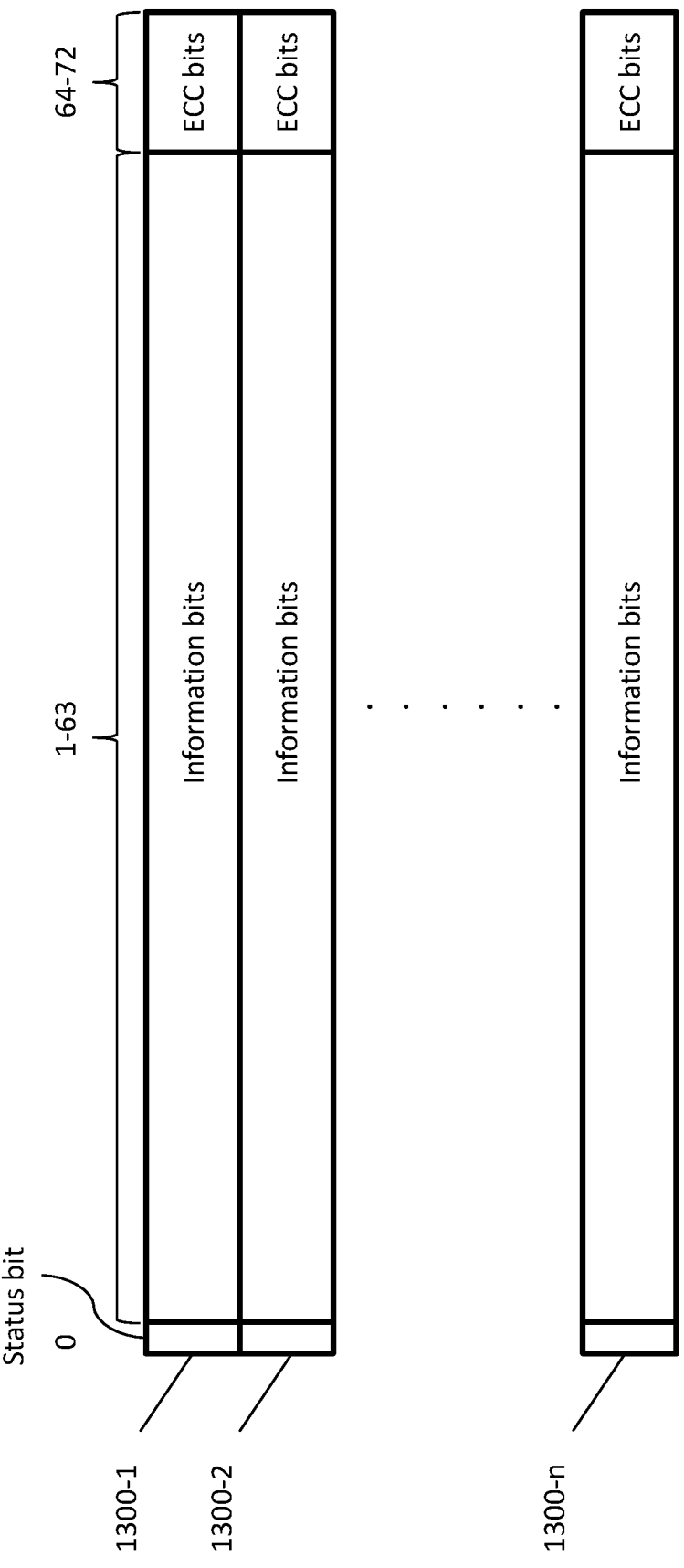
FIG. 13 is a block diagram illustrating status registers on the memory module according to certain embodiments.

These estimated wait time is stored in the status registers together with the respective ready bit, and is updated periodically (e.g., every 10 µsec). In certain embodiments, the status data for each respective command is represented by a set of status bits including a ready bit (e.g., bit 0) indicating completion of the associated data transfer and a plurality of information bits storing further status information associated with the respective command, such as the respective estimated wait time to completion, as shown in FIG. 13, which illustrates n sets of status registers, 1200-1, 1200-2, . . . , 1200-n, each for storing the status bits and associated ECC code for a respective queued command. The system knows which queued command each set of status registers represent based on the order of the queued or uncompleted commands whose data has not been read out. When the system reads the status registers, and the ready bit is set, the system can proceed to read the data from the buffer memory 240. If the ready bit is not set, the system may read the "estimated wait time", and wait for that period before issuing the read command to read the storage data or re-reading the status registers.

Thus, in the above example, if the system reads out the buffered storage data after 20 µsec, data associated with the first command should be ready and read out, while each of the other queued commands are moved up in queue with the following status information:

Second Command (in Queue 0)—90 µsec,
Third Command (in Queue 1)—290 µsec,
Fourth Command (in Queue 2)—390 µsec, and
Fifth Command (in Queue 3)—xxx.

If the system does not read out the buffered storage data for 500 µsec, then the wait time may be (after 500 µsec)

First Command (in Queue 0)—0 µsec (data is ready and the ready bit is set),
Second Command (in Queue 1)—0 µsec (data is ready and the ready bit is set), Third Command (in Queue 2)—0 µsec (data is ready and the ready bit is set), and
Fourth Command (in Queue 3)—0 µsec (data is ready and the ready bit is set)

Thus, the system can accumulate data read out operations, and execute them all together based on the information from the status registers.

In certain embodiments, each set of status registers 1200 also includes ECC bits for storing an ECC code associated with the respective status data. An ECC-capable memory controller as used in many modern personal computers, and most medium to high-end workstation and server systems, can use the ECC code that comes with each data word to detect and correct a single-bit errors per 64-bit data word (i.e., a unit of bus transfer), and detect (but not correct) a two-bit error per 64-bit data word. The memory controller may drop the status data unless the ECC is checked out correctly.

In certain embodiments, to produce the correct ECC for the status data, the HV driver 160 causes the memory controller to write various pre-defined status code into the HVDIMM 200 that covers most or all possible status situations. The system memory controller would assert the correct ECC code prior to writing the pre-define status code to addresses assigned to the internal memory of the HV Control 230. The HV Control 230 stores each pre-defined 64-bit status code along with its ECC byte into the registers or local memories in the HV Control 230, and updates the status registers using the pre-defined status code along with its ECC code. For example, if the HV Control 230 needs to update a set of status registers for a queued Flash access request with the status information of "90 µsec estimate wait time till completion," the HV Control 230 would look up the predefined status code corresponding to this status information in its local memories and update the set of status registers with the predefined status code and its associated ECC code. When the system requests for the status of the Flash access request by reading the status register, the HV Control 230 can simply read the pre-defined status code along with the correct ECC from the status registers, and sends that out to the system.

In certain embodiments, the status registers can also be used to store other status information, such as the "healthiness of the Flash" on a HVDIMM, the remaining life time of the Flash storage, any statistical data collected during the operations, etc.

Thus, the system can avoid implementing the polling protocol and use instead a dynamic and synchronous communication interface to obtain status information from the HVDIMM 200 via the memory bus. The system also can dynamically schedule CPU activities (process queue) efficiently based on the information it gets from the status registers.

In certain embodiments, the memory controller performs ECC encoding/decoding and interleaving amongst the sockets (CPUs), channels and ranks to improve the error handling capability. The memory controller performs these operations both on address and on data. Thus, the system address and data (including the cache) has one-to-one mapping to the DIMM address space. Any particular mapping, however, is usually only valid for a particular version of server platform with a particular version of BIOS and Memory Reference Code (MRC). The Memory Reference Code (or MRC) in some computers determines how the computer's memory (RAM) will be read and written, and adjusts memory timing algorithms correctly for the effects of any modifications set by the user or computer hardware. In other words, even for a same platform, if a new version of BIOS or MRC is installed, the translation mapping is likely to become invalid. Thus, for HVDIMM 200, a designer either needs to target for a particular version of server platform and BIOS/MRC, or needs to find a way to overcome the issue associated with the uncertainty of the server platform and BIOS/MRC variation. This issue becomes more important for HVDIMMs that support a DRAM main memory space as well as a storage space since these two address spaces do not always co-exist on the memory table.

In certain embodiments, the system used a Memory Mapped I/O (MMIO) access protocol to access the storage space of the HVDIMM 200, allowing the system to distinguish the system address space from the storage space. This MMIO space may not be in the traditional MMIO system address space. For example, non-uniform memory access (NUMA) is defined in the 3.75 GB-4 GB system address. Since the system address decoder gives higher priority to target the traditional MMIO decoding for this range over the main memory address decoding, defining the MMIO space for the HVDIMM 200 in the traditional MMIO space may not work correctly. Thus, in certain embodiments, the MMIO space for the HVDIMM 200 is defined in the main memory space, and is thus different from the traditional MMIO space. For that reason, the MMIO space for the HVDIMM 200 is referred to herein as Pseudo MMIO (PMMIO) space.

In certain embodiments, to be able to access the storage space in an HVDIMM via the memory bus, the system has knowledge about which system address space actually maps to the Flash memory space 620, and tag those memory spaces as the PMMIO space for the HVDIMM.

In certain embodiments, instead of developing a generalized mapping table to embrace all the variables (i.e. the platform version, BIOS version and MRC version) mapping table, an automatically configurable mapping table is developed to provide a relationship between the system address (physical address) and the DIMM address for a particular system that contains one or more HVDIMMs.

The automatically configurable mapping table contains the DIMM and Rank numbers that associate with the system address. This mapping table can be a set of arithmetic expression of a mapping or actual look up table, and is built on the fact that the address relationship (one-to-one) does not alter while a system is in operation. This also means that the table can be configured during boot-up and initialization period, and will be valid though out the operation.

In certain embodiments, the following procedures are employed to configure the mapping or lookup table:

Set up a DIMM population rule;

In an on-DIMM serial presence detect (SPD) device, code the DIMM density bigger than the actual DRAM density (e.g., for a DIMM with 8 GB DRAM density, the SPD is configured as a 16 GB DIMM);

Read the BIOS/MRC registers for interleaving, offset configuration;

Reverse map the DIMM address into the system address; and

Mark the address space for the non-existent DRAM space as reserved space for

PMMIO operations, thus creating a Flash access address space.

This reserved space is not likely a contiguous system address space due to the socket, channel and rank interleaving. The HV driver 160 uses this reserved address space as the PMMIO space for the particular HVDIMM. The HV Control 230 recognizes any address targeting the Flash access address space as the MMIO command access, and deciphers the associated data as the MMIO command.

The Flash access space on the DIMM can be used to support any data transfer between the HV-FLASH and the system. It also helps to support on DIMM data transfer between the main memory DRAM and the Flash without going through the buffer in the CPU. This can be done by building a memory association table that maps system addresses to the associated DIMM locations along with the physical HV-FLASH locations. The association table can be stored as one of the lookup tables 182, as shown in FIG. 1B and accessible by the HV driver 160.

Figure 14:
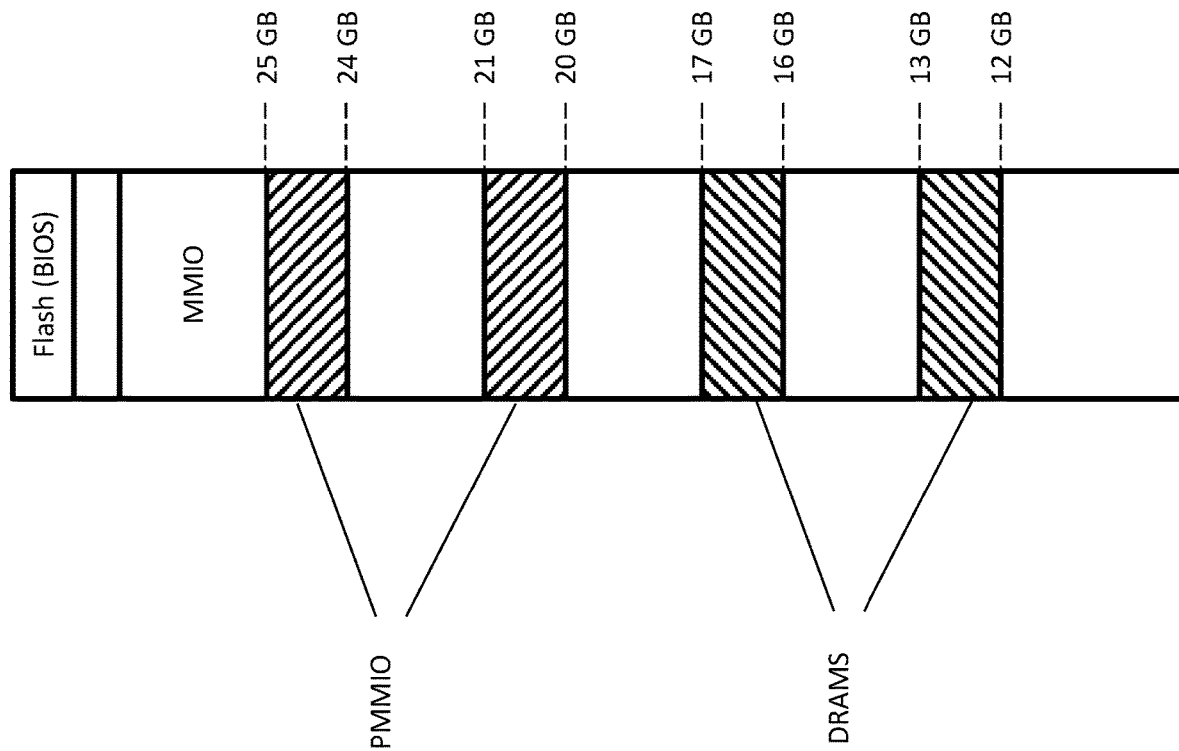
FIG. 14 is a block diagram illustrating a system memory address space in the computer or server system according to certain embodiments.

For example, as shown in FIG. 14, the system address for the DRAMs on Socket (CPU) 0, Channel 0, HVDIMM 0 is reverse mapped to 12 GB-13 GB and 16 GB-17 GB. The PMMIO space for the same HVDIMM is mapped to system address space 20 GB-21 GB and 24 GB-25 GB. The system can associate these address spaces such that data can be transferred between the PMMIO space 20 GB-21 GB/24 GB-25 GB and the DRAM space 12 GB-13 GB/16 GB-17 GB.

One effective use of this association mapping is that the main memory data (DRAM) swap space can be built into the HVDIMM on the same DIMM, and the data swap can occur directly without any involvement of the buffer in CPU. This also allows swapping (e.g., page-in or page-out) very large data size without overhead by executing on-DIMM direct data transaction, as discussed above with reference to FIGS. 7-10.

Thus, the storage in the HVDIMM 200 can be efficiently used without being limited to a particular sever platform or BIOS or MRC.

Figure 15:
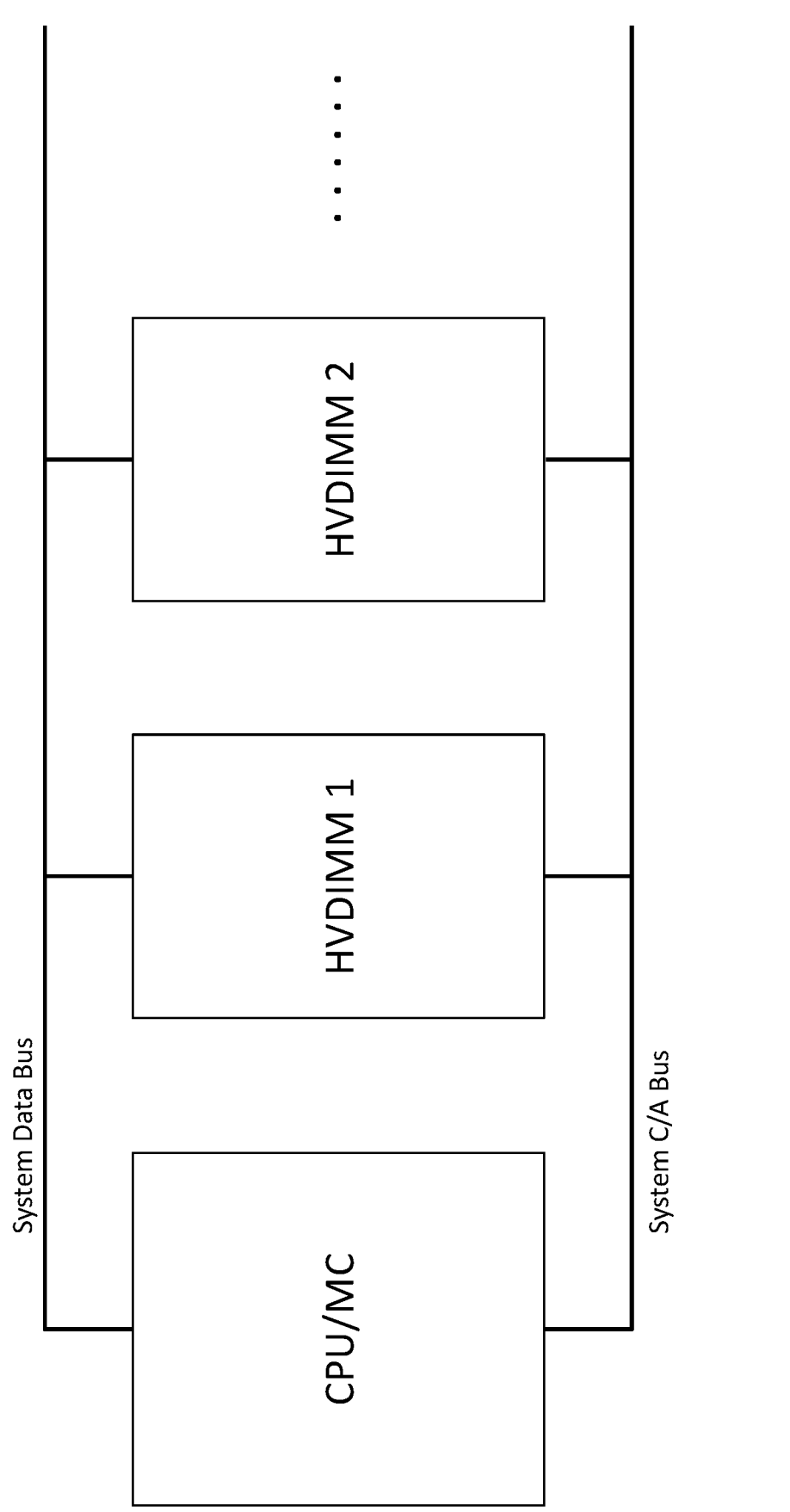
FIG. 15 is a block diagram illustrating multiple HVDIMMs being used together to provide system memory and/or storage on a memory channel.

In certain embodiments, as shown in FIG. 15, multiple HVDIMMs 200, e.g., HVDIMM 1, HVDIMM 2, etc., can be used together to provide the system memory and/or the storage coupled to the CPU/MC via the system bus, which includes a system control/address bus and a system data bus. Since the operating system sees the Flash space of all HVDIMM 200$s$ as a unified HVDIMM 200 storage, and the system may not know which physical Flash devices are located on which physical HVDIMM 200. As a result, the HV driver 160 could issue a page-out command with the DRAM address on one HVDIMM 200 and the Flash address on another HVDIMM 200.

To address this issue, the HV driver 160 in certain embodiments builds a memory association table, as shown in FIG. 16. Since the operating system views the storage providing all of the HVDIMM 200$s$ as one storage disk (say, the K-disk), the driver can partition the K-disk into a plurality of sub-disks, K1, K2, . . . Kn, each associated with the a respective HVDIMM 200. For example, as shown in FIG. 16, the memory association table has 24 entries per CPU, which in certain embodiments is the number of DIMM socket per CPU. Each entry correspond to a respective HVDIMM 200 and includes the sub-disk number, the HVDIMM 200 ID, the minimum and maximum address bounds for the HV-DRAM 210 on the DIMM, and the minimum and maximum address bounds for the HV-Flash 220 on the DIMM. Thus, by consulting the memory association table, the HV driver 160 would try to swap data within the address bounds of the HV-DRAM 210 and the HV-Flash 220 on the same HVDIMM 200.

In general, for cost/performance/power reasons, the memories in a computer/server system are arranged in layers such that faster and smaller memories are located within (or close) to a memory cores (e.g., first layer cache), and density and access time increase as memory is physically and electronically further away from the core. There are layers of cache memories in a CPU/MC package, and the memory module(s) that are connected to the MC via a dedicated memory channel in the system bus is regarded as the main memory, which provides dynamic random data access by the CPU. The storage devices are further away from the CPU and are usually very large memories in the system, such as hard disc devices (HDD), solid-state storage devices (SSD), etc., but they do not provide dynamic random access capabilities.

Figure 17:
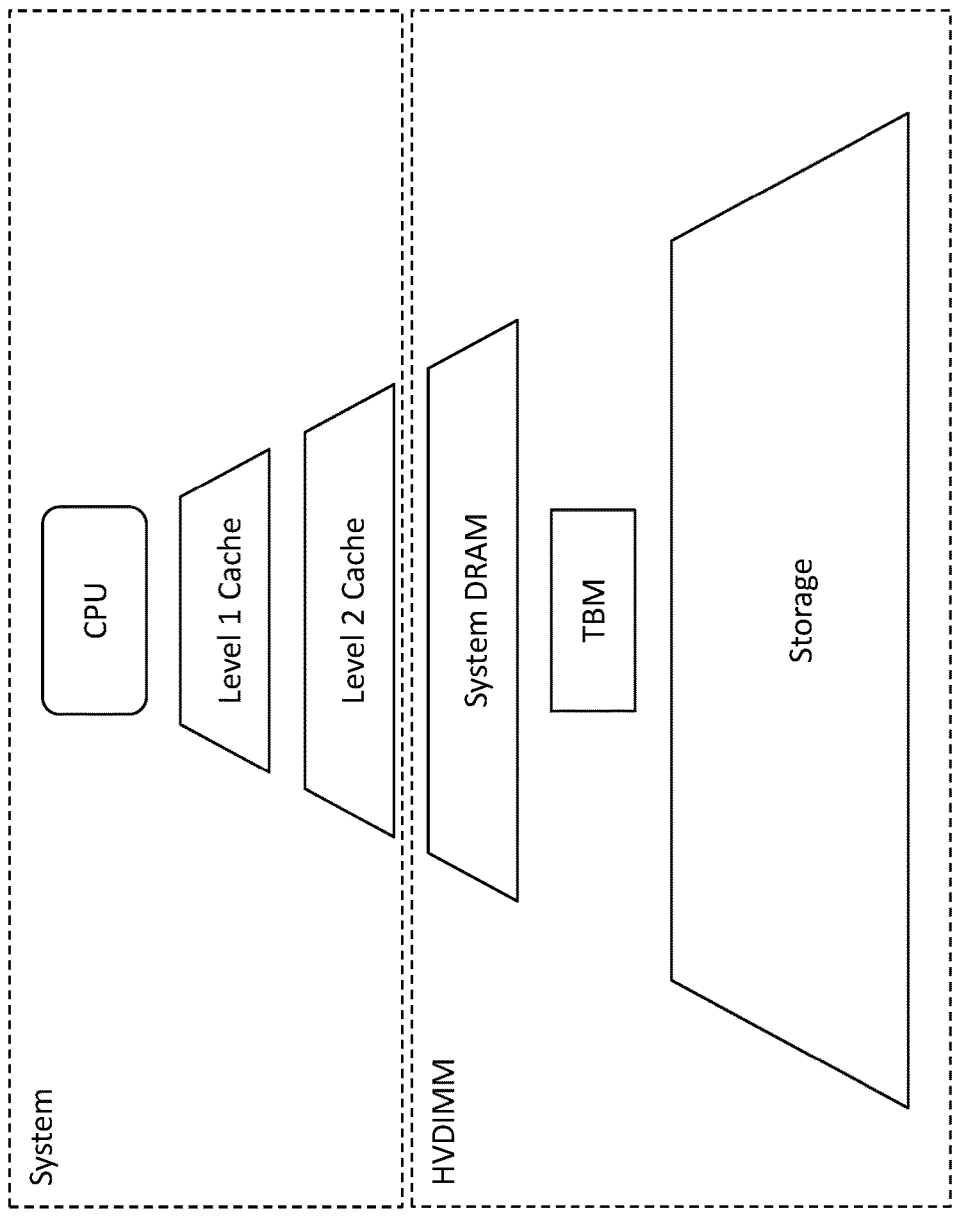
FIG. 17 is a diagram illustrating a memory structure in the computer or server system according to certain embodiments.

The memories in the computer system 100 are somewhat similarly structured, as shown in FIG. 17 except that the storage provided by the HVDIMM 200 are not far away from the CPU and data from the storage can be moved into the HV-DRAM 210 for random access without going through a south bridge, or a PCI bus, or even the memory channel. Furthermore, the HVDIMM 200 provides the HV-DB 240, which can act as a cache memory for the HV-DRAM 210 by storing data which the HV-DRAM 210 does not have space to hold and which can be quickly moved into the DRAM when needed in response to a dummy write command from the memory controller.

In certain embodiments, the HVDIMM 200 is configured to provide a very large, configurable, expandable, dynamic random access system memory to a computer system. The HVDIMM 200 incorporates novel memory cache layer techniques, i.e., the Memory Window techniques, where the HV-DRAM 210 holds contiguous and complete sections of HV-Flash 220 for dynamic access by the computer system. Thus, the HV-Flash 220 works as a data vault to the HV-DRAM 210, such that the computer system can open up a Memory Window (MW) in the HV-Flash 220 and bring needed data stored in the HV-Flash 220 to the HV-DRAM 210 via Memory Window for dynamic random access by the System.

Figure 18:
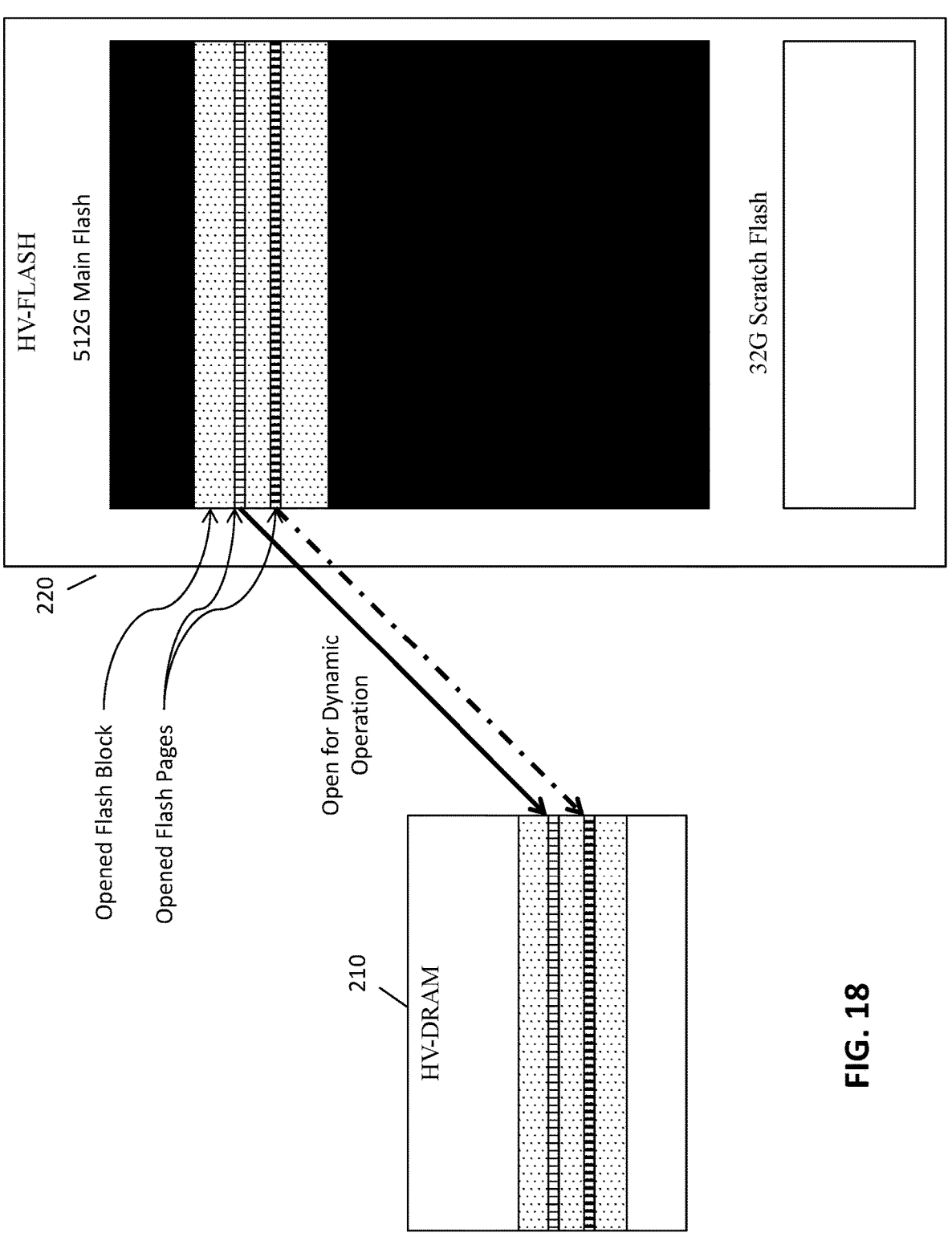
FIG. 18 is a diagram illustrating memory spaces in the hybrid memory module during a memory window operation.

In certain embodiments, the HVDIMM 200 can perform two types of operations concurrently: standard memory operation (SMO), as discussed above, and Memory Window operation (MWO). During SMO, the HVDIMM 200 provides a standard main memory space via a standard protocol (e.g., the JEDEC DDR4 LRDIMM protocol). During MWO, as shown in FIG. 18, a specific memory area (MW), such as a Flash segment or block, in the HV-Flash 220 is opened up to support high speed dynamic random access by the computer system. Requested data in the specific memory area is moved from the Flash to the DRAM. If the system requests to open up more MWs than the DRAM space is allowed, the system has the option to have the HVDIMM 200 overwrite the least recently used (LRU) DRAM area, or overwrite a specific DRAM location. The data from a DRAM area is moved back from the HV-DRAM 210 to the HV-Flash 220 either when there is no more open pages for a specific duration (by default), or when the system specifically requests to save the data. The MWO can be a background operation that is controlled by the HVDIMM 200 controller (HV Controller 230).

Thus, to the computer system, the HV-Flash 220 can also be viewed as a very high-speed access storage because data does not need to be moved from a separate storage unit to the main memory, and because data from any specific memory area in the Flash can be accessible via the memory channel upon request from the system to open up a MW. In certain embodiments, the system can make a single request to open a MW with a certan size.

In one embodiment, the HVDIMM 200 is a multi-rank (e.g., 2-rank) DIMM, and the HV Controller 230 controls each rank independently, so that the system can access one rank while the HV Controller 230 performs an MWO. In general, however, it is preferred that the MWO be executed on both ranks in unison for better memory management. Regardless of whether the system executes MWO per rank or on both ranks in unison, the HV Controller 230 can set its internal (per rank) register bits to indicate completion of an MWO. As stated above, the system can also configure the HV Controller 230 to generate an interrupt signal when the MWO is completed instead of or in addition to setting the register bits.

In certain embodiments, the HV Controller 230 also controls the boot-up process for the HVDIMM 200. There are two types of boot; Fresh boot (booting after a clean shut down) and Reboot (booting after a power failure). Unlike the Fresh boot case (where there is no valid data in HVDIMM 200), Reboot requires the HV Controller 230 to populate the HV-DRAM 210 with the same data that was in HV-DRAM 210 at the time of power-loss.

The HVDIMM 200 can have two very different operation frequencies, the HV mode frequency and the LRDIMM mode frequency. The HV mode frequency is used to transfer data between HV-DRAM 210 and HV-Flash 220 while the LRDIMM mode frequency is used to transfer data between HVDIMM 200 and the system. In certain embodiments, the HV-DRAM 210 has two operational modes, a standard operation mode and a MW mode. During the standard operation mode, the HV-DRAM 210 fully supports standard memory operations (e.g., the JEDEC DDR4 LRDIMM operations) including the initialization and training protocols. When the HV-DRAM 210 is in the MW mode, the HV-DRAM 210 operates with its DLL turned off since the MW mode of operation frequency (HV mode frequency) is much slower (e.g., an order of magnitude slower) than the frequency range of the DLL, which covers the standard operation mode frequency. The HV Controller 230 uses the HV mode frequency for MW operations, during which the DRAM and RCD 320 is put into the JEDEC DLL-off operational state.

In certain embodiments, commencement of a MWO is initiated by a request from the System, e.g., a CPU with an integrated MC according to certain embodiments. As the memory channel between the MC and the HVDIMM 200 may not allow sufficient number of address bits to address the entire memory space in the HV-Flash 220, the System may keep a look-up table about which areas of the HV-Flash 220 have been copied in the HV-DRAM 210 for random access. When the System needs to access a certain memory area in the HV-Flash 220, the System would check the lookup table to determine whether data stored in the memory area has been copied to a certain area in the HV-DRAM 210, i.e., a whether a MW is opened in the HV-Flash 220 to allow the System access to the data. If the answer is yes, the MC would proceed to perform memory operations to access the memory area in the DRAM. If the answer is no, the System would send a request to open the MW in the HVDIMM 200. The request would include identification of the memory area in the HV-Flash 220 to be accessed, such as a starting address of the memory area and a size of the memory area, and a destination address in the DRAM, to which data from the memory area is to be transferred. If the System needs more than one MWs, more than one requests can be sent one after another. In certain embodiments, the request is sent directly to the HV Controller 230 in the HVDIMM 200 via the I²C bus or any other system management/control bus. In certain other embodiments, the request is sent to and processed by the DMA controller so that the System can continue to perform other memory operations via the memory channel while the MW is being opened.

Figure 19:
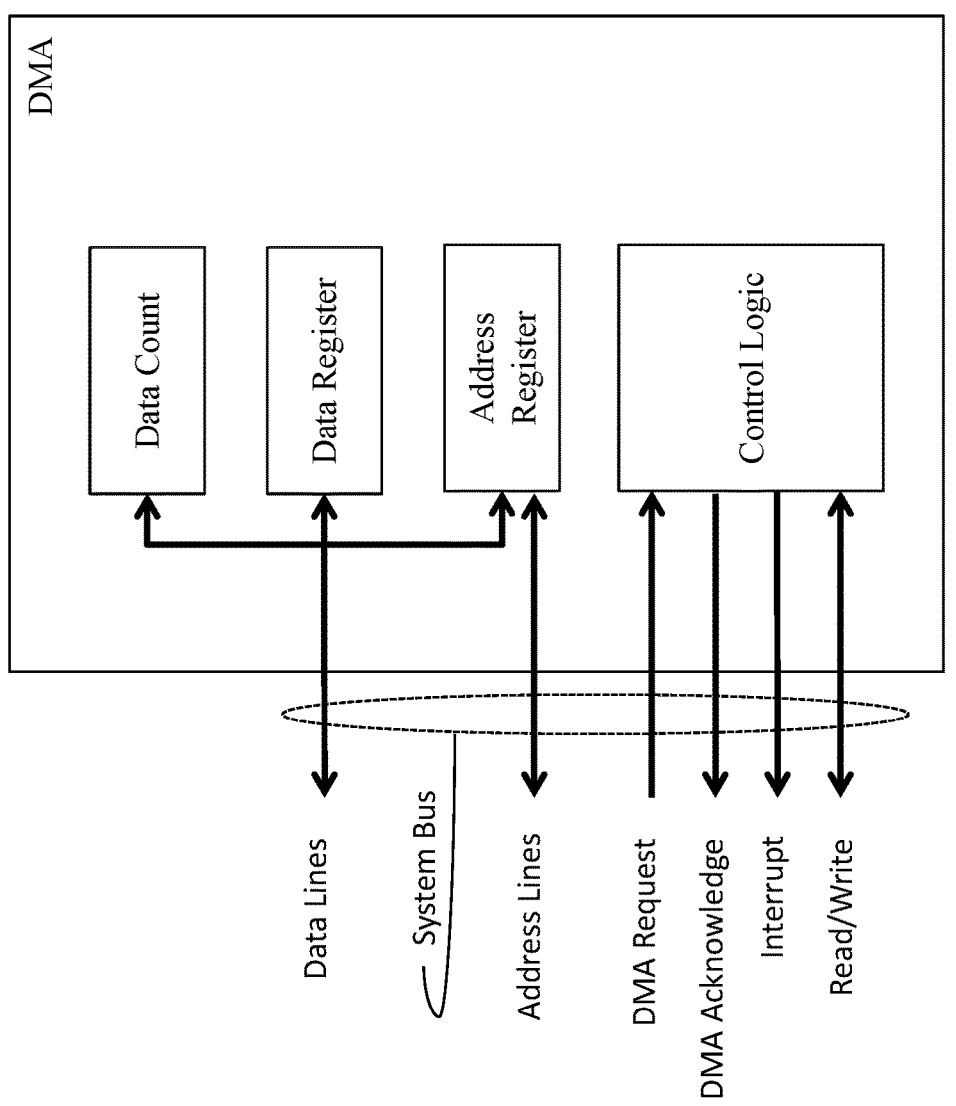
FIG. 19 is a block diagram of an exemplary DMA controller according to certain embodiments.

In certain embodiment, the DMA controller is used to control certain aspects of the MWO processes. FIG. 19 is a block diagram of an exemplary DMA controller. In certain embodiments, the (DMA) controller can be used in conjunction with the CPU/MC to initiate and monitor MWO in the HVDIMM 200. Without DMA, the CPU/MC can be occupied for part of or the entire duration of a MWO, and is thus unavailable to perform other tasks. With the DMA, the CPU can simply initiate a data transfer request to the DMA and then performs other operations while the transfer is in process. When the data transfer is done, the CPU is notified by an interrupt from the DMA controller. Thus, the DMA can offload extensive memory operations from the CPU. Many hardware systems use DMA, including disk drive controllers, graphics cards, network cards and sound cards. DMA is also used for intra-chip data transfer in multi-core processors. Computers that have DMA channels can transfer data to and from devices with much less CPU overhead than computers without DMA channels. Similarly, a processing element inside a multi-core processor can transfer data to and from its local memory without occupying its processor time, allowing computation and data transfer to proceed in parallel.

Figure 20:
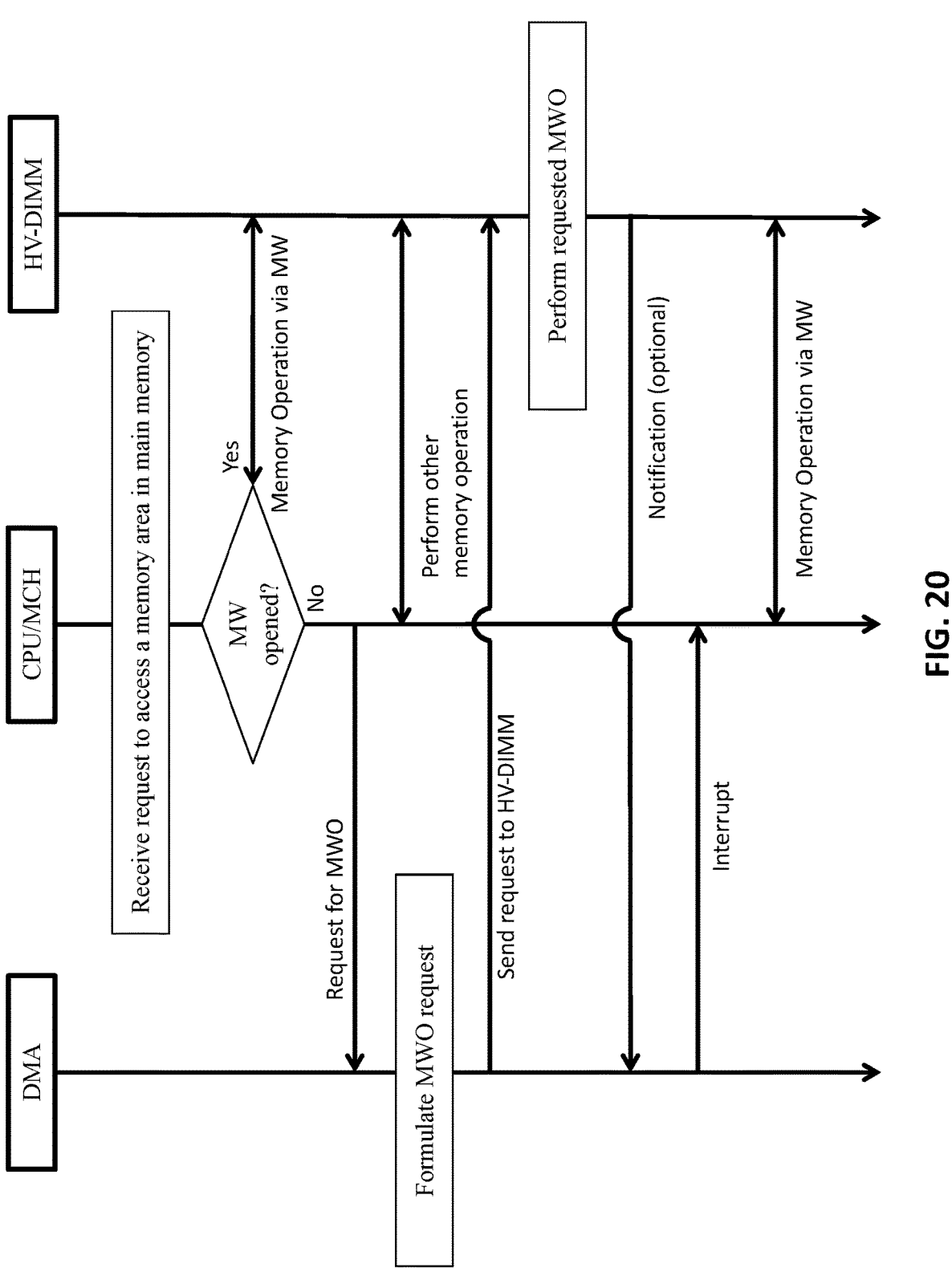
FIG. 20 is a flowchart illustrating memory window operation processes according to certain embodiments.

In certain embodiments, as shown in FIG. 20, the DMA receives a request from the CPU/MC to open a MW (MW) in the HVDIMM 200. The DMA can buffer the request and forward the same or reformulated request to the HV Controller 230 via the I²C bus. The DMA can actively monitor the associated MWO in the HVDIMM 200 and inform the CPU/MC via an interrupt when the MW is opened.

Characteristics associated with Flash memories such as limited endurance and slow writes may require the HVDIMM 200 to obtain support from an operating system (OS) running on the CPU. The OS may also need the knowledge of the movement of pages between the DRAM and Flash so as to know when to hide the weak characteristics of the Flash. At boot up, the OS needs to allocate memory pages in the DRAM. After write to a certain page, the OS may also need to know an estimated time when a next write to the page can be performed. The OS may also need to set page-table entries for the DRAM pages and Flash pages. Some or all of these tasks can be offloaded to the DMA, which include status registers, internal memories and control logic 410 to keep track of these activities.

For example, the DMA can store information regarding how long the HV Controller 230 may need to transfer a certain amount of data from the HV-Flash 220 to the HV-DRAM 210. Thus, the DMA does not need to wait to receive a notification from the HV Controller 230 before telling the CPU/MC that the memory window has been opened for dynamic random access. Alternatively or additionally, the DMA can break a request to open a Memory Window into multiple requests each for a smaller chunk of data of a predetermined size (e.g., 4 KB), as the time required to complete each of such data transfers is more predictable.

Thus, the HVDIMM 200 allows the system to open up a Memory Window in a HV-Flash 220 block for dynamic operation. The system sends the starting address and the data size to HV, and the HV Controller 230 opens the block of memory containing the data and transfers the amount of requested data into the HV-DRAM 210. In certain embodiments, the minimum transfer size per HV-Flash 220 block is 32 KB, and the maximum size is the HV-Flash 220 block size (e.g., 4 MB). Therefore, if the transfer size per HV-Flash 220 block is 32 KB, for 8 GB DRAM, the system can open up to 250K HV-Flash 220 blocks simultaneously.

TABLE 1

| Address type | Description | # of bytes |
| --- | --- | --- |
| HV-FLASH physical address for block | 64K blocks | 2 |
| System (Virtual Physical) Address per block | | 2 |
| HV-FLASH offset addresses with byte size in 32 KB unit for Memory Window per block | Total of 16 × 1 byte offset address | 16 |
| DRAM address (row address) for the HV-FLASH offset address of 32 KB unit | Total of 16 × 2 byte address | 32 |
| 32 GB scratch Flash address for the HV-FLASH offset address of 32 KB unit closed | Total 16 × 3 bytes | 48 |

In certain embodiments, the HV Controller 230 is configured to provide HV-Flash 220 address management and keeps track of physical HV-Flash 220 addresses in relation to virtual-physical addresses known to the system. This can be done by creating and updating an address mapping table, which maps the system (virtual-physical) address to the HV-Flash 220 physical address for tracking the address of any particular Flash block, and to the offset address of each opened (and copied to HV-DRAM 210) memory location within each block. HV Controller 230 uses the offset addresses to correctly place data from HV-DRAM 210 back into proper locations within a particular block of Flash memory. Table 1 lists description and sizes for a few address types according to certain embodiments.

FIG. 21A illustrates certain processes carried out by the HV Controller 230 to open a memory window in the HV-Flash 220 for dynamic random address by the system according to certain embodiments. In certain embodiments, the HV Controller 230 may notify the DMA or CPU/MC that a Memory Window has been opened after data from the memory window has been successfully transferred to the DRAM. In other embodiments, the HV Controller 230 may predict the time when the transfer would be completed based on the request for the Memory Window and historical information, and send the notification to the DMA or CPU/MC before the completion of the transfer so that the data transfer will be completed when the CPU/MC receives the interrupt from the DMA or the notification directly from the HV Controller 230 and gets around to start the memory operation with the memory window.

FIG. 21B illustrates certain processes carried out by the HV Controller 230 to close a memory window according to certain embodiments. The system may request to close a HV-Flash 220 area via the I²C interface or some other system control bus interface. The request may include a starting HV-DRAM 210 address and the size of the Memory Window. In certain embodiments, if the system needs to close one Memory Window but leaves other Memory Windows within a HV-Flash 220 block open, the HV Controller 230 would not close (update) the HV-Flash 220 block until all Memory Windows within the block are closed.

In case of a catastrophic system failure due to, for example, power loss, the HV Controller 230 may also assume the responsibility of moving data from HV-DRAM 210 to HV-Flash 220 and closes the open blocks. If none of updated HV-DRAM 210 data has been stored into HV-Flash 220, the maximum size of data that HV Controller 230 may need to move can be as large as the DRAM size, e.g., 8 GB.

In certain embodiments, to make room for a Memory Window in the HV-DRAM 210, certain DRAM pages may need to be moved to Flash. The HV Controller 230 would execute one or more pre-erased Flash pages and copy the one or more DRAM pages into the Flash. The copying can be completed without slowing or stalling the CPU. Small copies of the DRAM pages can also be staged or held in the DRAM or in a cache-buffer/scratch-pad in the HVDIMM 200 for the OS to the control.

Figure 22:
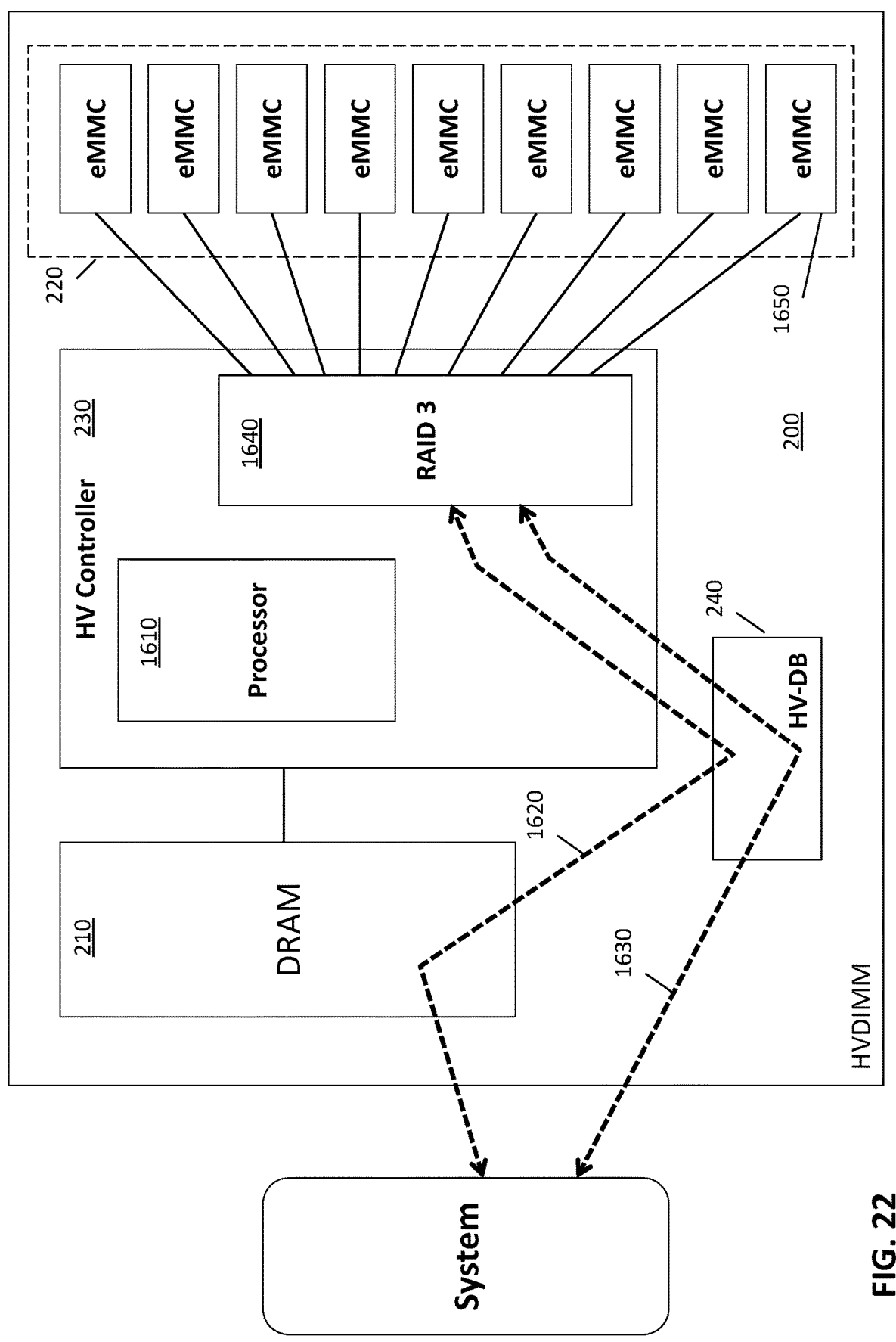
FIG. 22 is a block diagram illustrating the hybrid memory module according to further embodiments.

In certain embodiments, as shown in FIG. 22, the HV Controller 230 includes a built-in processor 1610 and associated hardware (e.g., a dual ARM cortex A9 core configuration integrated as a part of an FPGA SOC), and can act as a co-processor to provide on-DIMM (intra-module) data handling, such as searching, sorting, screening, categorizing, structuring, formatting, etc. Thus, certain tasks traditionally performed by the system CPU can be offloaded to the co-processor so that the overall system performance can be significantly improved. Examples of such tasks include, but are not limited to, in-memory compression/decompression (e.g., source of data in one segment of DRAM and processed data in another segment of DRAM), in-memory encryption/decryption; security authentication, etc. Since the co-processor has direct access to the DRAM main memory or the Flash storage without system CPU's involvement, the co-processor can compress, encrypt, and authenticate data in on-DIMM memories without system-wide overhead.

In certain embodiment, software or firmware packages with Application Programming Interfaces (API) exposed to the system software are provided to support on-DIMM computing/processing. The software or firmware packages are run by the co-processor and may include, for example, software development kits (SDK), such as data compression SDK, data encryption SDK, data authentication SDK, etc. The firmware packages can be stored on the HVDIMM 200 or they can be downloaded from the system. The software or firmware packages can be configured to support different features and the configurations (e.g., license bits, bits indicating enabled functions) can be stored in a one-time programmable device (OTP) on the HVDIMM 200. For example, the HV Controller 230 can compress or decompress a certain block or section of data stored in the main memory or the storage on the HVDIMM 200 using a type of compression algorithm specified by corresponding configuration bits stored in the OTP.

As a further example, when the CPU is running a search process involving a large amount of data stored in the on-DIMM storage, the HV Controller 230 can pre-screen the data to reduce the data size to be handled by the CPU as the data is being transferred from the on-DIMM storage to the main memory. The HV Controller 230 can also sort the data to reduce the data categorization and collection time. The HV Controller 230 can also search the data to support fast querying of meta data information. In a further example, the data from the storage can be presearched so that only entries that are considered relevant to the search criteria are required to go through ECC and be loaded into main memory.

In further embodiments, the HV Controller 230 uses the HV-NIC (which can be, for example, an Ethernet interface controller) to provide direct data transfer between a network and on-DIMM memory, and data extraction/correction using the on-DIMM coprocessor, so that data can be loaded directly from the network, to the storage, the main memory, or both simultaneously, or vice versa, without going through the system CPU. Thus, the HVDIMM 200 supports efficient data sharing in a cluster environment.

For example, multiple HVDIMM 200s can be used in a Hardoop processing framework, which is an open-source software framework for storage and large scale processing of data sets on clusters of CPUs each representing a DataNode in a distributed computing environment. Each DataNode can include a number of HVDIMM 200s, which together can contain, for example, 192 GB of main memory and 3-6 TB of memory channel storage. Very fast memory channel storage through put rate (e.g., 39 GB per each 2 CPU server) can be achieved because of parallel data transfer between the Flash and the DRAM on multiple HVDIMM 200s. Furthermore, the storage on the HVDIMM 200 can be accessed with very low latency (comparable to the latency for accessing the DRAMs) because the storage is accessed through the memory channel. Since data is moved between HV-DRAM 210 and HV-Flash 220 without having to go through a storage channel or PCI interface, very large blocks of data (e.g., up to 1 GB) can be accessed in read dominated operations.

In certain embodiments, as shown in FIG. 22, the HVDIMM 200 provides a high bandwidth dedicated data path 1620 between the main memory and the storage on the HVDIMM 200 to support on-DIMM data processing, and fast 'page swap' and 'demand page' operations. In further embodiment, the on-DIMM data buffer (HV-DB 240) can be a very large data buffer such as terabit memory (TBM) to serve as temporary storage for the on-DIMM processing. In certain embodiments, as shown in FIG. 16. the HVDIMM 200 also provides another data path 1630 to allow data transfer between the system and the HV-Flash 220 via the HV Controller 230 and the HV-DB 240 without going through the HV-DRAM 210.

In further embodiments, As shown in FIG. 22, in certain embodiments, the Flash storage on the HVDIMM 200 includes a number of (e.g., 9) standard embedded multimedia card (eMMC) packages each having an embedded multi-media interface, a Flash controller and Flash memory. The HV Controller 230 also includes built-in redundant array of independent disks (e.g., RAID 3) circuit 1640 that provides dynamic hardware-based error-correction, full data recovery and data reconstruction, resulting in increased Flash life time. The RAID 3 feature also minimized requirement for data duplication.

The eMMCs generally support error correction in hardware. Issues can arise, however, when one of the eMMCs cannot correct certain errors in data from the Flash memory in its package during a read operation. In certain server systems, storage networks are built with redundancies (e.g., RAID) to enable further correction of errors at the storage system level. Before eMMCs were used to form the Flash storage, such redundancies were helpful as the Flash storage would output uncorrected data with error indication. An eMMC, however, does not produce output data if it cannot correct the errors in the data. Thus, the missing bit from an eMMC can cause system failure and/or unrecoverable data error.

To address this problem, the HVDIMM 200 according to certain embodiments includes at least one parity eMMC 1650 (e.g., the 9th eMMC in FIG. 22) that is used to store parity bits associated with the data stored in the rest of the eMMCs ("data eMMCs," e.g., the 1st to the 8th eMMCs in FIG. 22). The HVDIMM 200 further includes an error correction (e.g., RAID 3) circuit in, for example, the HV Controller 230. In certain embodiments, the RAID 3 circuit is included in the data paths between the storage and the system, which may also includes the TBM and/or the main memory, as shown in FIG. 22.

In certain embodiment, as shown in FIG. 23A, when write data is to be written to the storage, the RAID 3 circuit receives each set (e.g., 8 bytes) of write data from, for example, the TBM, and generates a parity byte for each set of data bytes. The RAID 3 circuit then outputs the data bytes together with its associated parity byte for storing in respective eMMC circuits. During a read operation, as shown in FIG. 23B, the HV Controller 230 outputs control and address signals to instruct the eMMCs to output read data. The RAID 3 circuit would receive sets of data bytes from the data eMMCs and parity bytes from the parity eMMC. For each set of data bytes received in parallel, the RAID 3 circuit would determine if the set of data bytes is missing a byte from one of the data eMMCs. If no data byte is missing, the RAID 3 circuit would move the set of data bytes along its intended path. If a data byte is missing from one of the data eMMCs, the RAID 3 circuit would reconstruct the missing data byte from the set of data bytes and the parity byte received in parallel with the set of data bytes and generate a reconstructed set of data bytes, which are placed in the TBM for forwarding to the main memory or the system, or stored in a buffer memory in the HV Controller 230 for further processing by the on-DIMM processor.

The HV-DB 240 is used to temporarily store data so as to make data transfers in the HV-DB 240 faster and more efficient. Since normally data may be transferred in and out of Flash memory at a slower speed than data is transferred to and from the system, the HV-DB 240 is used to buffer data to/from the Flash memory so the system does not have to slow down and wait for data to be written to or read from the storage subsystem. When the system writes data to the storage subsystem, the data is buffered into the HV-DB 240 at DRAM data I/O speed, which is much faster than Flash data I/O speed. The buffered data is written into the Flash memory on, for example, first in, first out basis. The same is true for the read direction. Thus, while reading from the storage subsystem, the CPU can engage in other processes with the main memory until the HV-DB 240 buffer has buffered a predetermined amount of data for transferring to the main memory or the system at the DRAM speed. On the other hand, when data is transferred from the main memory to the storage, the data is read from the DRAM according to a set of control/address (C/A) signals from the system or the HV Controller 230 and written into the HV-DB 240 according to another set of C/A signals from the HV Controller 230. While the DRAM can be engaged with the system on other tasks, the HV Controller 230 can transfer the data from the HV-DB 240 to the storage by reading the data from the HV-DB 240 and writing the data to the storage.

The components in the HVDIMM 200, e.g., the HV Controller 230, the main memory subsystem (or volatile memory subsystem), the HV-DB 240, the storage subsystem (or non-volatile memory subsystem), can be mounted on a same printed circuit board or disposed in close proximity to each other to allow fast and smooth data transfer therebetween.

Figure 24:
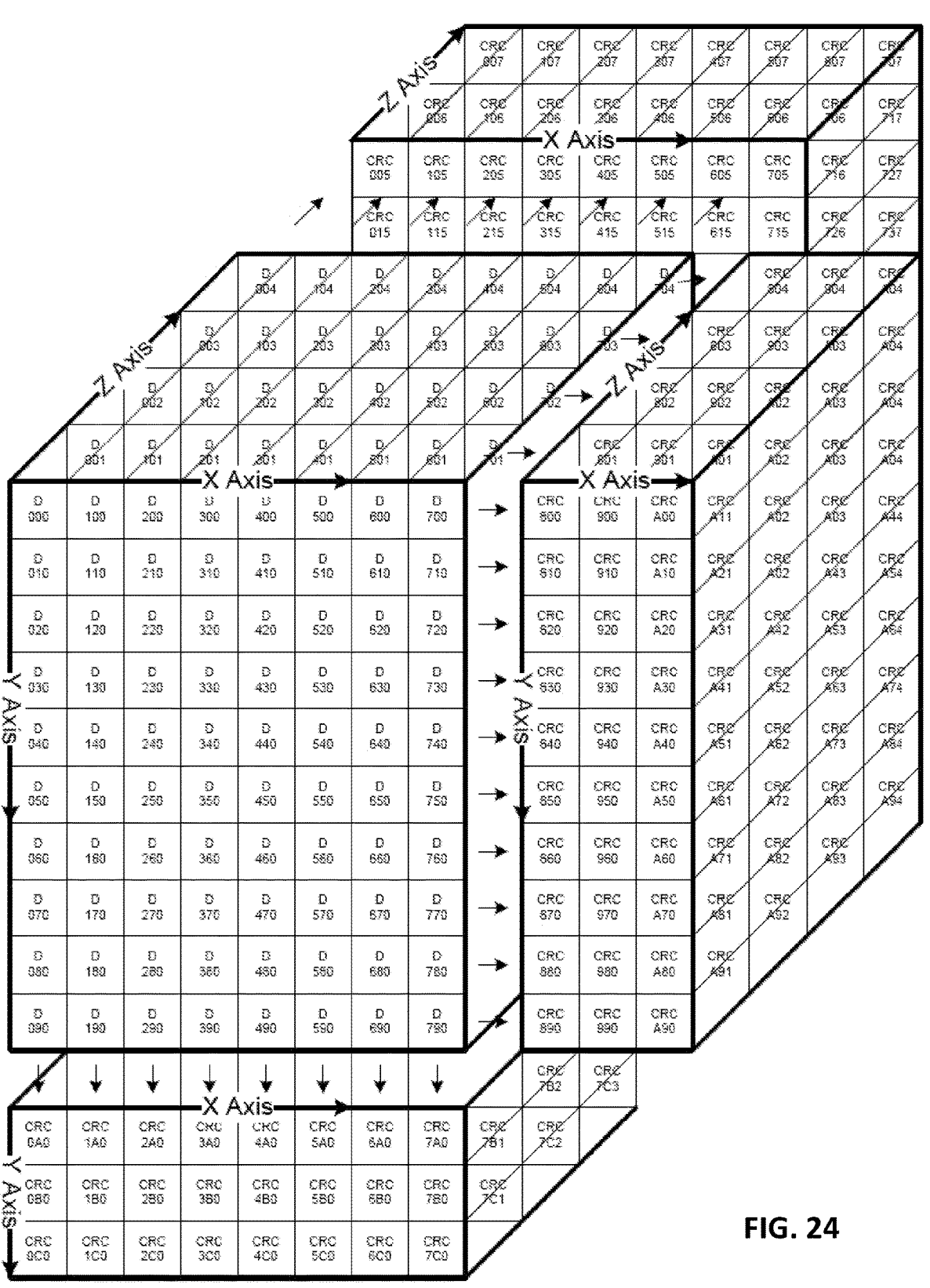
FIGS. 24-26 are block diagrams illustrating error detection/correction routines conducted by the module controller according to certain embodiments.

NAND Flash can be prone to low-reliability issues due to random errors generated by physical effects in the geometry of the NAND gates. Thus, in certain embodiments, to improve data integrity, the HV Controller 230 is configured to carry out a set of error detection/correction routines to detect and correct errors in the data stored in the HV-Flash 220. For example, every time when data is transferred from the HV-DRAM 210 to the HV-Flash 220, the HV Controller 230 would perform error correction coding on the data. In certain embodiments, as shown in FIG. 24, the data bits are grouped and each group of data bits are arranged in a three-dimensional matrix. Cyclic Redundancy Check (CRC) codes can be computed using predetermine algorithm along each of the X, Y and Z axis for the three dimensions of the matrix. The CRC codes are then stored together with the data into the HV-Flash 220. In certain embodiments, the HV Controller 230 includes on-chip memory spaces (e.g., 1k-2k of SRAM) and/or shift registers to store a copy of the data for the CRC calculation while the data is being transferred from the DRAM to the Flash.

Figure 25:
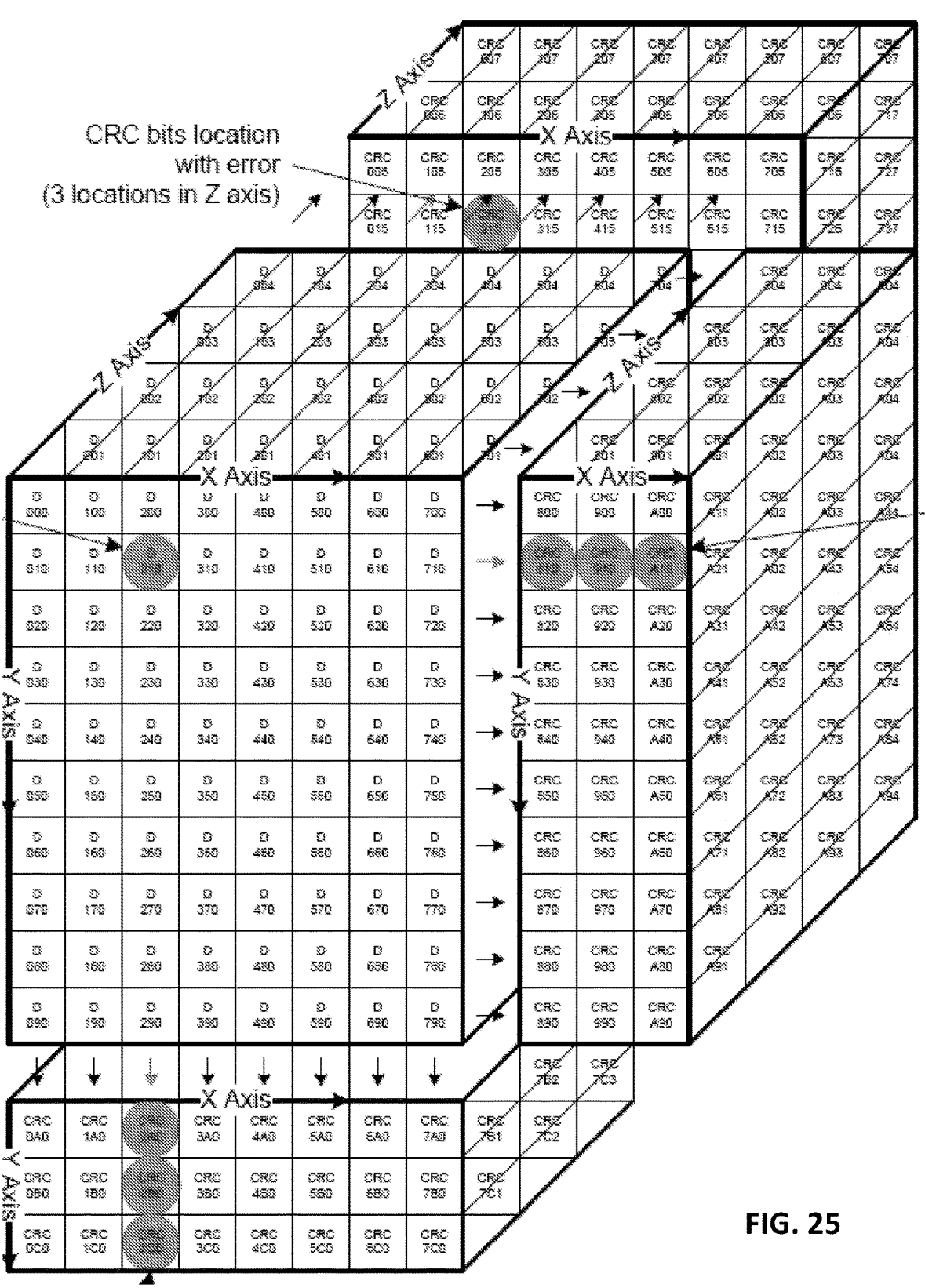
Figure 26:
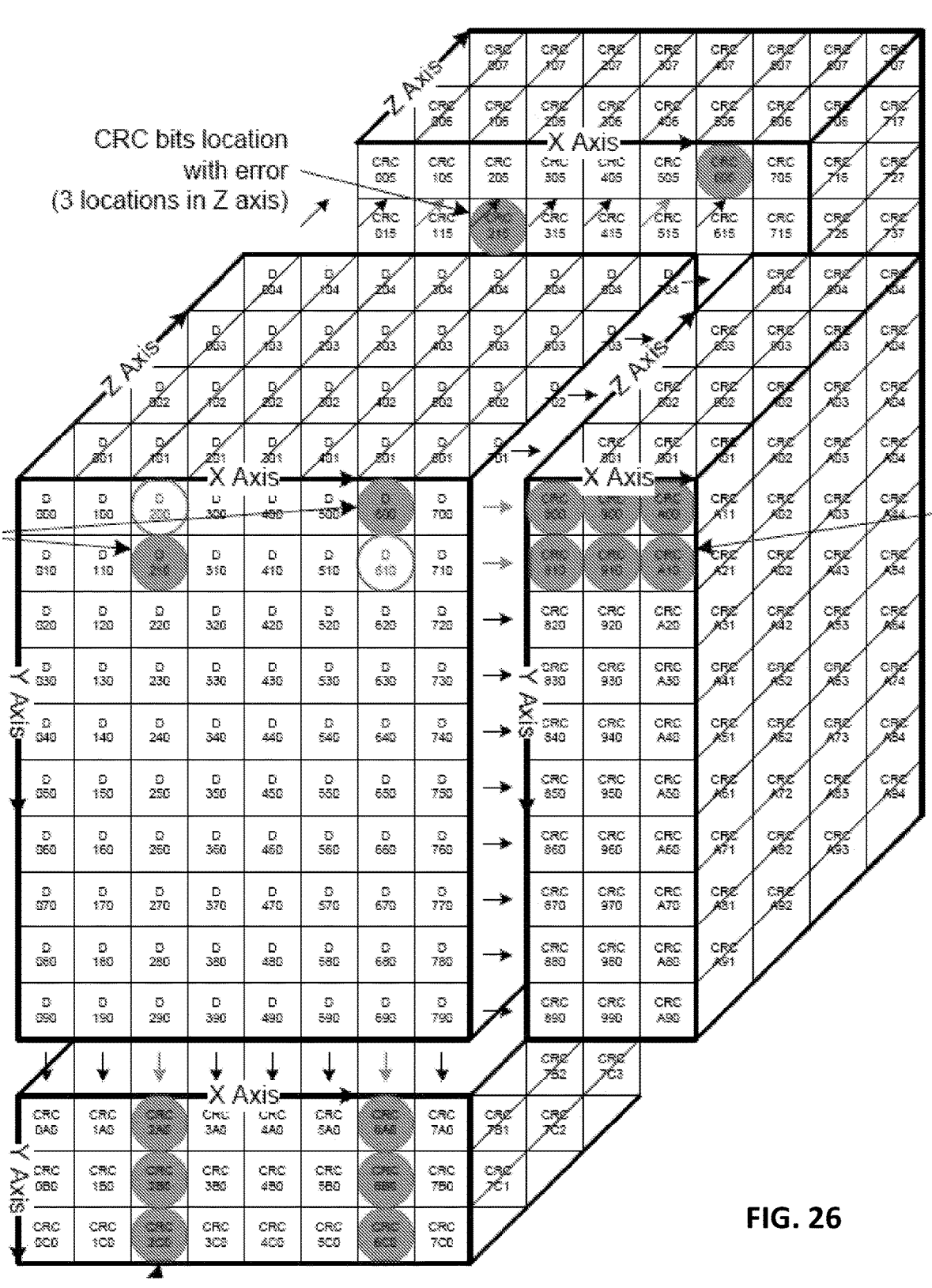

When the data is transferred from HV-Flash 220 to HV-DRAM 210, the HV Controller 230 would have each group of data arranged again into the same matrix format, and CRC codes are computed again using the same predetermined algorithm along each of the axis as shown in FIG. 24. The newly computed CRC codes are compared with the corresponding CRC codes received with the data. If there were no error in the data, the newly computed CRC codes would match the corresponding CRC codes received with the data. If the received data contain one or more errors as shown in FIGS. 25 and 26, there would be mismatch between the newly computed CRC codes and the received CRC codes. With the data arranged in the matrix format, such mismatch in the CRC codes can be used to identify the location of an erroneous data bit, and correction can be made by simply flipping the erroneous data bit at the identified location.

FIG. 25 illustrates an exemplary situation where one of the bits in a X-Y plane of the data matrix (e.g., bit D210) is erroneous. This can be detected with CRC check in just the X and Y directions to pinpoint the bit location with the error. As shown in FIG. 25, bit D210 is part of a row of bits D010, D110, D210, . . . and D710 along the X direction, and also part of a column of bits D200, D210, D220, . . . , D290 along the Y direction. So, if both the newly calculated CRC code for the row of bits (CRC810, CRC910, and CRCA10) and the newly calculated CRC code for the column of bits (CRC2A0, CRC2B0, and CRC2C0) do not match the corresponding CRC codes received with the data, while all other newly calculated CRC codes in the same X-Y plane match the corresponding CRC codes received with the data, the location of the error would be at the intersection of the row of bits and the column of bits, i.e., D210, as shown in FIG. 25.

FIG. 26 illustrates an exemplary situation where two of the data bits in a same X-Y plane in the data matrix (e.g., bit D210 and bit D600) are erroneous. To properly pinpoint the locations of the bit errors, CRC check needs to be conducted in X, Y and Z directions. As shown in FIG. 26, CRC check conducted in just the X and Y directions in this situation would indicate four possible locations of bit error (e.g., D200, D210, D600 and D610). Additional CRC check in the Z direction is thus use to pinpoint the exact locations of bit error (e.g., D210 and D600).

In certain embodiments, the HV Controller 230 performs CRC checks on copies of the data which are being transferred from the HV-Flash 220 to the HV-DRAM 210. Therefore, by the time HV Controller 230 detects a bit error, the erroneous data bit may have already been written into the DRAM. To correct the bit error, the HV Controller 230 can perform a read-modify-write operation to read a segment of data containing the erroneous bit from the DRAM, modify the erroneous bit, and then write the data segment back into the DRAM.

As stated above, Flash memory has a finite number of program-erase cycles, and frequent erase/write operations can cause Flash memory cells to wear out, causing reliability issues. To prolong the life of HV-Flash 220, the HVDIMM 200 includes a scratch Flash in additional to the main Flash (as shown in FIG. 18) and the HV Controller 230 is configured to execute an error detection/correction process when data is moved back and forth between the HV-DRAM 210 and HV-Flash 220. By using the error detection/correction process, which is discussed below, the HVDIMM 200 can support random updates to Flash without reducing the Flash life by avoiding program/erase (P/E) operations to the main Flash as much as possible.

In certain embodiments, the scratch Flash is employed to hold updated (modified) data when a Flash block is filled. The modified data in the scratch Flash can be incorporated into the Flash block when the system is ready to close the block. For example, if a particular task/application requires 100 updates to each of 100 Flash pages in Flash block, 10,000 updates would be needed. If there is 25 initially unfilled page areas in a block, this task/application requires 400 P/E operations, which amounts to 3.2 GB of data being rewritten. However, if the modified data is stored in the scratch Flash, then the block only needs 1 P/E operation. As for the scratch Flash area, only 10,000 pages will be written, which amounts to only 80 MB of data being rewritten.

In certain embodiments, the scratch Flash, unlike storage or main Flash, does not have to follow the block concept, although it follows standard Flash operations. Thus, each page update is written into the next open (unwritten) page space. A written page is marked as 'stale' when either the page is updated again and the updated page is written into a new location, or the page is copied into the storage Flash by the system closing a block in the storage Flash. When all pages in a physical block in the scratch Flash are marked as 'stale', the block is erased and then marked as open (or available). In certain embodiments, for a block that contains mostly 'stale' pages, the pages that are not marked 'stale' are copied into a new location so that the block can be erased.

Figure 27:
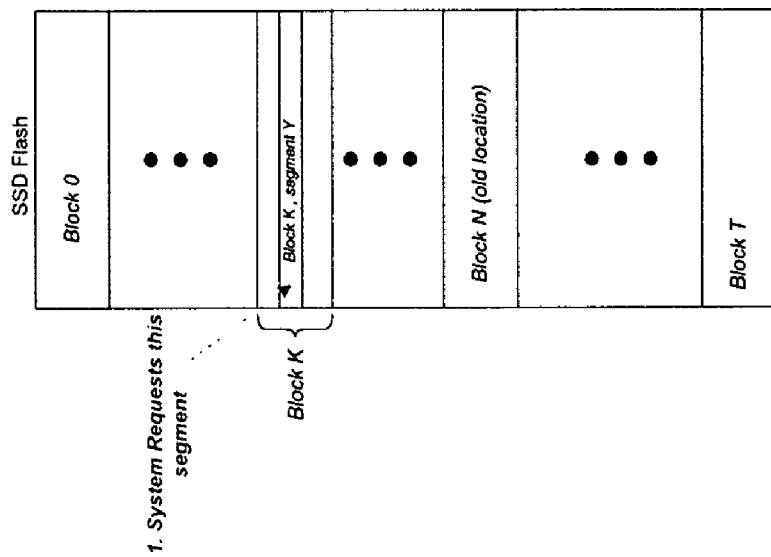
FIGS. 27-28 illustrate a conventional SSD or Flash operation.
Figure 28:
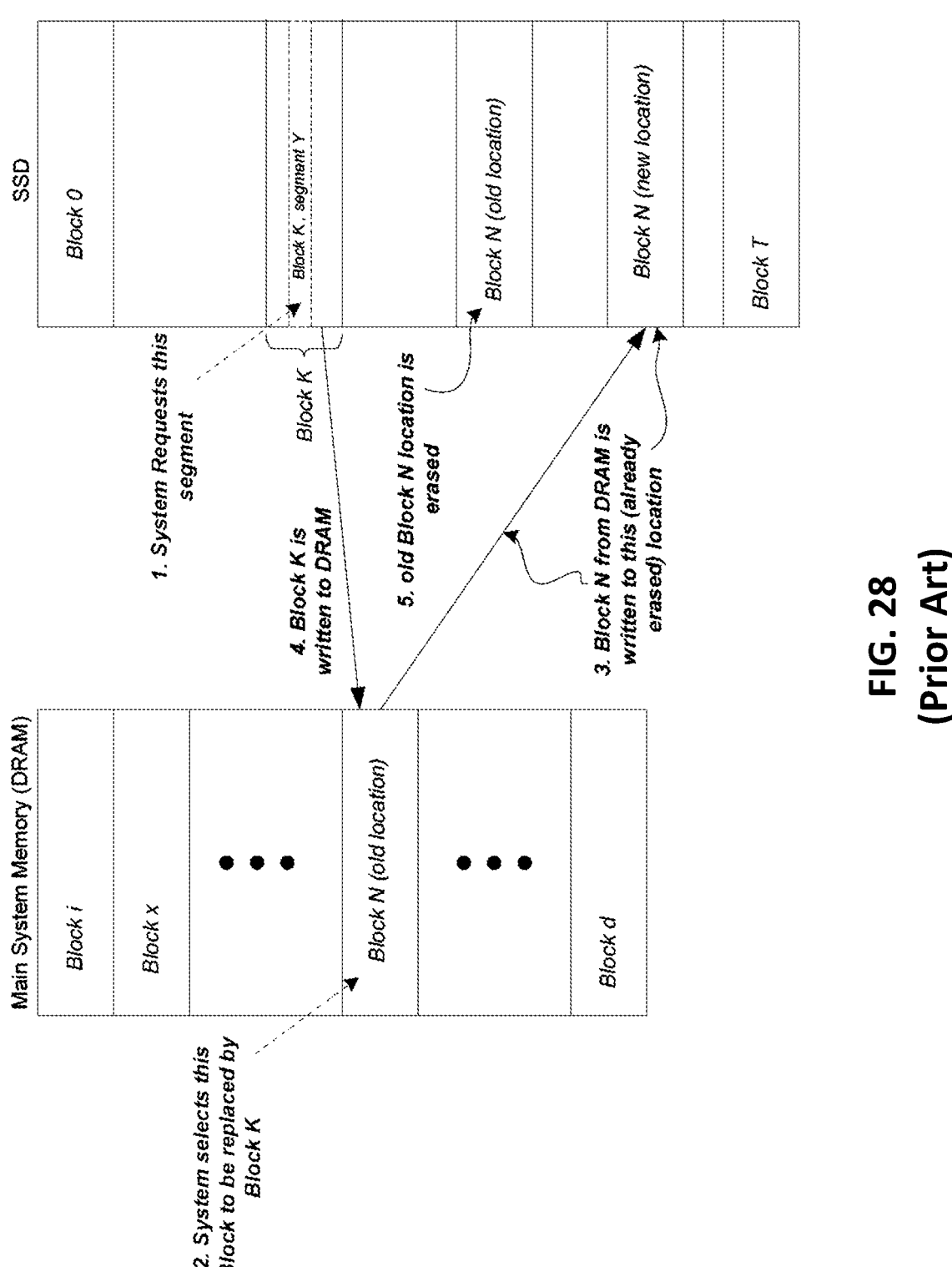

FIGS. 27-28 illustrate a conventional SSD or Flash operation where, according to industry standard replacement algorithm, when a system requests to open a segment in a Flash block (Block K), the system must select a block (Block N) in the main memory (DRAM) to be replaced by the Flash block. A new block in the Flash is opened to accommodate the data in Block N before Block N is replaced by the data in Block K. Another block in the Flash where block N was originally taken from is thereafter erased.

Figure 29:
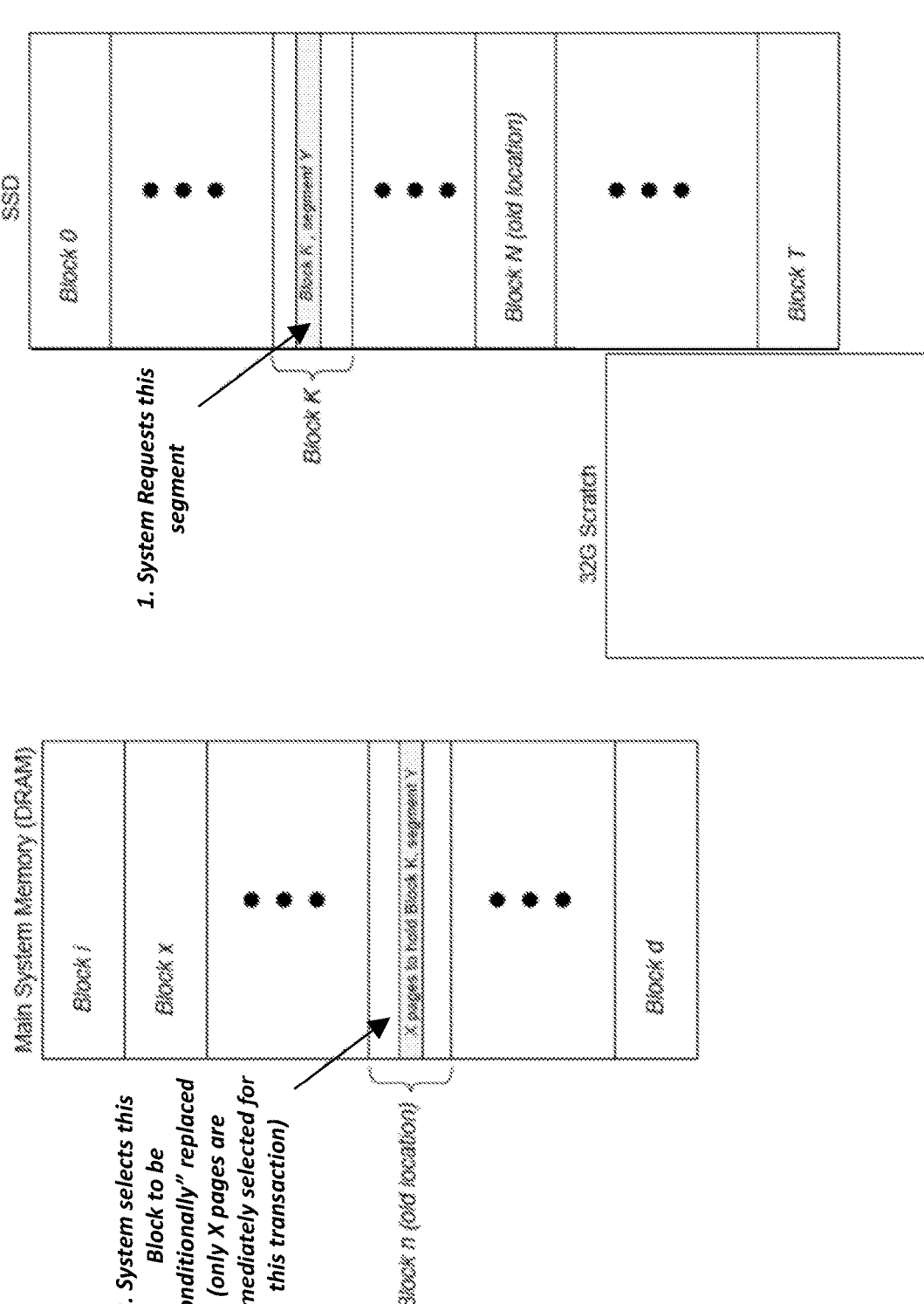
FIGS. 29-32 illustrate operations involving scratch flash in the hybrid memory module according to certain embodiments.
Figure 30:
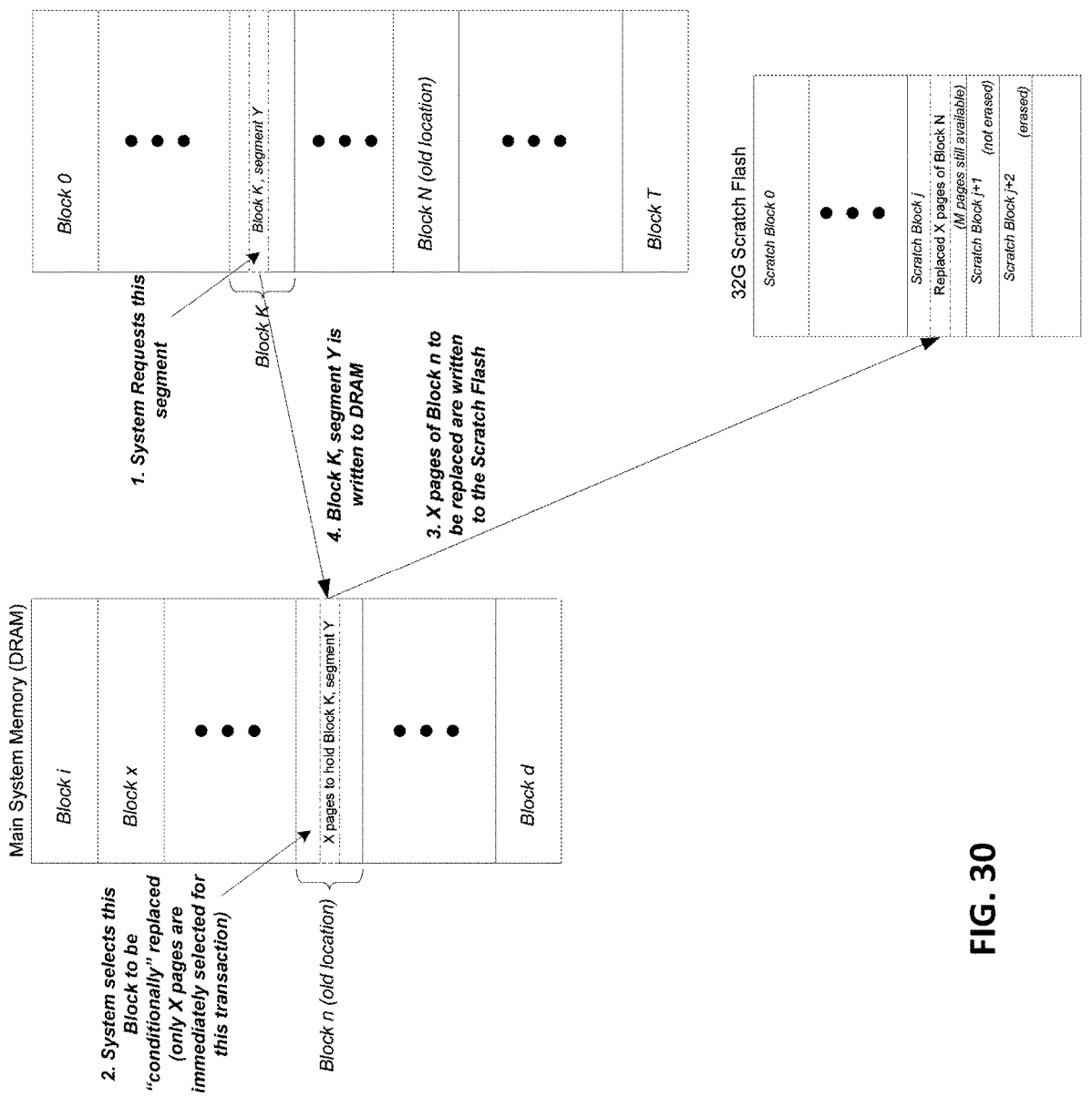

FIGS. 29-30 illustrate an operation in the HVDIMM 200 according to certain embodiments. Here, in response to a system request to open a new segment in the main Flash, and a block is selected in the HV-DRAM 210, but only the pages in the DRAM block that are required for the selected segment (e.g., X pages for segment Y) are subject to replacement. The X pages are written to the scratch Flash before data from segment Y is written into the space held by the X pages in the DRAM. Thus, data is moved between HV-DRAM 210 and HV-Flash 220 page by page and no new blocks in the non-volatile memory are required to be written or erased when the new segment is opened for dynamic random access.

Figure 31:
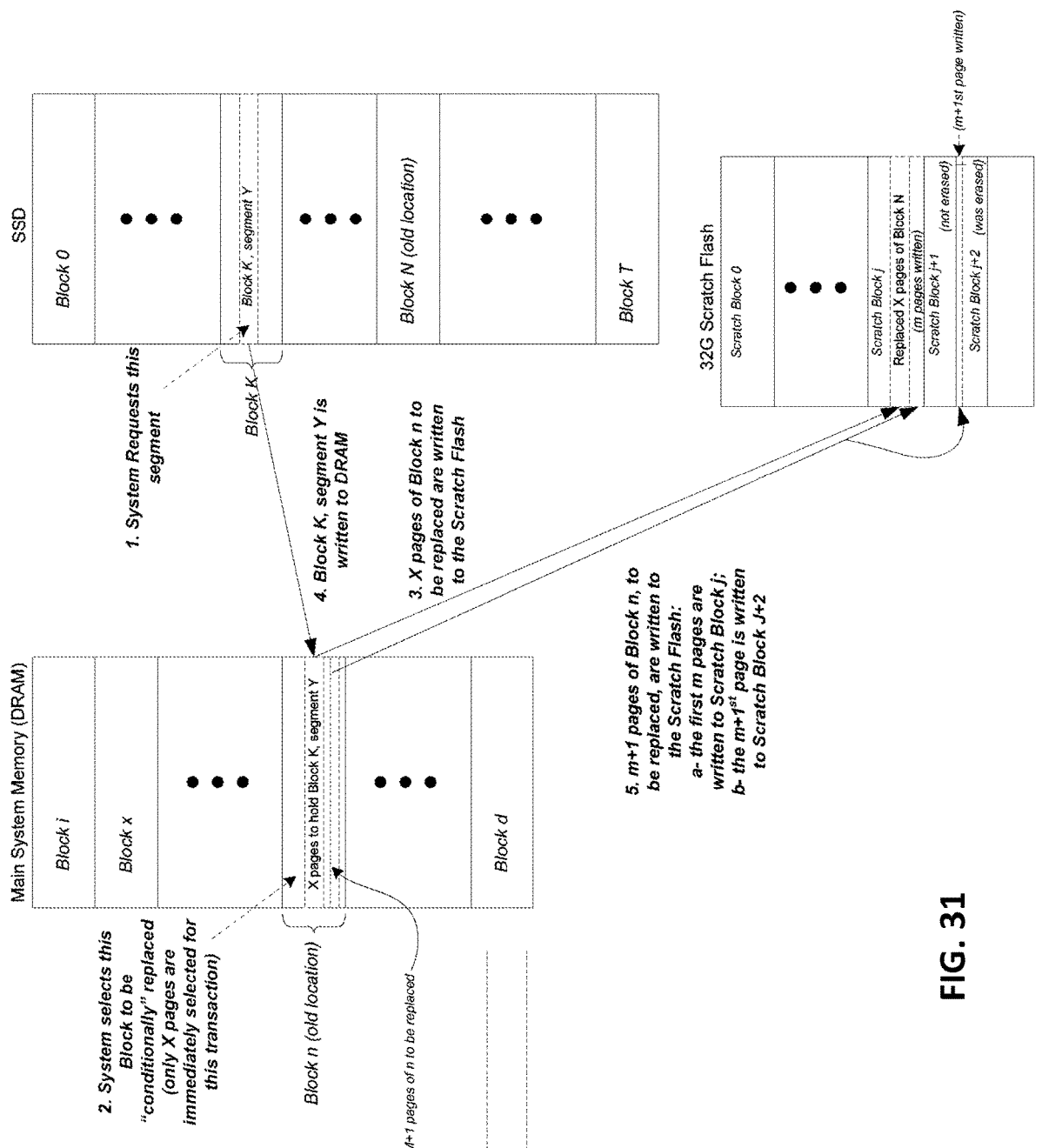

At some point, a current scratch Flash block may be filled up as data is moved from the Flash to the DRAM page by page. For example, as shown in FIG. 31, if a memory window operation requires M+1 pages to be replaced in DRAM and the current scratch block j only has M pages left unfilled, the first M pages of the M+1 pages can be written into Block j, while the M+1$^{st}$ page is written into Block j+1 in the scratch Flash.

Figure 32:
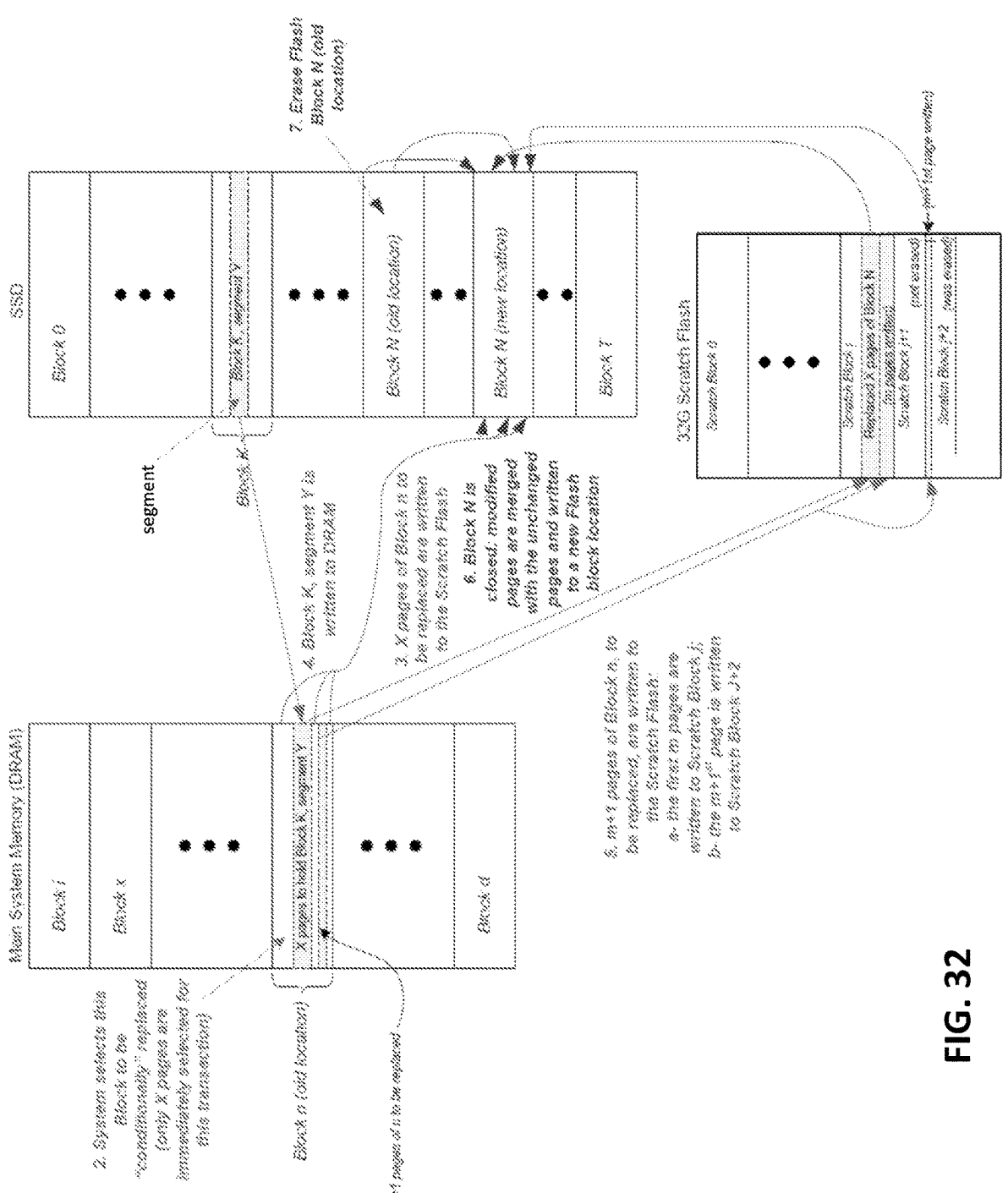

The HV Controller 230 is configured to keep track of data movements among the main Flash, the DRAM, and the scratch Flash. When the system requests to close a block in the DRAM, a new block in the Flash is opened to accommodate the data in the to-be-closed block in DRAM. Since some of the data in the to-be-close block may have been put in the scratch Flash, the HV Controller 230 is further configured to merge data in the to-be-closed block from the DRAM with the data taken from the to-be-closed block and stored in the scratch Flash, as illustrated in FIG. 32. The merged data is stored in the new block in the Flash and an old block in the Flash where the to-be-erased block in the DRAM was taken from is thus erased.

In addition to using the scratch Flash to prolong the life of the main Flash, the HV Controller 230 is also configured to perform wear leveling by equalizing average usage time of each block in the HV-Flash 220. In certain embodiments, such wear leveling can be done by a round robin method. The HV Controller 230 uses its address mapping management capabilities and relatively large memory space to keep track of the associated address changes.

Figure 33:
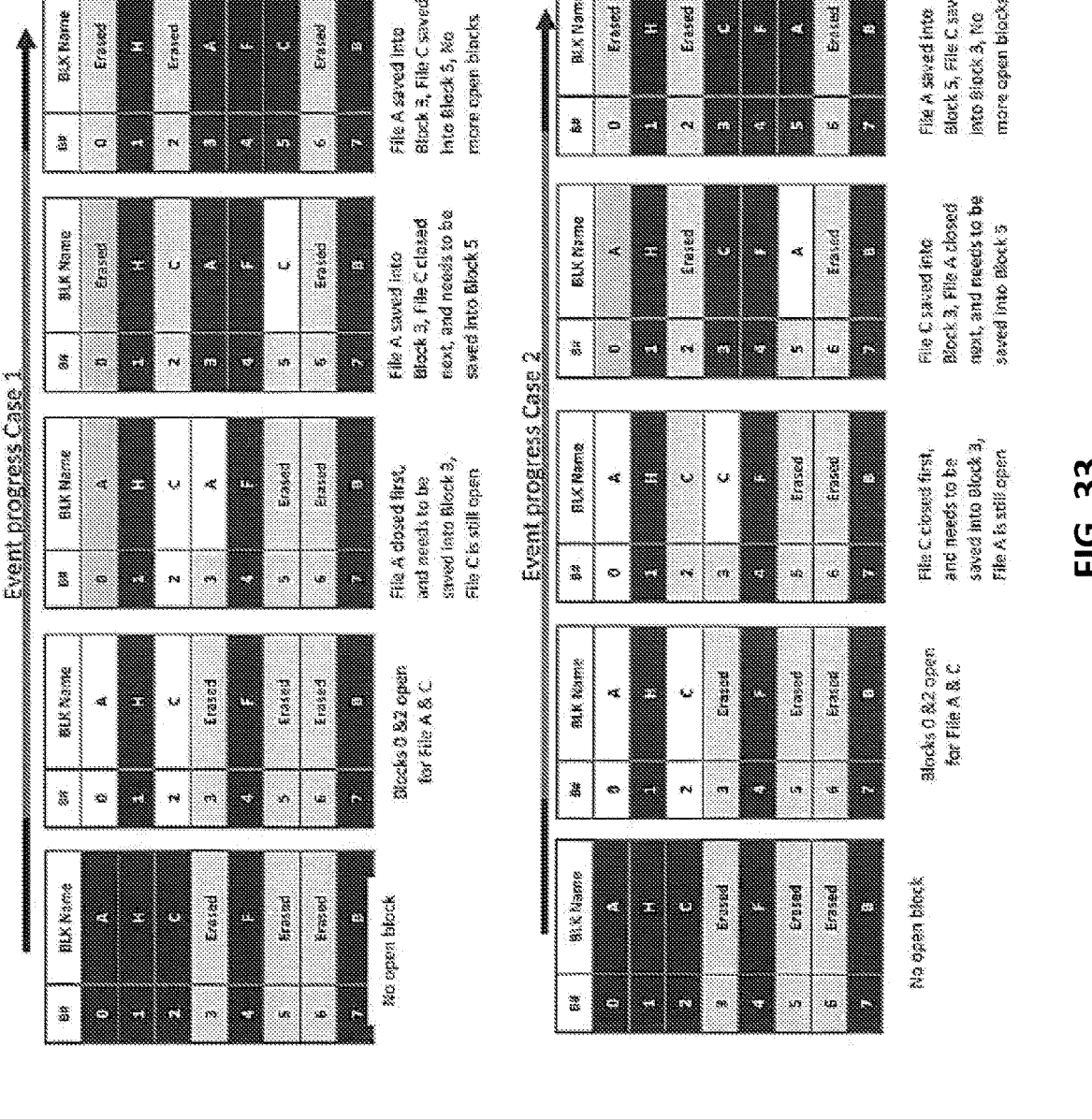
FIG. 33 illustrates a simplified example of a round-robin wear leveling technique according to certain embodiments.

FIG. 33 illustrates a simplified example of a HVDIMM 200 round-robin wear leveling technique, according to certain embodiments. As shown in FIG. 33, both Event Progress Cases 1 and 2 have Blocks 0 and 2 opened for Memory Window operations. In Event Progress Case 1, File A is closed first while in Event Progress Case 2, File C is closed first. Thus, for Case 1, File A is written into the first empty (erased) block (B #3). For Case 2, File C is written into block B #3.

Instead of or in addition to being used as main memory, the HVDIMM 200 can also be used as a storage device to facilitate direct data transfers within an intranet network.

Recent developments in cloud networking and computing require efficient ways to transfer and store data. Since the cloud environment supports many different types of applications that share computational power as well as database, any particular server or storage bottleneck can impact the overall performance of the cloud network.

There are two types of data transfers, intranet and internet. An intranet provides a closed network within an organization, which shares computing resources and information, while internet networks are between intranets or between organizations.

Internet (between organizations) data transfers are generally less concerned about data transfer latency. On the other hand, intranet data transfers require prompt responses and is less tolerant of data transfer latency. This is especially true when a task is farmed out to multiple servers for parallel computation using shared operating system, program, and database. In such cases, data coherency is required among these servers for correctly executing the task. Therefore, any data transfer latency in one server can slow down the task execution.

There are also two types of data transfers in an intranet: data transfers within each individual server and data transfers amongst various servers. The data transfers amongst various servers use internet protocol technology to share information, operational systems, or computing resources. The data transfers within a server is generally handled by the CPU, and occur amongst memory devices and network connections via the CPU.

Currently, transferring data between intranet servers requires a transmitting server CPU to gather the data from either a storage or from the main memory, packetize the data, and put it onto the network. The receiving server CPU needs to extract the data and to store it in a storage or the main memory. Transferring data within a server requires the CPU to read data from one memory coupled to the CPU and write the data into another memory device also coupled to the CPU.

For example, when a process running on the CPU attempts to allocate more memory than the system has available, the OS would swap memory pages to and from the storage. If a page is selected for replacement and "Page Out" is referenced again, it has to be paged in (read in from storage). This would involve waiting for I/O completion and the total responding time is the sum of:

(Page Out Time)+(Page In Time)

where (Page Out Time)=(Memory Time)+(CPU Time)+
    (Bus Time)+(Storage Time)

and (Page In Time)=(Storage Time)+(Bus Time)+(CPU
    Time)+(Memory Time).

In both cases, data transfer latency can be reduced if the data does not need to go through the CPU. In other words, if direct data transfer occurs from a memory device to the network, then the data transfer latency amongst servers will be minimized. Data transfer latency within a server can also be reduced if the data is transferred directly between memory devices without going through the CPU.

In the intranet network, if a process running on the CPU attempts to allocate more memory than the system has available, the OS would swap memory pages to and from the IO Storage. If the page is selected for replacement and "Page Out" is referenced again, it has to be paged in. This would involve waiting for I/O completion, but the total responding time is now the sum of:

(Page Out Time)+(Page In Time)

where (Page Out Time)=(Memory Time)+(HV Time)+(Stor-
    age Time)

and (Page In Time)=(Storage Time)+(HV Time)+
    (Memory Time)

Thus, the total responding time is significantly shortened.

Figure 34:
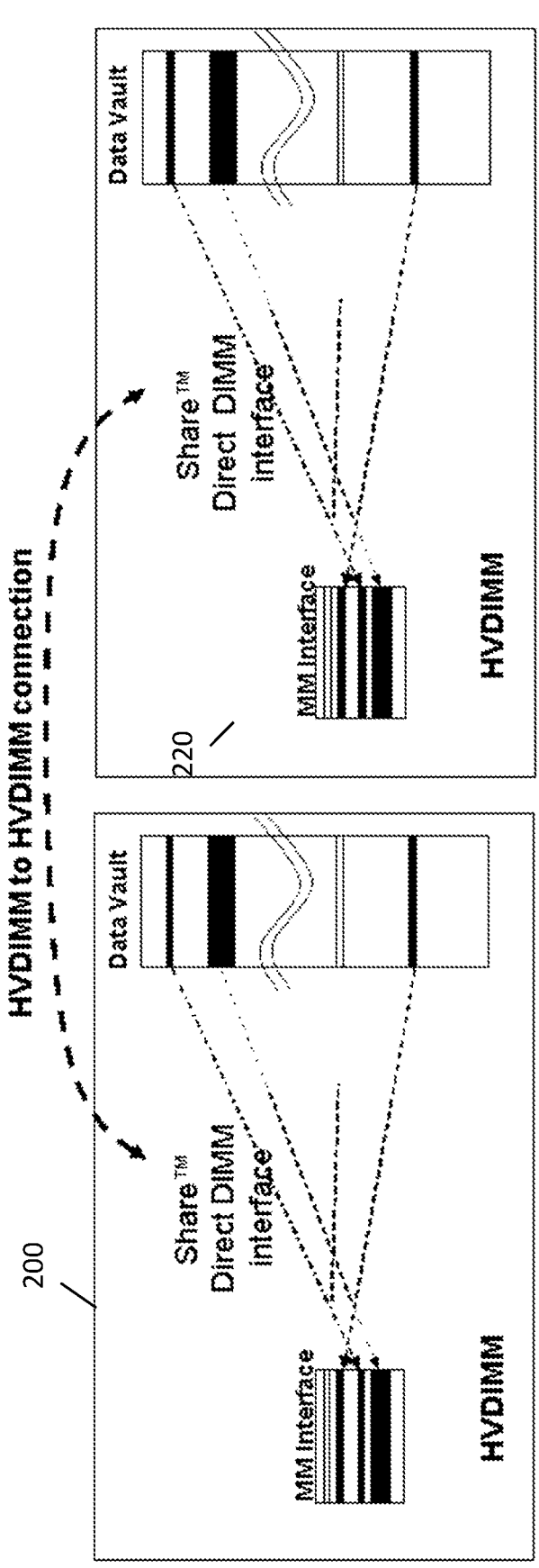
FIG. 34 illustrates a hybrid memory module coupled directly to another hybrid memory module or any other storage devices via their respective network interface circuits.

In certain embodiments, the HV Controller 230 is configured to facilitate data transfers between different HVDIMMs 200 by providing a network interface ("Share™ Direct DIMM Interface") via the HV-NIC. For example, as shown in FIG. 34, an HVDIMM 200 (on the left) can be coupled directly to another HVDIMM 200 (on the right) or any other storage devices via their respective NIC devices, and the HV Controller 230 in either HVDIMM 200 is configured to transfer data between the DRAM on one HVDIMM 200 and the Flash in the other HVDIMM 200, between the DRAM on one HVDIMM 200 and the DRAM on the other HVDIMM 200, between the Flash on one DIMM and the Flash on the other DIMM, and also between the HVDIMM 200 and any other storage devices, using similar techniques as discussed above.

Figure 35:
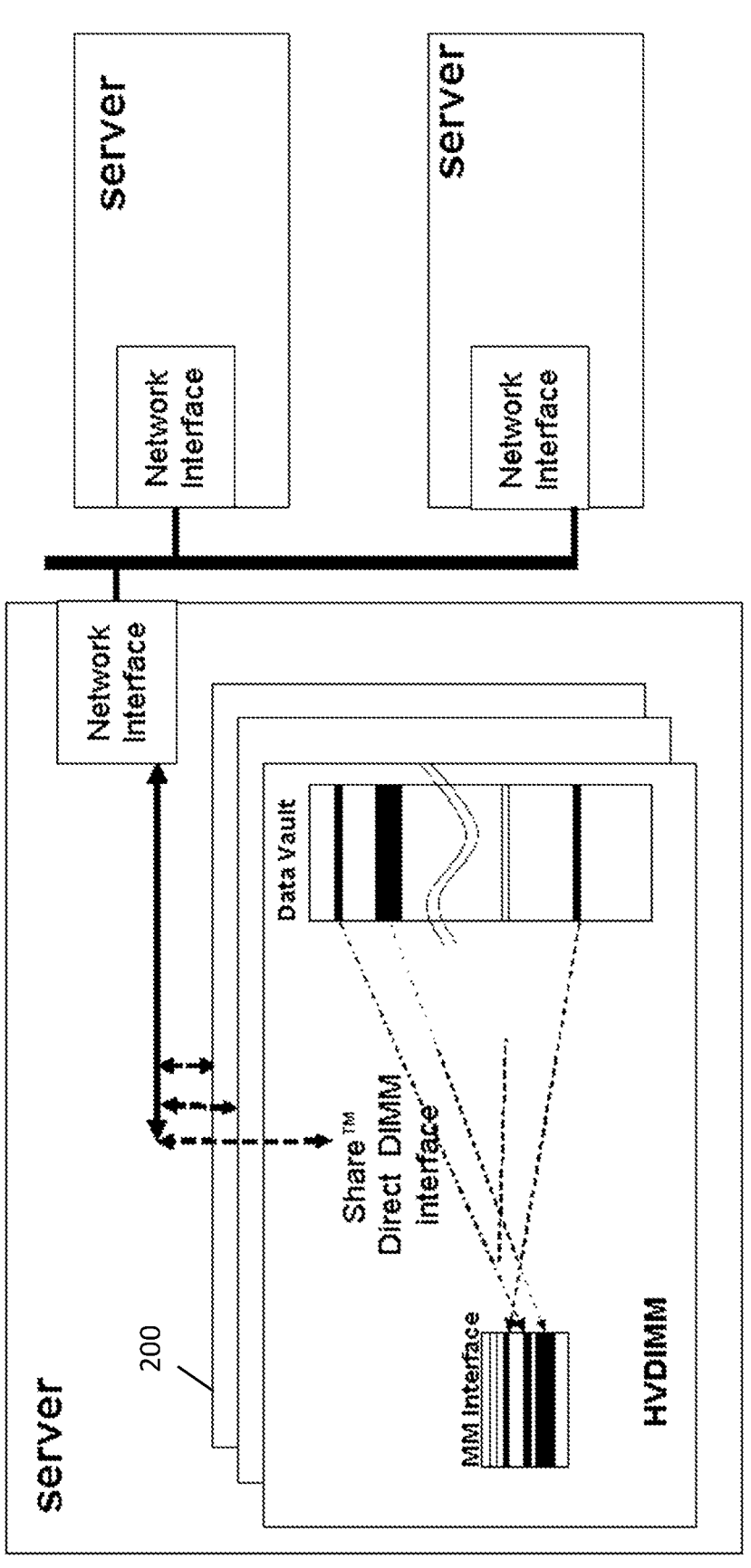
FIG. 35 illustrates one or more hybrid memory modules in a server system in an intranet network being coupled directly to the intranet network via respective network interface circuits.

Additionally, the HV Controller 230 is also configured to facilitate data transfers between different server systems. For example, as shown in FIG. 35, the HVDIMM(s) 200 in each server system in an intranet network can be coupled directly to the intranet network via their respective HV-NIC devices and/or another Network Interface device. Thus, the HV Controller 230 on each HVDIMM 200 in a particular server can initiate and control data transfers directly between HVDIMM 200s in different servers.

We claim:

1. A memory module, comprising:
dynamic random access memory (DRAM);
Flash memory; and
a module controller coupled to the DRAM and the Flash memory, the module controller including local memory, wherein the module controller is configurable to:
receive first data to be transferred from the DRAM to the Flash memory;
compute first cyclic redundancy check (CRC) codes from the first data;
write the first data into first locations in the Flash memory;
receive second data by reading the first data from the first locations in the Flash memory;
store a copy of the second data in the local memory;
transfer the second data to the DRAM;
compute second CRC codes from the copy of the second data stored in the local memory;
compare the second CRC codes with the first CRC codes to determine whether the copy of the second data includes erroneous data bits;
in response to determining one or more erroneous data bits in one or more segments of the copy of the second data, read from the DRAM one or more segments of the second data, the one or more segments of the second data corresponding to the one or more segments of the copy of the second data and including one or more erroneous data bits corresponding to the one or more erroneous data bits in the copy of the second data;
correct the one or more erroneous data bits in the one or more data segments of the second data to obtain one or more corrected data segments; and
write the one or more corrected data segments back into the DRAM.

2. The memory module of claim 1, wherein the first data to be transferred from the DRAM to the Flash memory includes first data bits and the module controller is further configurable to:
arrange the first data bits into first data sets, whereby each data bit of the first data bits is assigned to at least two intersecting data sets of the first data sets, each data set of the first data sets including a plurality of data bits from the first data bits, and no two datasets of the first data sets have more than one data bit in common; and
compute the first CRC codes by performing error correction coding on each respective data set of the first data sets to obtain respective CRC codes for the respective data set.

3. The memory module of claim 2, wherein the copy of the second data received from the Flash memory includes second data bits corresponding, respectively, to the first data bits, and the module controller is further configurable to:
arrange the second data bits into second data sets, such that the second data sets correspond, respectively, to the first data sets, and data bits in each data set of the first data sets correspond, respectively, to data bits in a corresponding data set of the second data sets; and
compute second CRC codes by performing error correction coding on each individual data set of the second data sets to obtain individual CRC codes for the individual data set.

4. The memory module of claim 3, wherein the module controller is further configurable to:

in response to the CRC codes of one or more data sets in the second data sets not matching the CRC codes of one or more corresponding data sets in the first data sets, determine one or more intersecting data sets of the second data sets, each intersection data set of the one or more intersecting data sets having a CRC code not matching the CRC code of a corresponding data set of the first data sets and having one data bit in common with one of the one or more data sets in the second data sets; and determine one or more erroneous data bits in the second data bits based on the one or more data sets in the second data sets and the one or more intersecting data sets of the second data sets.

5. The memory module of claim 3, wherein the module controller is further configurable to:

arrange the first data bits into a first multi-dimensional array with each of the first data bits having a position in each of a plurality of dimensions, each of the first data sets including data bits having different positions in one of the plurality of dimensions and a common position in each of the other dimensions of the plurality of dimensions; and arrange the second data bits into a second multi-dimensional array with each of the second data bits having a position in each dimension of the plurality of dimensions that corresponds to the position of a corresponding first data bit in the each dimension in the first multi-dimensional array, each of the second data sets including data bits having different positions in one of the plurality of dimensions and a common position in each of the other dimensions of the plurality of dimensions.

6. The memory module of claim 5, wherein the module controller is further configurable to:

compare the CRC codes of a group of the second data sets with respective ones of the CRC codes of a group of the first data sets corresponding, respectively, to the group of the second data sets, wherein data bits in each second data set of the group of the second data sets have different positions in a first dimension, and data bits in the group of the second data sets share a same position in each of the plurality of dimensions other than the first dimension and a second dimension;

in response to the group of second data sets having only one unmatching second data set that has a CRC code not matching the CRC code of a first data set corresponding to the unmatching second data set, determine at least one intersecting second data set, each of the at least one intersecting second data set having data bits with different positions in the second dimension, having one common data bit with the unmatching second data set, and having a CRC code not matching the CRC code of a first data set corresponding to the intersecting second data set; and determine the common data bit as an erroneous data bit in the second data bits.

7. The memory module of claim 5, wherein the module controller is further configurable to:

compare the CRC codes of a group of the second data sets with respective ones of the CRC codes of a group of the first data sets corresponding, respectively, to the group of the second data sets, wherein data bits in each second data set of the group of the second data sets have different positions in a first dimension, and data bits in the group of the second data sets share a same position in each of the plurality of dimensions other than the first dimension and a second dimension;

in response to the group of second data sets having two unmatching second data sets that have CRC codes not respectively matching the CRC codes of two first data sets corresponding, respectively, to the two unmatching second data sets, determine two intersecting second data sets, each intersecting second data set of the two intersecting second data sets having data bits with different positions in the second dimension, having one common data bit with each of the two unmatching second data sets, and having a CRC code not matching the CRC code of a first data set corresponding to the each intersecting second data set, and determine two traversing second data sets, each traversing data set of the two traversing second data sets having data bits with different positions in a third dimension, including a data bit shared between one of the two unmatching second data sets and one of the two intersection data sets, and having a CRC code not matching the CRC code of a first data set corresponding to the each traversing second data set; and determine two erroneous data bits, each erroneous data bit is shared by one of the two unmatching second data sets, one of the two intersection data sets and one of the two traversing data sets.

8. A method at a memory module comprising dynamic random access memory (DRAM), Flash memory, and a module controller coupled to the DRAM and the Flash memory, comprising:

receiving first data to be transferred from the DRAM to the Flash memory;

computing first cyclic redundancy check (CRC) codes from the first data;

writing the first data into first locations in the Flash memory;

receiving second data by reading the first data from the first locations in the Flash memory;

storing a copy of the second data in local memory;

transferring the second data to the DRAM after receiving the second data from the Flash memory;

computing second CRC codes from the copy of the second data stored in the local memory;

comparing the second CRC codes with the first CRC codes to determine whether the copy of the second data includes one or more erroneous data bits;

in response to determining one or more erroneous data bits in one or more segments of the copy of the second data, reading from the DRAM one or more segments of the second data, the one or more segments of the second data corresponding to the one or more segments of the copy of the second data and including one or more erroneous data bits corresponding to the one or more erroneous data bits in the copy of the second data;

correcting the one or more erroneous data bits in the one or more data segments of the second data to obtain one or more corrected data segments; and writing the one or more corrected data segments back into the DRAM.

9. The method of claim 8, wherein the first data to be transferred from the DRAM to the Flash memory includes first data bits, and computing first cyclic redundancy check (CRC) codes comprises:

arranging the first data bits into first data sets, each data set of the first data sets including a plurality of data bits from the first data bits, wherein each data bit of the first data bits is assigned to at least two intersecting data sets of the first data sets, and no two datasets of the first data sets have more than one data bit in common; and computing first CRC codes by performing error correction coding on each respective data set of the first data sets to obtain respective CRC code for the respective data set.

10. The method of claim 9, wherein the copy of the second data received from the Flash memory includes second data bits corresponding, respectively, to the first data bits, and computing second CRC codes comprises:

arrange the second data bits into second data sets, wherein the second data sets correspond, respectively, to the first data sets, and data bits in each data set of the first data sets correspond, respectively, to data bits in a corresponding data set of the second data sets; and compute second CRC codes by performing error correction coding on each individual data set of the second data sets to obtain individual CRC code for the individual data set.

11. The method of claim 10, wherein comparing the second CRC codes with the first CRC codes to determine whether the copy of the second data includes one or more erroneous data bits comprises:

in response to the CRC codes of one or more data sets in the second data sets not matching the CRC codes of one or more corresponding data sets in the first data sets, determining one or more intersecting data sets of the second data sets, each intersection data set of the one or more intersecting data sets having a CRC code not matching the CRC code of a corresponding data set of the first data sets and having one data bit in common with one of the one or more data sets in the second data sets; and determining one or more erroneous data bits in the second data bits based on the one or more data sets in the second data sets and the one or more intersecting data sets of the second data sets.

12. The method of claim 10, wherein:

arranging the first data bits into first data sets comprises arranging the first data bits into a first multi-dimensional array with each of the first data bits having a position in each of a plurality of dimensions, each of the first data sets including data bits having different positions in one of the plurality of dimensions and a common position in each of the other dimensions of the plurality of dimensions; and arrange the second data bits into second data sets comprises arranging the second data bits into a second multi-dimensional array with each of the second data bits having a position in each dimension of the plurality of dimensions that corresponds to the position of a corresponding first data bit in the each dimension in the first multi-dimensional array, each of the second data sets including data bits having different positions in one of the plurality of dimensions and a common position in each of the other dimensions of the plurality of dimensions.

13. The method of claim 12, wherein comparing the second CRC codes with the first CRC codes to determine whether the copy of the second data includes one or more erroneous data bits comprises:

comparing the CRC codes of a group of the second data sets with respective ones of the CRC codes of a group of the first data sets corresponding, respectively, to the group of the second data sets, wherein data bits in each second data set of the group of the second data sets have different positions in a first dimension, and data bits in the group of the second data sets share a same position in each of the plurality of dimensions other than the first dimension and a second dimension;

in response to the group of second data sets having only one unmatching second data set that has a CRC code not matching the CRC code of a first data set corresponding to the unmatching second data set, determining at least one intersecting second data set, each of the at least one intersecting second data set having data bits with different positions in the second dimension, having one common data bit with the unmatching second data set, and having a CRC code not matching the CRC code of a first data set corresponding to the intersecting second data set; and determining the common data bit as an erroneous data bit in the second data bits.

14. The method of claim 12, wherein comparing the second CRC codes with the first CRC codes to determine whether the copy of the second data includes one or more erroneous data bits in the data read from the Flash memory comprises:

comparing the CRC codes of a group of the second data sets with respective ones of the CRC codes of a group of the first data sets corresponding, respectively, to the group of the second data sets, wherein data bits in each second data set of the group of the second data sets have different positions in a first dimension, and data bits in the group of the second data sets share a same position in each of the plurality of dimensions other than the first dimension and a second dimension;

in response to the group of second data sets having two unmatching second data sets that have CRC codes not respectively matching the CRC codes of two first data sets corresponding, respectively, to the two unmatching second data sets, determining two intersecting second data sets, each intersecting second data set of the two intersecting second data sets having data bits with different positions in the second dimension, having one common data bit with each of the two unmatching second data sets, and having a CRC code not matching the CRC code of a first data set corresponding to the each intersecting second data set, and determine two traversing second data sets, each traversing data set of the two traversing second data sets having data bits with different positions in a third dimension, including a data bit shared between one of the two unmatching second data sets and one of the two intersection data sets, and having a CRC code not matching the CRC code of a first data set corresponding to the each traversing second data set; and determining two erroneous data bits, each erroneous data bit is shared by one of the two unmatching second data sets, one of the two intersection data sets and one of the two traversing data sets.

15. A device operable to control data transfers to and/or from first memory, comprising:

a first interface configured to interface with the first memory; and control logic coupled to the first interface and configurable to:

compute first cyclic redundancy check (CRC) codes for data to be transferred to the first memory, the data to be transferred to the first memory including first data bits;

write the data to be transferred to the first memory into the first memory via the first interface;

receive data read from the first memory via the first interface, the data read from the first memory including second data bits corresponding, respectively, to the first data bits;

compute second CRC codes for the data read from the first memory; and compare the second CRC codes with the first CRC codes to determine one or more erroneous data bits in the data read from the first memory;

wherein the control logic is configurable to:

arrange the first data bits into first data sets, and performing error correction coding on each respective data set of the first data sets to obtain a respective CRC code for the respective data set, each data set of the first data sets including a plurality of data bits from the first data bits, wherein each data bit of the first data bits is assigned to at least two intersecting data sets of the first data sets, and no two datasets of the first data sets have more than one data bit in common;

arrange the second data bits into second data sets, and performing error correction coding on each individual data set of the second data sets to obtain individual CRC code for the individual data set, wherein the second data sets correspond, respectively, to the first data sets, and data bits in each data set of the second data sets correspond, respectively, to data bits in a corresponding data set of the first data sets;

in response to the CRC codes of one or more data sets in the second data sets not matching the CRC codes of one or more corresponding data sets in the first data sets, determine one or more intersecting data sets of the second data sets, each intersection data set of the one or more intersecting data sets having a CRC code not matching the CRC code of a corresponding data set of the first data sets and having one data bit in common with one of the one or more data sets in the second data sets; and determine one or more erroneous data bits in the second data bits based on the one or more data sets in the second data sets and the one or more intersecting data sets of the second data sets.

16. The device of claim 15, further comprising:

a second interface coupled to the control logic and configured to interface with second memory; and local memory coupled to the control logic;

wherein the control logic is further configurable to:

before determining one or more erroneous data bits in the data read from the first memory, transfer the data read from the first memory to the second memory via the second interface and store the data read from the first memory in the local memory, wherein the second CRC codes are computed using data bits of the data read from the first memory and stored in the local memory; and after determining one or more erroneous data bits in the data read from the first memory, read from the second memory a data segment of the data read from the first memory and transferred to the second memory, the data segment including the one or more erroneous data bits, correct the one or more erroneous data bits in the data segment to obtain a corrected data segment, and write the corrected data segment back into the second memory to replace the data segment previously stored in the second memory.

17. The device of claim 16, wherein the first memory is Flash memory and the second memory is dynamic random access memory (DRAM).

18. The device of claim 15, wherein the control logic is configurable to:

arrange the first data bits into a first multi-dimensional array with each of the first data bits having a position in each of a plurality of dimensions, each of the first data sets including data bits having different positions in one of the plurality of dimensions and a common position in each of the other dimensions of the plurality of dimensions; and arrange the second data bits into a second multi-dimensional array with each of the second data bits having a position in each dimension of the plurality of dimensions that corresponds to the position of a corresponding first data bit in the each dimension in the first multi-dimensional array, each of the second data sets including data bits having different positions in one of the plurality of dimensions and a common position in each of the other dimensions of the plurality of dimensions.

19. The device of claim 18, wherein the control logic is further configurable to:

compare the CRC codes of a group of the second data sets with respective ones of the CRC codes of a group of the first data sets corresponding, respectively, to the group of the second data sets, wherein data bits in each second data set of the group of the second data sets have different positions in a first dimension, and data bits in the group of the second data sets share a same position in each of the plurality of dimensions other than the first dimension and a second dimension;

in response to the group of second data sets having only one unmatching second data set that has a CRC code not matching the CRC code of a first data set corresponding to the unmatching second data set, determine one or more intersecting second data sets, each of the one or more intersecting second data sets having data bits with different positions in the second dimension, having one common data bit with the unmatching second data set, and having a CRC code not matching the CRC code of a first data set corresponding to the intersecting second data set; and determine the common data bit as an erroneous data bit in the second data bits.

20. The device of claim 18, wherein the control logic is further configurable to:

compare the CRC codes of a group of the second data sets with respective ones of the CRC codes of a group of the first data sets corresponding, respectively, to the group of the second data sets, wherein data bits in each second data set of the group of the second data sets have different positions in a first dimension, and data bits in the group of the second data sets share a same position in each of the plurality of dimensions other than the first dimension and a second dimension;

in response to the group of second data sets having two unmatching second data sets that have CRC codes not respectively matching the CRC codes of two first data sets corresponding, respectively, to the two unmatching second data sets, determine two intersecting second data sets, each intersecting second data set of the two intersecting second data sets having data bits with different positions in the second dimension, having one common data bit with each of the two unmatching second data sets, and having a CRC code not matching the CRC code of a first data set corresponding to the each intersecting second data set, and determine two traversing second data sets, each traversing data set of the two traversing second data sets having data bits with different positions in a third dimension, including a data bit shared between one of the two unmatching second data sets and one of the two intersection data sets, and having a CRC code not matching the CRC code of a first data set corresponding to the each traversing second data set; and determine two erroneous data bits, each erroneous data bit is shared by one of the two unmatching second data sets, one of the two intersection data sets and one of the two traversing data sets.

\* \* \* \* \*